United States Patent
Misaki et al.

(10) Patent No.: US 11,217,611 B2
(45) Date of Patent: Jan. 4, 2022

(54) SCANNED ANTENNA AND METHOD FOR MANUFACTURING SAME

(71) Applicant: SHARP KABUSHIKI KAISHA, Sakai (JP)

(72) Inventors: Katsunori Misaki, Yonago (JP); Kunio Matsubara, Yonago (JP); Yohji Taniguchi, Yonago (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 140 days.

(21) Appl. No.: 16/839,002

(22) Filed: Apr. 2, 2020

(65) Prior Publication Data
US 2020/0328236 A1    Oct. 15, 2020

Related U.S. Application Data

(60) Provisional application No. 62/831,514, filed on Apr. 9, 2019.

(51) Int. Cl.
*H01Q 3/44* (2006.01)
*H01L 27/12* (2006.01)
(Continued)

(52) U.S. Cl.
CPC ........ *H01L 27/1255* (2013.01); *H01L 27/124* (2013.01); *H01L 27/127* (2013.01);
(Continued)

(58) Field of Classification Search
CPC .............. H01L 27/1255; H01L 27/124; H01L 27/127; H01Q 3/44; H01Q 3/34;
(Continued)

(56) References Cited

U.S. PATENT DOCUMENTS

| 7,466,269 B2 | 12/2008 | Haziza |
| 7,847,894 B2 | 12/2010 | Rho |

(Continued)

FOREIGN PATENT DOCUMENTS

| JP | 2002-217640 A | 8/2002 |
| JP | 2007-116573 A | 5/2007 |

(Continued)

OTHER PUBLICATIONS

R. A. Stevenson et al., "Rethinking Wireless Communications: Advanced Antenna Design using LCD Technology", SID 2015 DIGEST, pp. 827-830.
M. Ando et al., "A Radial Line Slot Antenna for 12GHz Satellite TV Reception", IEEE Transactions of Antennas and Propagation, vol. AP-33, No. 12, pp. 1347-1353 (1985).
(Continued)

*Primary Examiner* — Seokjin Kim
(74) *Attorney, Agent, or Firm* — ScienBiziP, P.C.

(57) ABSTRACT

A scanning antenna provided with an array of a plurality of antenna units includes a transmission and/or reception region including the plurality of antenna units, and a non-transmission and/or reception region other than the transmission and/or reception region. The scanning antenna includes a TFT substrate including a first dielectric substrate, a slot substrate including a second dielectric substrate and a slot electrode supported by a first main surface of the second dielectric substrate, a liquid crystal layer provided between the TFT substrate and the slot substrate, and a reflective conductive plate disposed facing a second main surface of the second dielectric substrate opposite to the first main surface with a dielectric layer interposed between the reflective conductive plate and the second main surface. Each of the plurality of antenna units includes a TFT supported by the first dielectric substrate, a patch electrode electrically connected to a drain of the TFT, and a slot formed in the slot
(Continued)

electrode corresponding to the patch electrode. The slot substrate further includes a first insulating layer provided between the second dielectric substrate and the slot electrode. The slot electrode has a tensile stress and the first insulating layer has compressive stress. When viewed from a normal direction of the second dielectric substrate, a portion of the slot substrate that does not include the slot electrode includes at least one first region exposing the second dielectric substrate from the first insulating layer and/or at least one second region having a thickness of the first insulating layer that is less than a thickness of a portion of the first insulating layer overlapping the slot electrode. When viewed from the normal direction of the second dielectric substrate, the at least one first region or the at least one second region includes at least a portion of an end of the second dielectric substrate.

17 Claims, 40 Drawing Sheets

(51) Int. Cl.
*H01Q 3/34* (2006.01)
*H01Q 13/10* (2006.01)
(52) U.S. Cl.
CPC .............. *H01Q 3/34* (2013.01); *H01Q 3/44* (2013.01); *H01Q 13/10* (2013.01)
(58) Field of Classification Search
CPC ........ H01Q 3/36; H01Q 13/10; H01Q 21/065; H01Q 21/0012; H01Q 9/0457
See application file for complete search history.

(56) References Cited

U.S. PATENT DOCUMENTS

| 2012/0092577 | A1 | 4/2012 | Shi et al. |
| 2012/0194399 | A1 | 8/2012 | Bily et al. |
| 2018/0138593 | A1* | 5/2018 | Nakazawa .......... H01L 27/1225 |
| 2018/0337446 | A1 | 11/2018 | Nakazawa et al. |

FOREIGN PATENT DOCUMENTS

| JP | 2007-295044 A | 11/2007 |
| JP | 2009-538565 A | 11/2009 |
| JP | 2013-539949 A | 10/2013 |
| WO | 2007/139736 A2 | 12/2007 |
| WO | 2012/050614 A1 | 4/2012 |
| WO | 2014/149341 A1 | 9/2014 |
| WO | 2015/126550 A1 | 8/2015 |
| WO | 2015/126578 A1 | 8/2015 |
| WO | 2016/057539 A1 | 4/2016 |
| WO | 2016/130383 A1 | 8/2016 |
| WO | 2016/141340 A1 | 9/2016 |
| WO | 2016/141342 A1 | 9/2016 |
| WO | 2017/061527 A1 | 4/2017 |
| WO | 2017/208996 A1 | 12/2017 |

OTHER PUBLICATIONS

M. Wittek et al., "Liquid Crystals for Smart Antennas and Other Microwave Applications", SID 2015 DIGESTpp. 824-826.
Kuki, "New Functional Element Using Liquid Crystal" Polymer, vol. 55, August issue, pp. 599-602 (2006) (A concise explanation of the relevance can be found in paragraph [0083] of the specification of the subject application).
Co-Pending letter regarding a related co-pending U.S. Appl. No. 15/542,488, filed Jul. 10, 2017.

* cited by examiner

| A-A' CROSS SECTION | B-B' CROSS SECTION | D-D' CROSS SECTION |

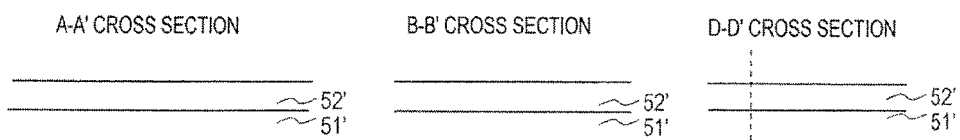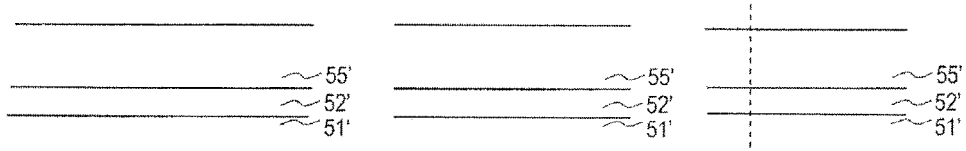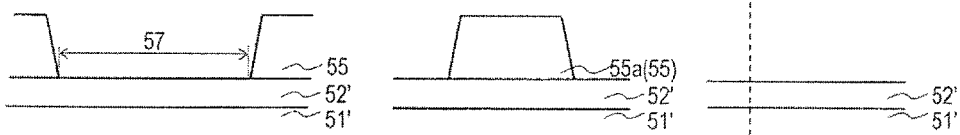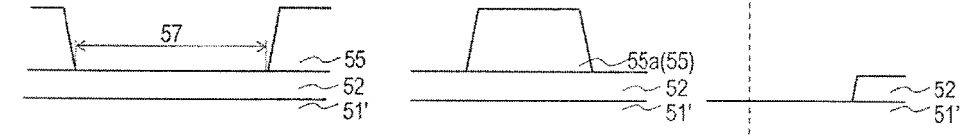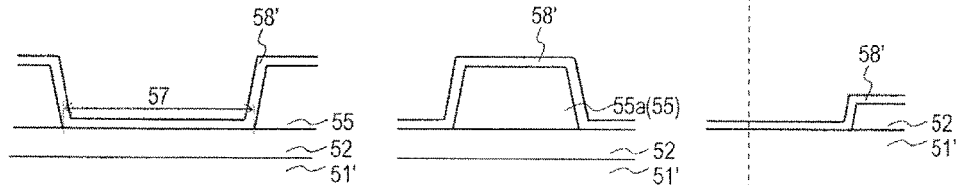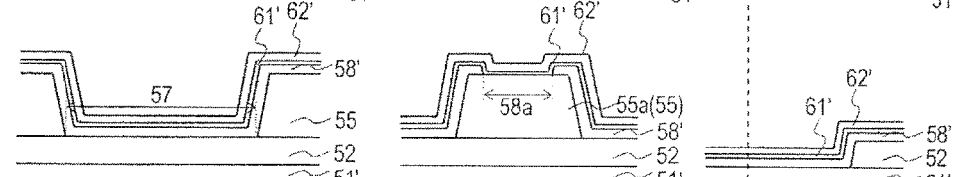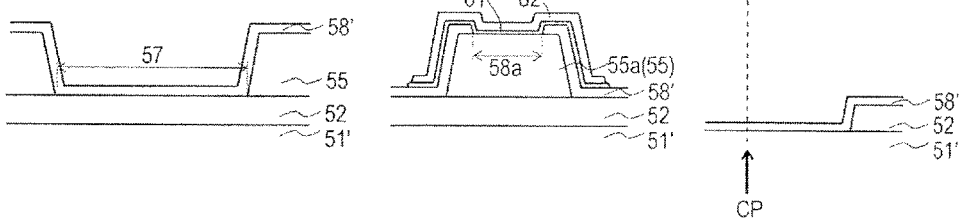

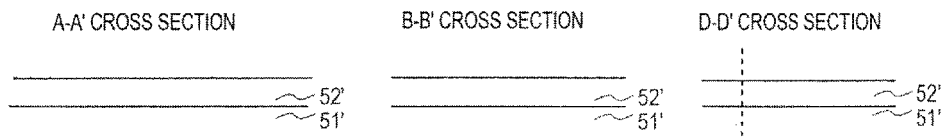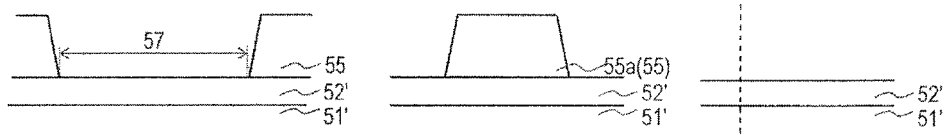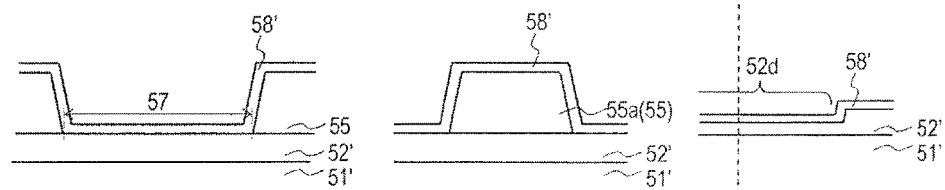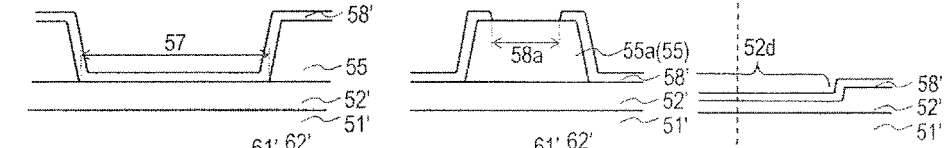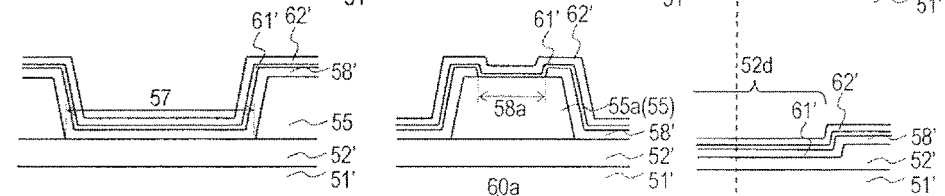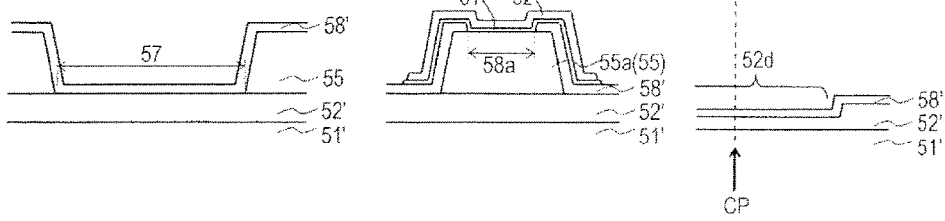

| | A-A' CROSS SECTION | B-B' CROSS SECTION | D-D' CROSS SECTION |
|---|---|---|---|
FIG. 14A 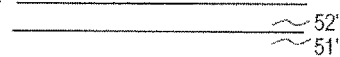 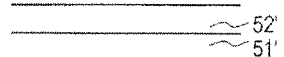 
FIG. 14B  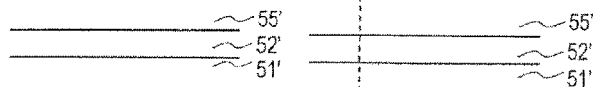
FIG. 14C   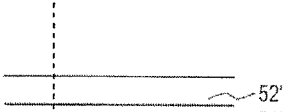
FIG. 14D 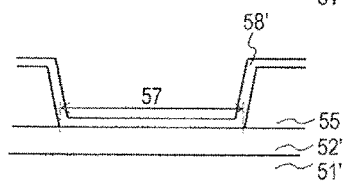 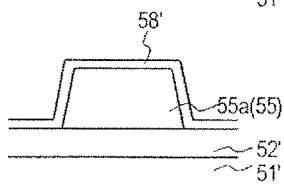 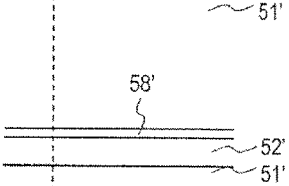
FIG. 14E 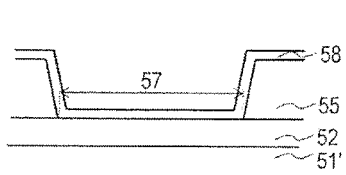 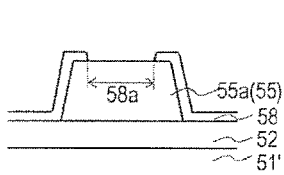 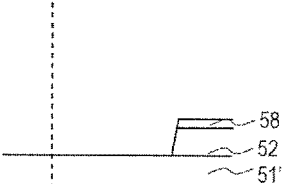
FIG. 14F 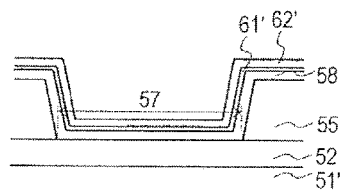 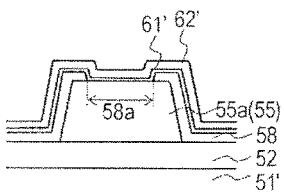 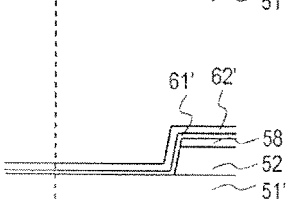
FIG. 14G 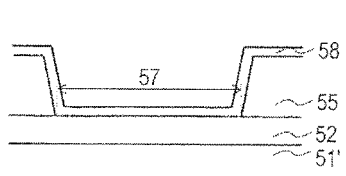 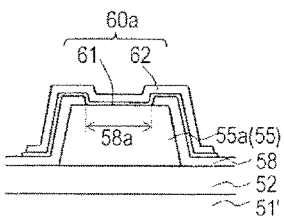 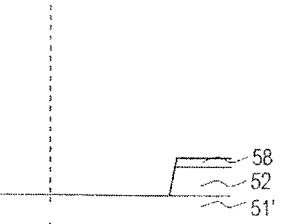

FIG. 17A
FIG. 17B
FIG. 17C
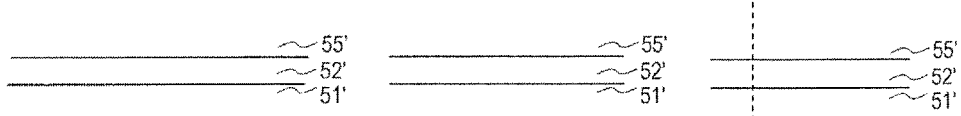
FIG. 17D
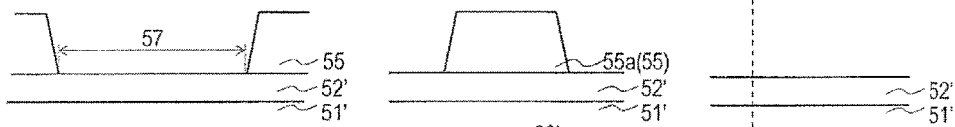
FIG. 17E
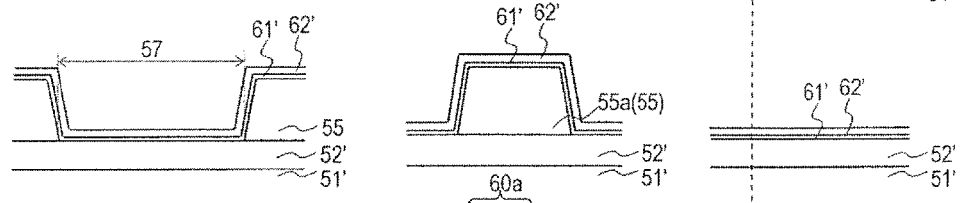
FIG. 17F
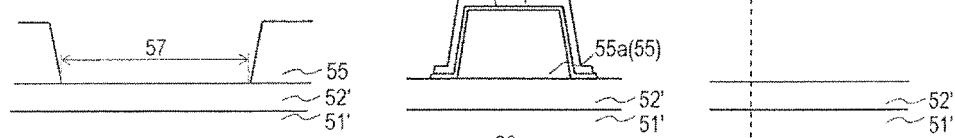
FIG. 17G
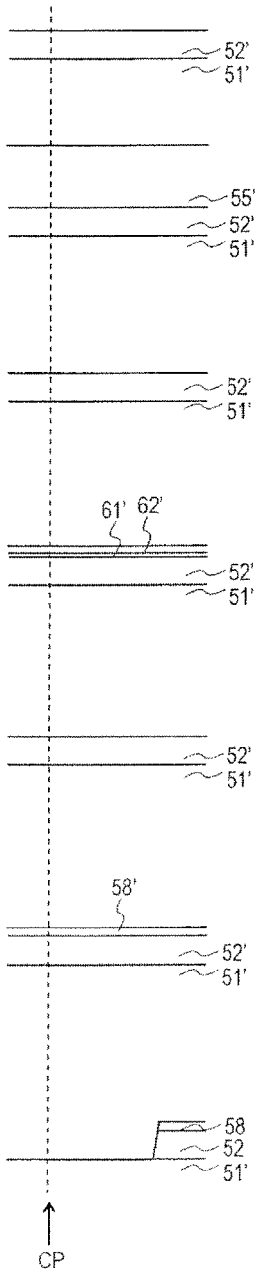

FIG. 20B

SCANNED ANTENNA AND METHOD FOR MANUFACTURING SAME

CROSS-REFERENCE TO RELATED APPLICATIONS

This application claims the benefit of priority to U.S. Provisional Application No. 62/831,514 filed on Apr. 9, 2019. The entire contents of the above-identified application are hereby incorporated by reference.

BACKGROUND

Technical Field

The disclosure relates to a scanning antenna, and more particularly relates to a scanning antenna in which an antenna unit (also referred to as an "element antenna") includes a liquid crystal capacitance (also referred to as a "liquid crystal array antenna"), and a method for manufacturing such a scanning antenna.

Antennas for mobile communication and satellite broadcasting require functions that can change the beam direction (referred to as "beam scanning" or "beam steering"). As an example of an antenna (hereinafter referred to as a "scanning antenna" (scanned antenna)) having such functionality, phased array antennas equipped with antenna units are known. However, known phased array antennas are expensive, which is an obstacle for popularization as a consumer product. In particular, as the number of antenna units increases, the cost rises considerably.

Therefore, scanning antennas that utilize the high dielectric anisotropy (birefringence index) of liquid crystal materials (including nematic liquid crystals and polymer dispersed liquid crystals) have been proposed (JP 2007-116573 A, JP 2007-295044 A, JP 2009-538565 T, JP 2013-539949 T, WO 2015/126550, and R. A. Stevenson et al., "Rethinking Wireless Communications: Advanced Antenna Design using LCD Technology", SID 2015 DIGEST, pp. 827-830). Since the dielectric constant of liquid crystal materials has a frequency dispersion, in the present specification, the dielectric constant in a frequency band with respect to microwaves (also referred to as the "dielectric constant with respect to microwaves") is particularly denoted as "dielectric constant $M(\varepsilon_M)$".

JP 2009-538565 T and R. A. Stevenson et al., "Rethinking Wireless Communications: Advanced Antenna Design using LCD Technology", SID 2015 DIGEST, pp. 827-830 describe how an inexpensive scanning antenna can be obtained by using liquid crystal display (hereinafter referred to as "LCD") device technology.

The present applicant has developed a scanning antenna which can be mass-manufactured by utilizing known manufacturing techniques of LCDs. WO 2017/061527 and WO 2017/208996 of the application applied by the present applicant disclose a scanning antenna which can be mass-manufactured by utilizing the manufacturing techniques of LCDs of the related art, a TFT substrate used for such a scanning antenna, and a manufacturing method and driving method of such a scanning antenna. The entire contents of the disclosures of WO 2017/061527 and WO 2017/208996 are incorporated herein by reference.

SUMMARY

WO 2017/208996 discloses a scanning antenna that can reduce warping in a slot substrate and, as a result, suppresses the occurrence of problems such as transport trouble, substrate chipping, or substrate cracking. Nevertheless, according to a study by the present inventors, the scanning antenna described in WO 2017/208996 may not be sufficiently reliable. Details of problems that may arise in the scanning antenna described in WO 2017/208996 are described later.

An object of the disclosure is to provide a scanning antenna that can further improve the reliability of a scanning antenna described in WO 2017/208996, and a manufacturing method of such a scanning antenna.

According to the embodiments of the disclosure, there are provided solutions according to the following items.

Item 1

A scanning antenna provided with an array of a plurality of antenna units includes a transmission and/or reception region including the plurality of antenna units, a non-transmission and/or reception region other than the transmission and/or reception region, a thin film transistor (TFT) substrate including a first dielectric substrate, a slot substrate including a second dielectric substrate and a slot electrode supported by a first main surface of the second dielectric substrate, a liquid crystal layer provided between the TFT substrate and the slot substrate, and a reflective conductive plate disposed facing a second main surface of the second dielectric substrate opposite to the first main surface with a dielectric layer interposed between the reflective conductive plate and the second main surface. Each of the plurality of antenna units includes a TFT supported by the first dielectric substrate, a patch electrode electrically connected to a drain of the TFT, and a slot formed in the slot electrode corresponding to the patch electrode. The slot substrate further includes a first insulating layer provided between the second dielectric substrate and the slot electrode. The slot electrode has a tensile stress and the first insulating layer has a compressive stress. When viewed from a normal direction of the second dielectric substrate, a portion of the slot substrate that does not include the slot electrode includes at least one first region exposing the second dielectric substrate from the first insulating layer and/or at least one second region having a thickness of the first insulating layer that is less than a thickness of a portion of the first insulating layer overlapping the slot electrode. When viewed from the normal direction of the second dielectric substrate, the at least one first region or the at least one second region includes at least a portion of an end of the second dielectric substrate.

Item 2

In the scanning antenna according to item 1, the at least one first region or the at least one second region includes a region along an end of the second dielectric substrate.

Item 3

In the scanning antenna according to item 1 or 2, the at least one first region or the at least one second region includes a plurality of regions disposed in island shapes.

Item 4

In the scanning antenna according to any one of items 1 to 3, the at least one first region or the at least one second region includes a lattice pattern region.

Item 5

In the scanning antenna according to any one of items 1 to 4, a thickness of the first insulating layer in the at least one second region is 450 nm or less.

Item 6

In the scanning antenna according to any one of items 1 to 5, a thickness of the first insulating layer in the at least one second region is no greater than 85% of a thickness of a portion of the first insulating layer overlapping the slot electrode.

Item 7

In the scanning antenna according to any one of items 1 to 6, when viewed from the normal direction of the second dielectric substrate, an area of the at least one first region is no less than 0.2% of an area of a portion of the slot substrate not including the slot electrode.

Item 8

In the scanning antenna according to any one of items 1 to 7, the slot substrate further includes a second insulating layer supported by the first main surface of the second dielectric substrate and formed on the slot electrode, and the second dielectric substrate is exposed from the second insulating layer in the at least one first region or the at least one second region.

Item 9

In the scanning antenna according to item 8, the slot substrate further includes an upper conductive layer provided on the second insulating layer supported by the first main surface of the second dielectric substrate.

Item 10

In the scanning antenna according to item 9, the slot substrate further includes a terminal portion disposed in the non-transmission and/or reception region. The terminal portion includes the first insulating layer, a lower connecting portion formed from a same metal film as a metal layer included by the slot electrode, the second insulating layer formed on the lower connecting portion, and an upper connecting portion included in the upper conductive layer. The second insulating layer includes an opening that reaches to the lower connecting portion. The upper connecting portion is formed on the second insulating layer and within the opening, and is connected to the lower connecting portion within the opening.

Item 11

In the scanning antenna according to item 8, the slot substrate further includes an upper conductive layer provided between the slot electrode and the second insulating layer.

Item 12

In the scanning antenna according to item 11, the slot substrate further includes a terminal portion disposed in the non-transmission and/or reception region. The terminal portion includes the first insulating layer, a lower connecting portion formed from a same metal film as a metal layer included by the slot electrode, the second insulating layer formed on the lower connecting portion, and an upper connecting portion included in the upper conductive layer. The second insulating layer includes an opening that reaches to the upper connecting portion.

Item 13

In the scanning antenna according to any one of items 9 to 12, the upper conductive layer includes a first conductive layer and a second conductive layer formed on the first conductive layer and including a transparent conductive layer.

Item 14

In the scanning antenna according to item 13, the second conductive layer includes an indium tin oxide (ITO) layer.

Item 15

A method for manufacturing a scanning antenna described in any one of items 1 to 14. A step of manufacturing the slot substrate includes, a step A of depositing a first insulating film onto a mother substrate, a step B of forming the slot electrode on the first insulating film after the step A, a step C of partially removing the first insulating film or partially reducing a thickness of the first insulating film after the step A, and a step D of dividing the mother substrate after the step B and the step C. A division line in the step D, when viewed from the normal direction of the mother substrate, overlaps a portion where the first insulating film is partially removed or thinned in the step C.

Item 16

The method for manufacturing a scanning antenna according to item 15. The method further includes a step E of depositing a second insulating film on the slot electrode after the step B and before the step D, and a step F of partially removing the second insulating film. A division line in the step D, when viewed from the normal direction of the mother substrate, overlaps a portion where the second insulating film is partially removed in the step F.

Item 17

In the method for manufacturing a scanning antenna according to item 16, the step E includes a step of removing performed using a same etching mask as that in the step C.

According to the embodiments of the disclosure, a reliability of a scanning antenna can be further improved.

BRIEF DESCRIPTION OF DRAWINGS

The disclosure will be described with reference to the accompanying drawings, wherein like numbers reference like elements.

FIGS. 8A to 8H are schematic cross-sectional views for describing a method for manufacturing the slot substrate 201Aa.

FIGS. 11A to 11H are schematic cross-sectional views for describing a method for manufacturing the slot substrate 201Ba.

FIGS. 14A to 14G are schematic cross-sectional views for describing a method for manufacturing the slot substrate 201Ca.

FIGS. 17A to 17G are schematic cross-sectional views for describing a method for manufacturing the slot substrate 201Cb.

FIGS. 20A to 20G are schematic cross-sectional views for describing a method for manufacturing the slot substrate 201Da.

DESCRIPTION OF EMBODIMENTS

Figure 1:
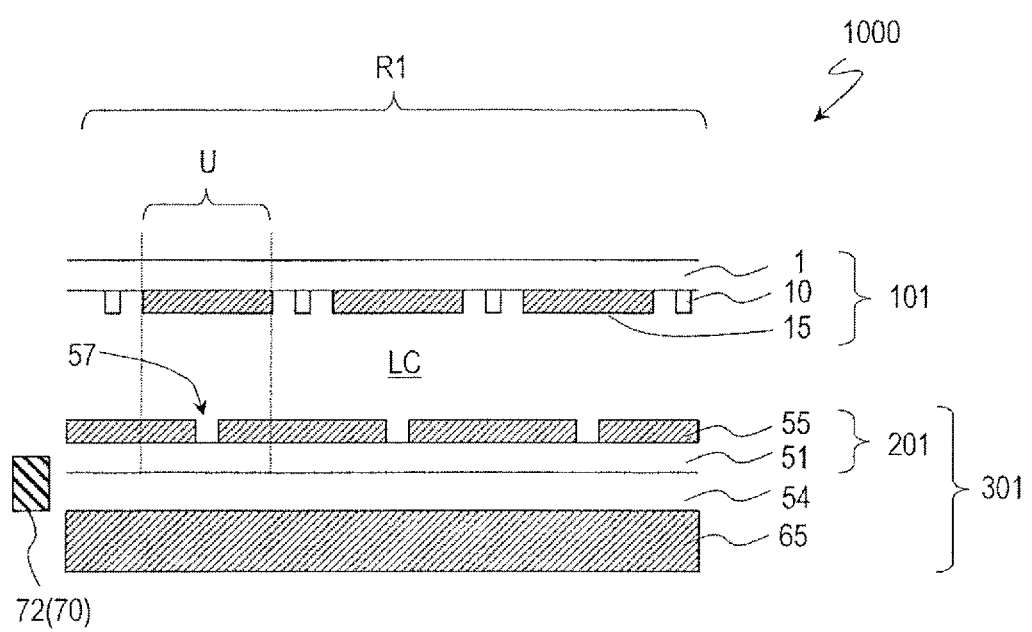
FIG. 1 is a cross-sectional view schematically illustrating a portion of a scanning antenna 1000 described in WO 2017/208996.

Hereinafter, a scanning antenna, a method for manufacturing the scanning antenna, and a TFT substrate used for the scanning antenna according to embodiments of the disclosure will be described with reference to the drawings. Note that the disclosure is not limited to the embodiments illustrated below. Further, the embodiments of the disclosure are not limited to the drawings. For example, a thickness of a layer in a cross-sectional view, sizes of a conductive portion and an opening in the plan view, and the like are exemplary.

Basic Structure of Scanning Antenna

By controlling the voltage applied to each liquid crystal layer of each antenna unit corresponding to the pixels of the LCD panel and changing the effective dielectric constant M ($\varepsilon_M$) of the liquid crystal layer for each antenna unit, a scanning antenna equipped with an antenna unit that uses the anisotropy (birefringence index) of a large dielectric constant M ($\varepsilon_M$) of a liquid crystal material forms a two-dimensional pattern by antenna units with different electrostatic capacitances (corresponding to displaying of an image by an LCD). An electromagnetic wave (for example, a microwave) emitted from an antenna or received by an antenna is given a phase difference depending on the electrostatic capacitance of each antenna unit, and gains a strong directivity in a particular direction depending on the two-dimensional pattern formed by the antenna units having different electrostatic capacitances (beam scanning). For example, an electromagnetic wave emitted from an antenna is obtained by integrating, with consideration for the phase difference provided by each antenna unit, spherical waves obtained as a result of input electromagnetic waves entering each antenna unit and being scattered by each antenna unit. It can be considered that each antenna unit functions as a "phase shifter." The basic structure and operating principle of a scanning antenna that uses a liquid crystal material are set forth in JP 2007-116573 A, JP 2007-295044 A, JP 2009-538565 T, JP 2013-539949 T, R. A. Stevenson et al., "Rethinking Wireless Communications: Advanced Antenna Design using LCD Technology", SID 2015 DIGEST, pp. 827-830, and M. ANDO et al., "A Radial Line Slot Antenna for 12 GHz Satellite TV Reception", IEEE Transactions of Antennas and Propagation, Vol. AP-33, No. 12, pp. 1347-1353 (1985). M. ANDO et al., "A Radial Line Slot Antenna for 12 GHz Satellite TV Reception", IEEE Transactions of Antennas and Propagation, Vol. AP-33, No. 12, pp. 1347-1353 (1985) discloses the basic structure of a scanning antenna in which spiral slots are arranged. The entire contents of the disclosures of JP 2007-116573 A, JP 2007-295044 A, JP 2009-538565 T, JP 2013-539949 T, R. A. Stevenson et al., "Rethinking Wireless Communications: Advanced Antenna Design using LCD Technology", SID 2015 DIGEST, pp. 827-830, and M. ANDO et al., "A Radial Line Slot Antenna for 12 GHz Satellite TV Reception", IEEE Transactions of Antennas and Propagation, Vol. AP-33, No. 12, pp. 1347-1353 (1985) are incorporated herein by reference.

Note that although the antenna units in the scanning antenna are similar to the pixels of the LCD panel, the structure of the antenna units is different from the structure of the pixel of the LCD panel, and the arrangement of the plurality of antenna units is also different from the arrangement of the pixels in the LCD panel. A basic structure of the scanning antenna will be described with reference to FIG. 1, which illustrates a scanning antenna 1000 described in WO 2017/208996. Although the scanning antenna 1000 is a radial in-line slot antenna in which slots are concentrically arranged, the scanning antennas according to the embodiments of the disclosure are not limited to this. For example, the arrangement of the slots may be any of various known arrangements. In particular, with respect to the slot and/or antenna unit arrangements, the entire disclosure of WO 2015/126550 is incorporated herein by reference.

FIG. 1 is a cross-sectional view schematically illustrating a portion of the scanning antenna 1000, and schematically illustrates a part of the cross-section along the radial direction from a power feed pin 72 (refer to FIG. 2B) provided at or near the center of the concentrically arranged slots.

The scanning antenna 1000 includes a TFT substrate 101, a slot substrate 201, a liquid crystal layer LC provided therebetween, and a reflective conductive plate 65 facing the slot substrate 201 with an air layer 54 interposed between the slot substrate 201 and the reflective conductive plate 65. The scanning antenna 1000 transmits and/or receives microwaves to and/or from a side closer to the TFT substrate 101.

The TFT substrate 101 includes a dielectric substrate 1 such as a glass substrate, a plurality of patch electrodes 15 and a plurality of TFTs 10 formed on the dielectric substrate 1. Each patch electrode 15 is connected to a corresponding TFT 10. Each TFT 10 is connected to a gate bus line and a source bus line.

The slot substrate 201 includes a dielectric substrate 51 such as a glass substrate and a slot electrode 55 formed on a side of the dielectric substrate 51 closer to the liquid crystal layer LC. The slot electrode 55 includes a plurality of slots 57.

The reflective conductive plate 65 is disposed facing the slot substrate 201 with the air layer 54 interposed between the reflective conductive plate 65 and the slot substrate 201. In place of the air layer 54, a layer formed of a dielectric (for example, a fluorine resin such as PTFE) having a small dielectric constant M with respect to microwaves can be used. The slot electrode 55, the reflective conductive plate 65, and the dielectric substrate 51 and the air layer 54 therebetween function as a waveguide 301.

The patch electrode 15, the portion of the slot electrode 55 including the slot 57, and the liquid crystal layer LC therebetween constitute an antenna unit U. In each antenna unit U, one patch electrode 15 is facing to a portion of the slot electrode 55 including one slot 57 with a liquid crystal layer LC interposed therebetween, thereby constituting the liquid crystal capacitance. The structure in which the patch electrode 15 and the slot electrode 55 face each other with the liquid crystal layer LC interposed therebetween is similar to the structure in which the pixel electrode and the counter electrode of the LCD panel face each other with the liquid crystal layer interposed therebetween. That is, the antenna unit U of the scanning antenna 1000 and the pixel of the LCD panel have a similar configuration. The antenna unit has a configuration similar to that of the pixel in the LCD panel in that the antenna unit has an auxiliary capacitance electrically connected in parallel with the liquid crystal capacitance. However, the scanning antenna 1000 has many differences from the LCD panel. First, the performance required for the dielectric substrates 1 and 51 of the scanning antenna 1000 is different from the performance required for the substrate of the LCD panel.

Generally, transparent substrates that are transparent to visible light are used for LCD panels. For example, glass substrates or plastic substrates are used. In reflective LCD panels, since the substrate on the back side does not need transparency, a semiconductor substrate may be used in some cases. In contrast to this, it is preferable for the dielectric substrates 1 and 51 used for the antennas to have small dielectric losses with respect to microwaves (where the dielectric tangent with respect to microwaves is denoted as $\tan \delta_M$). The $\tan \delta_M$ of each of the dielectric substrates 1 and 51 is preferably approximately less than or equal to 0.03, and more preferably less than or equal to 0.01. Specifically, a glass substrate or a plastic substrate can be used. Glass substrates are superior to plastic substrates with respect to dimensional stability and heat resistance, and are suitable for forming circuit elements such as TFTs, a wiring line, and electrodes using LCD technology. For example, in a case where the materials forming the waveguide are air and glass, as the dielectric loss of glass is greater, from the viewpoint that thinner glass can reduce the waveguide loss, it is preferable for the thickness to be less than or equal to 400 μm, and more preferably less than or equal to 300 μm. There is no particular lower limit, provided that the glass can be handled such that it does not break in the manufacturing process.

The conductive material used for the electrode is also different. In many cases, an ITO film is used as a transparent conductive film for pixel electrodes and counter electrodes of LCD panels. However, ITO has a large $\tan \delta_M$ with respect to microwaves, and as such cannot be used as the conductive layer in an antenna. The slot electrode 55 functions as a wall for the waveguide 301 together with the reflective conductive plate 65. Accordingly, to suppress the transmission of microwaves in the wall of the waveguide 301, it is preferable that the thickness of the wall of the waveguide 301, that is, the thickness of the metal layer (Cu layer or Al layer) be large. It is known that in a case where the thickness of the metal layer is three times the skin depth, electromagnetic waves are attenuated to 1/20 (−26 dB), and in a case where the thickness is five times the skin depth, electromagnetic waves are attenuated to about 1/150 (−43 dB). Accordingly, in a case where the thickness of the metal layer is five times the skin depth, the transmittance of electromagnetic waves can be reduced to 1%. For example, for a microwave of 10 GHz, in a case where a Cu layer having a thickness of greater than or equal to 3.3 μm and an Al layer having a thickness of greater than or equal to 4.0 μm are used, microwaves can be reduced to 1/150. In addition, for a microwave of 30 GHz, in a case where a Cu layer having a thickness of greater than or equal to 1.9 μm and an Al layer having a thickness of greater than or equal to 2.3 μm are used, microwaves can be reduced to 1/150. In this way, the slot electrode 55 is preferably formed of a relatively thick Cu layer or Al layer. There is no particular upper limit for the thickness of the Cu layer or the Al layer, and the thicknesses can be set appropriately in consideration of the time and cost of film formation. The usage of a Cu layer provides the advantage of being thinner than the case of using an Al layer. Relatively thick Cu layers or Al layers can be formed not only by the thin film deposition method used in LCD manufacturing processes, but also by other methods such as bonding Cu foil or Al foil to the substrate. The thickness of the metal layer, for example, is from 2 μm to 30 μm. In a case where the thin film deposition methods are used, the thickness of the metal layer is preferably less than or equal to 5 μm. Note that aluminum plates, copper plates, or the like having a thickness of several mm can be used as the reflective conductive plate 65, for example.

Since the patch electrode 15 does not configure the waveguide 301 like the slot electrode 55, a Cu layer or an Al layer can be used that has a smaller thickness than that of the slot electrode 55. However, to avoid losses of turning to heat when the oscillation of free electrons near the slot 57 of the slot electrode 55 induces the oscillation of the free electrons in the patch electrode 15, it is preferable that the resistance be low. From the viewpoint of mass production, it is preferable to use an Al layer rather than a Cu layer, and the thickness of the Al layer is preferably greater than or equal to 0.3 μm and less than or equal to 2 μm, for example.

In addition, an arrangement pitch of the antenna units U is considerably different from that of a pixel pitch. For example, considering an antenna for microwaves of 12 GHz (Ku band), the wavelength λ is 25 mm, for example. Then, as described in JP 2013-539949 T, a pitch of the antenna unit U is less than or equal to λ/4 and/or less than or equal to λ/5, thus the pitch of the antenna unit U is less than or equal to 6.25 mm and/or less than or equal to 5 mm. This is ten times greater than the pixel pitch of the LCD panel. Accordingly, the length and width of the antenna unit U are also approximately ten times greater than the pixel length and width of the LCD panel.

Of course, the array of the antenna units U may be different from the array of the pixels in the LCD panel. Herein, while an example is illustrated in which the antenna units U are arranged in concentric circles (for example, refer to JP 2002-217640 A), the present disclosure is not limited thereto, and the antenna units may be arranged in a spiral shape as described in, for example, M. ANDO et al., "A Radial Line Slot Antenna for 12 GHz Satellite TV Reception", IEEE Transactions of Antennas and Propagation, Vol. AP-33, No. 12, pp. 1347-1353 (1985). Furthermore, the antenna units may be arranged in a matrix as described in JP 2013-539949 T.

The properties required for the liquid crystal material of the liquid crystal layer LC of the scanning antenna 1000 are different from the properties required for the liquid crystal material of the LCD panel. In the LCD panel, a change in a refractive index of the liquid crystal layer of the pixels allows a phase difference to be provided to the polarized visible light (wavelength of from 380 nm to 830 nm) such that the polarization state is changed (for example, the change in the refractive index allows the polarization axis direction of linearly polarized light to be rotated or the degree of circular polarization of circularly polarized light to be changed), whereby display is performed. In contrast, in the scanning antenna 1000, the phase of the microwave excited (re-radiated) from each patch electrode is changed by changing the electrostatic capacitance value of the liquid crystal capacitance of the antenna unit U. Accordingly, the liquid crystal layer preferably has a large anisotropy ($\Delta\varepsilon_M$) of the dielectric constant M ($\varepsilon_M$) with respect to microwaves, and tan $\delta_M$ is preferably small. For example, a liquid crystal material having a $\Delta\varepsilon M$ of 4 or greater and a tan $\delta_M$ of 0.02 or less (values of 19 GHz in both cases) as described by M. Wittek et al. in SID 2015 DIGEST, pp. 824-826 can be suitably used. In addition, a liquid crystal material having a $\Delta\varepsilon M$ of 0.4 or greater and a tan SM of 0.04 or less as described by Kuki in the August issue of Kobunshi, Vol. 55, pp. 599-602 (2006) can be used.

In general, the dielectric constant of a liquid crystal material has a frequency dispersion, but the dielectric anisotropy $\Delta\varepsilon_M$ with respect to microwaves has a positive correlation with the refractive index anisotropy $\Delta n$ with respect to visible light. Accordingly, it can be said that a material having a large refractive index anisotropy $\Delta n$ with respect to visible light is preferable as a liquid crystal material for an antenna unit with respect to microwaves. The refractive index anisotropy $\Delta n$ of the liquid crystal material for LCDs is evaluated by the refractive index anisotropy with respect to light having a wavelength of 550 nm. Here again, when a $\Delta n$ (birefringence index) is used as an indicator with respect to light having a wavelength of 550 nm, a nematic liquid crystal having a $\Delta n$ of greater than or equal to 0.3, preferably greater than or equal to 0.4, can be used for an antenna unit with respect to microwaves. An has no particular upper limit. However, since liquid crystal materials having a large $\Delta n$ tend to have a strong polarity, there is a possibility that reliability may decrease. The thickness of the liquid crystal layer is, for example, from 1 μm to 500 μm.

Hereinafter, the structure of the scanning antenna will be described in more detail.

Figure 2A:
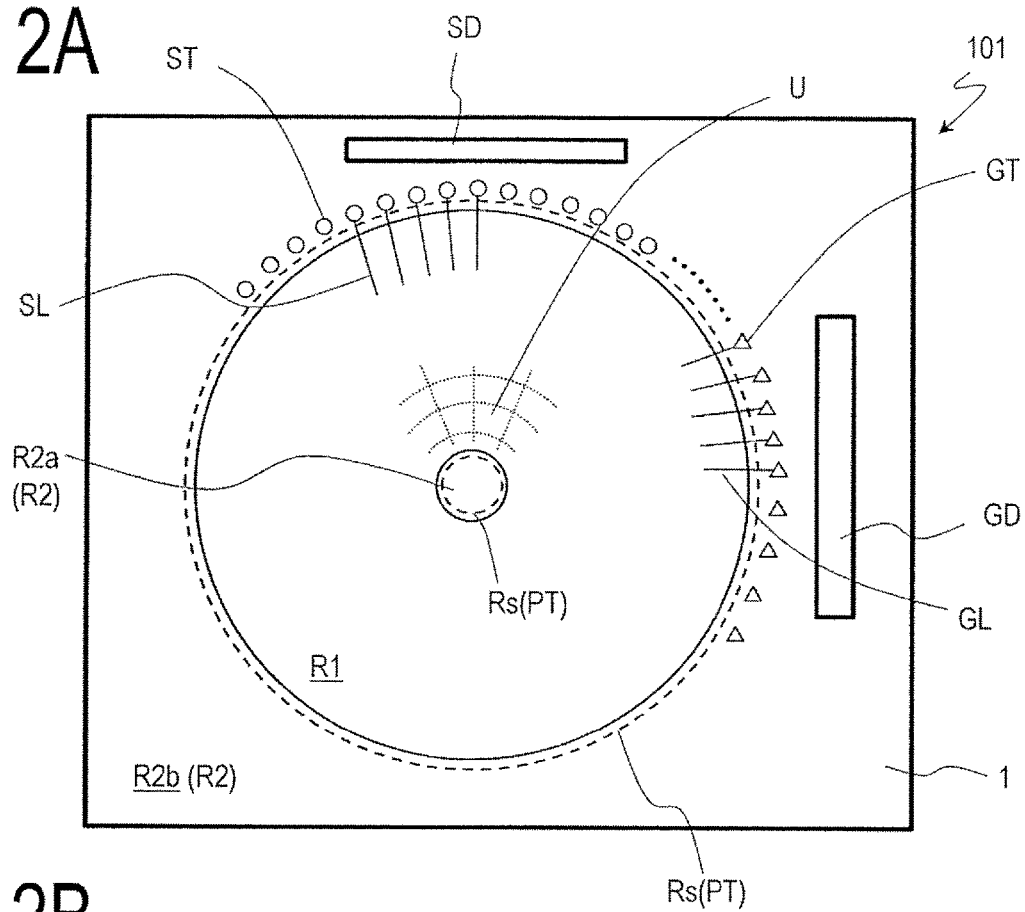
FIGS. 2A and 2B are schematic plan views illustrating a TFT substrate 101 and a slot substrate 201 included in the scanning antenna 1000, respectively.
Figure 2B:
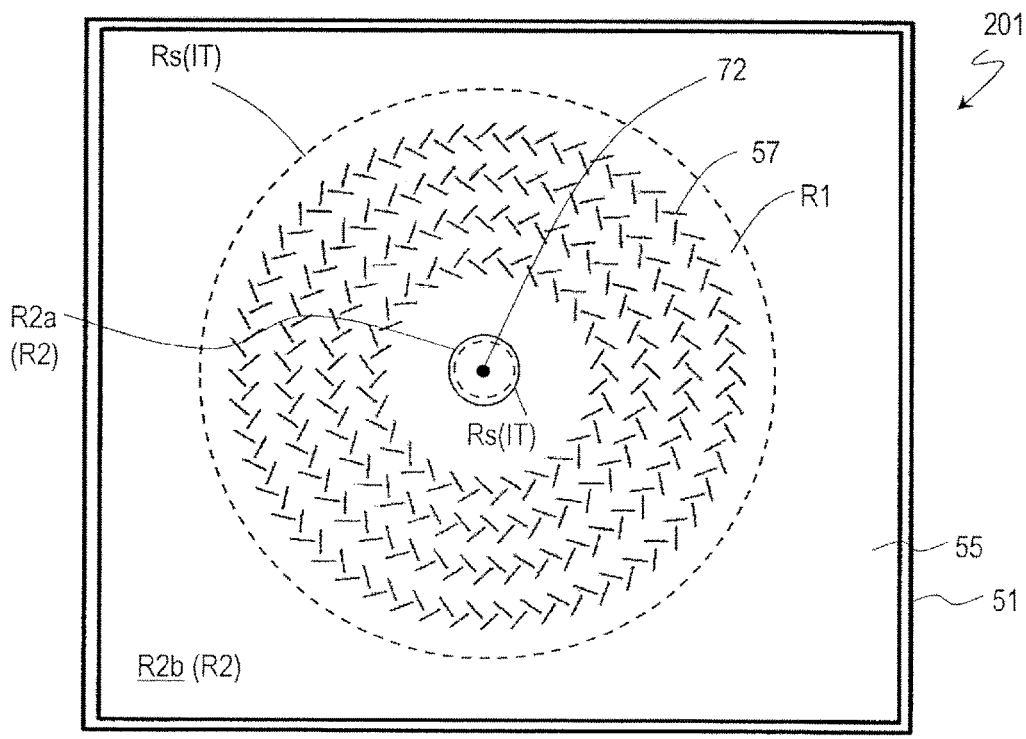

First, a description is given with reference to FIG. 1 and FIGS. 2A and 2B. FIG. 1 is a partial cross-sectional view of the scanning antenna 1000 near the center thereof as described above in detail, and FIGS. 2A and 2B are schematic plan views illustrating the TFT substrate 101 and the slot substrate 201 included in the scanning antenna 1000, respectively.

The scanning antenna 1000 includes a plurality of the antenna units U arranged two-dimensionally and, in the scanning antenna 1000 illustrated herein, the plurality of antenna units are concentrically arranged. In the following description, the region of the TFT substrate 101 and the region of the slot substrate 201 corresponding to the antenna unit U will be referred to as "antenna unit region," and be denoted with the same reference numeral U as the antenna unit. In addition, as illustrated in FIGS. 2A and 2B, in the TFT substrate 101 and the slot substrate 201, a region defined by the plurality of antenna unit regions that are two-dimensionally arranged is referred to as a "transmission and/or reception region R1," and a region other than the transmission and/or reception region R1 is referred to as a "non-transmission and/or reception region R2." A terminal portion, a driving circuit, and the like are provided in the non-transmission and/or reception region R2.

FIG. 2A is a schematic plan view illustrating the TFT substrate 101 included in the scanning antenna 1000.

In the illustrated example, the transmission and/or reception region R1 has a donut-shape when viewed from a normal direction of the TFT substrate 101. The non-transmission and/or reception region R2 includes a first non-transmission and/or reception region R2a located at the center of the transmission and/or reception region R1 and a second non-transmission and/or reception region R2b located at the periphery of the transmission and/or reception region R1. An outer diameter of the transmission and/or reception region R1, for example, is from 200 mm to 1500 mm, and is configured according to a communication traffic volume or the like.

A plurality of gate bus lines GL and a plurality of source bus lines SL supported by the dielectric substrate 1 are provided in the transmission and/or reception region R1 of the TFT substrate 101, and the antenna unit regions U are defined by these wiring lines. The antenna unit regions U are, for example, arranged concentrically in the transmission and/or reception region R1. Each of the antenna unit regions U includes a TFT and a patch electrode electrically connected to the TFT. The source electrode of the TFT is electrically connected to the source bus line SL, and the gate electrode is electrically connected to the gate bus line GL. In addition, the drain electrode is electrically connected to the patch electrode.

In the non-transmission and/or reception region R2 (R2a, R2b), a seal region Rs is disposed surrounding the transmission and/or reception region R1. A sealing member (not illustrated) is applied to the seal region Rs. The sealing member bonds the TFT substrate 101 and the slot substrate 201 to each other, and also encloses liquid crystals between these substrates 101 and 201.

A gate terminal portion GT, the gate driver GD, a source terminal portion ST, and the source driver SD are provided outside the seal region Rs in the non-transmission and/or reception region R2. Each of the gate bus lines GL is connected to the gate driver GD with the gate terminal portion GT interposed therebetween. Each of the source bus lines SL is connected to the source driver SD with the source terminal portion ST interposed therebetween. Note that, in this example, although the source driver SD and the gate driver GD are formed on the dielectric substrate 1, one or both of these drivers may be provided on another dielectric substrate.

Also, a plurality of transfer terminal portions PT are provided in the non-transmission and/or reception region R2. The transfer terminal portion PT is electrically connected to the slot electrode 55 (FIG. 2B) of the slot substrate 201. In the present specification, the connection portion between the transfer terminal portion PT and the slot electrode 55 is referred to as a "transfer portion." As illustrated in drawings, the transfer terminal portion PT (transfer portion) may be disposed in the seal region Rs. In this case, a resin containing conductive particles may be used as the sealing member. In this way, liquid crystals are sealed between the TFT substrate 101 and the slot substrate 201, and an electrical connection can be secured between the transfer terminal portion PT and the slot electrode 55 of the slot substrate 201. In this example, although a transfer terminal portion PT is disposed in both the first non-transmission and/or reception region R2a and the second non-transmission and/or reception region R2b, the transfer terminal portion PT may be disposed in only one of them.

Note that the transfer terminal portion PT (transfer portion) need not be disposed in the seal region Rs. For example, the transfer terminal section PT may be disposed outside the seal region Rs in the non-transmission and/or reception region R2. Of course, the transfer portion may be disposed both within the seal region Rs and outside the seal region Rs.

FIG. 2B is a schematic plan view illustrating the slot substrate 201 in the scanning antenna 1000, and illustrates the surface of the slot substrate 201 closer to the liquid crystal layer LC.

In the slot substrate 201, the slot electrode 55 is formed on the dielectric substrate 51 extending across the transmission and/or reception region R1 and the non-transmission and/or reception region R2.

In the transmission and/or reception region R1 of the slot substrate 201, a plurality of slots 57 are formed in the slot electrode 55. The slots 57 are formed corresponding to the antenna unit region U on the TFT substrate 101. For the plurality of slots 57 in the illustrated example, a pair of slots 57 extending in directions substantially orthogonal to each other are concentrically arrayed so that a radial in-line slot antenna is configured. Since the scanning antenna 1000 includes slots that are substantially orthogonal to each other, the scanning antenna 1000 can transmit and/or receive circularly polarized waves.

A plurality of terminal portions IT of the slot electrode 55 are provided in the non-transmission and/or reception region R2. The terminal portion IT is electrically connected to the transfer terminal portion PT (FIG. 2A) of the TFT substrate 101. In this example, the terminal portion IT is disposed within the seal region Rs, and is electrically connected to a corresponding transfer terminal portion PT by a sealing member containing conductive particles.

In addition, the power feed pin 72 is disposed on a back face side of the slot substrate 201 in the first non-transmission and/or reception region R2a. The power feed pin 72 allows microwaves to be inserted into the waveguide 301 constituted by the slot electrode 55, the reflective conductive plate 65, and the dielectric substrate 51. The power feed pin 72 is connected to a power feed device 70. Power feeding is performed from the center of the concentric circle in which the slots 57 are arrayed. The power feed method may be either a direct coupling power feed method or an electromagnetic coupling method, and a known power feed structure can be utilized.

In FIGS. 2A and 2B, an example is illustrated in which the seal region Rs is provided so as to surround a relatively narrow region including the transmission and/or reception region R1, but the arrangement of the seal region Rs is not limited to this. In particular, the seal region Rs provided outside the transmission and/or reception region R1 may be provided at or near the side of the dielectric substrate 1 and/or the dielectric substrate 51, for example, so as to maintain a certain distance or more from the transmission and/or reception region R1. Of course, the terminal portion and the driving circuit, for example, that are provided in the non-transmission and/or reception region R2 may be formed outside the region surrounded by the seal region Rs (that is, the side where the liquid crystal layer is not present). By forming the seal region Rs at a position separated from the transmission and/or reception region R1 by a certain distance or more, it is possible to prevent the antenna characteristics from deteriorating due to the influence of impurities (in particular, ionic impurities) contained in the sealing member (in particular, a curable resin).

Structure of Slot Substrate 201

The present inventors experimentally manufactured a scanning antenna of WO 2017/208996, and discovered the problems described below. A structure of the slot substrate 201 included in the scanning antenna 1000 of WO 2017/208996 will be more specifically described with reference to FIG. 3 and FIGS. 4A to 4D.

Figure 3:
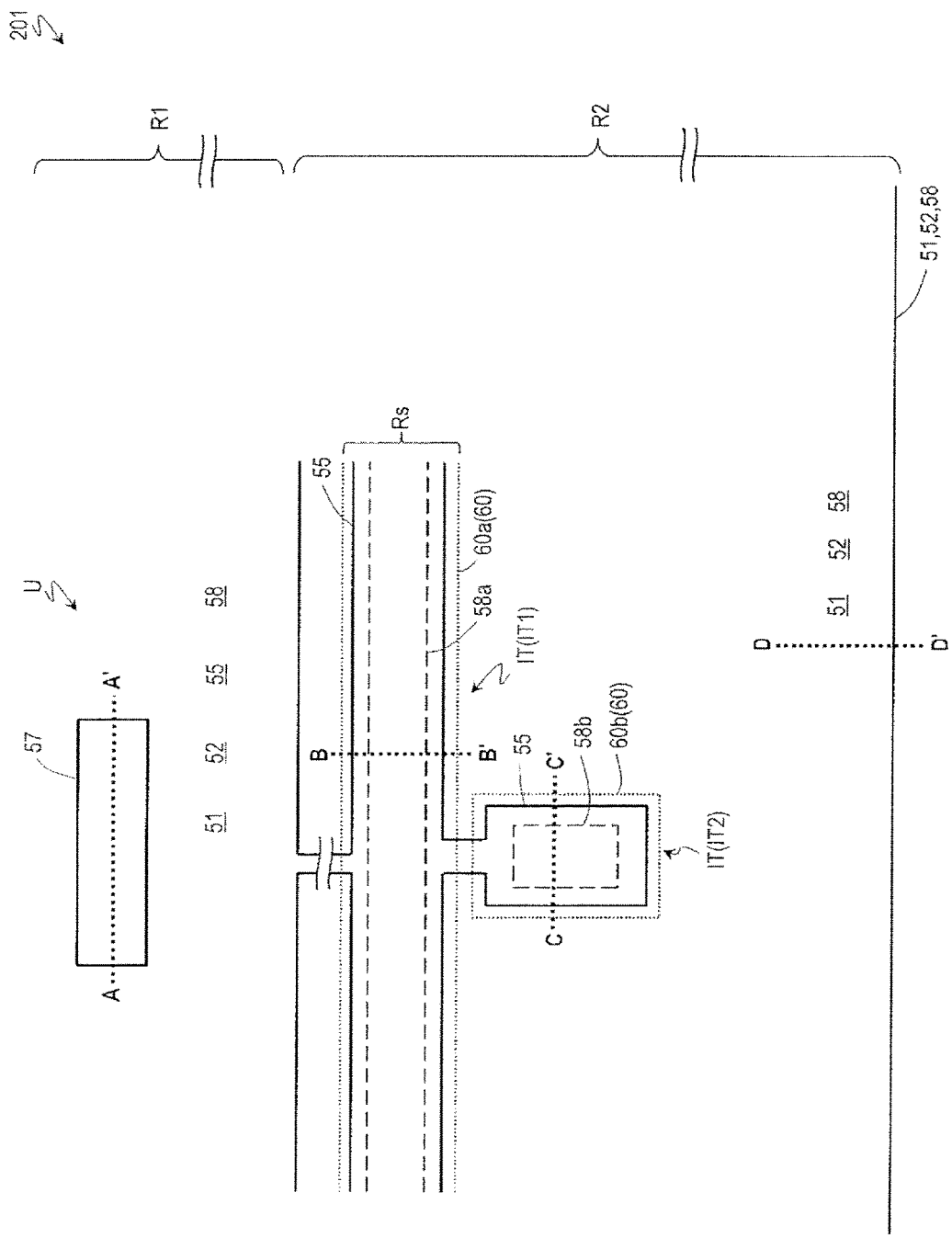
FIG. 3 is a schematic plan view of the slot substrate 201.
Figure 4A:
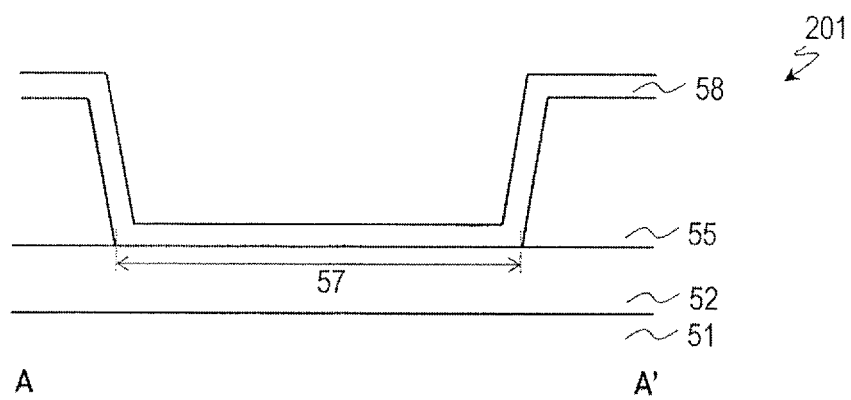
FIGS. 4A to 4D are schematic cross-sectional views of the slot substrate 201.
Figure 4B:
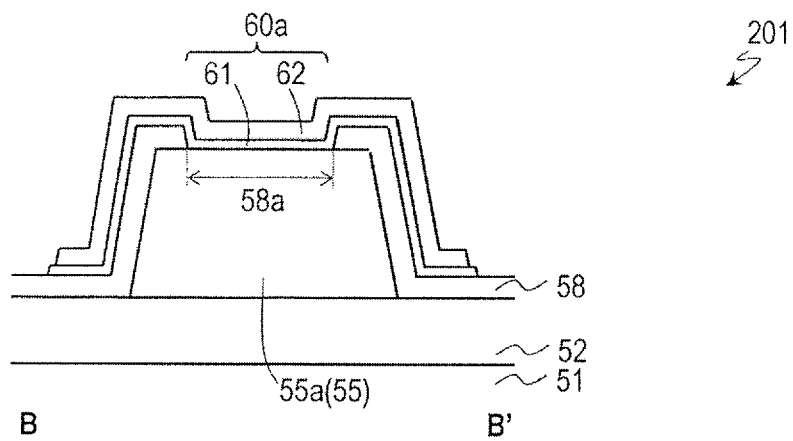
Figure 4C:
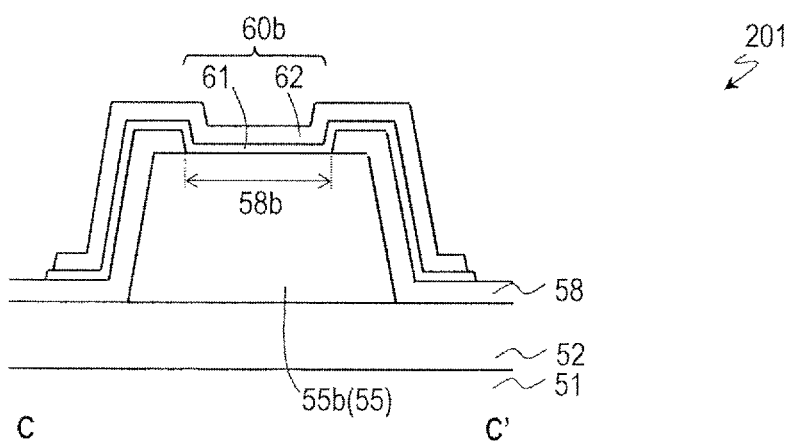
Figure 4D:
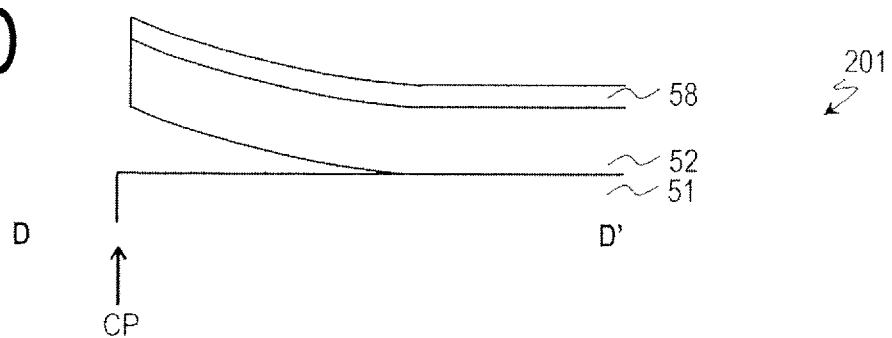

FIG. 3 is a schematic plan view of the slot substrate 201, illustrating a schematic plan view of the antenna unit region U of the transmission and/or reception region R1 of the slot substrate 201, the non-transmission and/or reception region R2 of the slot substrate 201, and the region in the vicinity of an end of the slot substrate 201. FIG. 4A is a schematic cross-sectional view along a line A-A' in FIG. 3, FIG. 4B is a schematic cross-sectional view along a line B-B' in FIG. 3, and FIG. 4C is a schematic cross-sectional view along a line C-C' in FIG. 3, and FIG. 4D is a schematic cross-sectional view along a line D-D' in FIG. 3.

As illustrated in FIG. 3 and FIGS. 4A to 4D, the slot substrate 201 includes the dielectric substrate (for example, a glass substrate) 51 including a front face and a back face (also referred as a first main surface and a second main surface), the slot electrode 55 supported by the first main surface of the dielectric substrate 51, a first insulating layer 52 provided between the dielectric substrate 51 and the slot substrate 55, and a second insulating layer 58 provided on the slot electrode 55. The slot substrate 201 further includes an upper conductive layer 60 formed on the second insulating layer 58. The first insulating layer 52, the second insulating layer 58, the slot electrode 55, and the upper conductive layer 60 are supported by the first main surface of the dielectric substrate 51.

The slot electrode 55 includes a plurality of slots 57 in the transmission and/or reception region R1. The slot 57 is an opening that opens through the slot electrode 55. In this example, one slot 57 is disposed in each antenna unit region U.

The slot electrode 55 includes a main layer such as a Cu layer or an Al layer. For example, the slot electrode 55 may have a layered structure that includes the main layer as well as an upper layer and/or a lower layer disposed sandwiching the main layer therebetween. The main layer includes, for example, a low resistance metal layer, which is typically a Cu layer (thickness: 3 μm, for example) or an Al layer. A thickness of the main layer may be set in consideration of the skin effect depending on the material and is, for example, greater than or equal to 1 μm and less than or equal to 6 μm. The thickness of the main layer is typically greater than the thickness of the upper layer and the lower layer. The upper layer and the lower layer include high melting-point metal containing layers. The thickness of each of the upper layer and the lower layer is, for example, greater than or equal to 10 nm and less than or equal to 300 nm. When the slot electrode 55 includes a lower layer disposed below the main layer, adhesion between the slot electrode 55 and the first insulating layer 52 can be improved. Further, when the slot electrode 55 includes an upper layer disposed on the main layer, corrosion of the main layer (for example, the Cu layer) can be suppressed.

The "low resistance metal layer" is a layer containing at least one element selected from the group consisting of copper (Cu), aluminum (Al), silver (Ag), and gold (Au). The "low resistance metal layer" may have a layered structure. The "high melting-point metal containing layer" is a layer containing at least one element selected from the group consisting of titanium (Ti), tungsten (W), molybdenum (Mo), tantalum (Ta), and niobium (Nb). The "high melting-point metal containing layer" may have a layered structure. For example, the high melting-point metal containing layer refers to a layer formed of any of Ti, W, Mo, Ta, Nb, an alloy containing these, and a nitride of these, and a solid solution of the above metal(s) or alloy and the nitride.

The first insulating layer 52 has a compressive stress. The first insulating layer 52 is formed on substantially the entire surface of the dielectric substrate 51. As described above, the slot electrode 55 is formed of a Cu layer that is relatively thick having, for example, a thickness of 1 μm or greater (3 μm, for example). It is known that a Cu layer formed by a thin film deposition technique (sputtering, for example) has a tensile stress. Accordingly, when the slot electrode 55 is formed directly on the dielectric substrate 51 with a relatively thick Cu layer, the dielectric substrate 51 may warp due to the tensile stress of the slot electrode 55. While a size of the warping naturally depends also on the thickness of the Cu layer and the material of the dielectric substrate 51, when, for example, a glass substrate with one side of 500 mm or greater is used as the dielectric substrate 51, problems such as transport trouble, substrate chipping, or substrate cracking may occur in the mass production process. As described in WO 2017/208996, forming the first insulating layer 52 having a compressive stress between the dielectric substrate 51 and the slot electrode 55 offsets (alleviates) the tensile stress caused by the slot electrode 55, making it possible to reduce the warpage of the slot substrate 201. As a result, occurrence of problems such as transport trouble, substrate chipping, or substrate cracking are suppressed.

The first insulating layer 52 having a compressive stress includes, for example, a silicon nitride layer ($Si_xN_y$). The first insulating layer 52 is a silicon nitride layer having a thickness of greater than or equal to 200 nm and less than or equal to 900 nm, for example. When the hydrogen removal amount of the silicon nitride layer is $3 \times 10^{16}$ atoms/cm$^2$ or less, the silicon nitride layer has a compressive stress. The hydrogen removal amount of the silicon nitride layer is measured by thermal desorption spectrometry. Further, when the refractive index of the silicon nitride layer is approximately 1.805 or greater, the silicon nitride layer is known to have a compressive stress.

The first insulating layer 52 may include a silicon oxide layer ($SiO_x$). The first insulating layer 52 is a silicon oxide layer having a thickness greater than or equal to 200 nm and less than or equal to 900 nm, for example. When the refractive index of the silicon oxide layer is greater than or equal to 1.4 and less than or equal to 1.6, the silicon oxide layer is known to have a compressive stress.

By forming a silicon nitride layer or a silicon oxide layer having a thickness of greater than or equal to 200 nm and less than or equal to 900 nm, it is possible to effectively offset (alleviate) the tensile stress of the slot electrode 55 having a thickness of greater than or equal to 1 μm and less than or equal to 6 μm.

The second insulating layer 58 is formed on the slot electrode 55 and within the slot 57. Materials of the second insulating layer 58 are not particularly limited, and, for example, silicon oxide ($SiO_x$), silicon nitride ($SiN_x$), silicon oxynitride ($SiO_xN_y$; x>y), silicon nitride oxide ($SiN_xO_y$; x>y), or the like can be used as appropriate. In a case where the slot electrode 55 is formed of a Cu layer, Cu may elute into the liquid crystal layer LC in some cases. By covering the slot electrode 55 with the second insulating layer 58, the slot: electrode 55 and the liquid crystal layer LC are not in direct contact with each other, such that the reliability can be enhanced. In addition, in a case where the slot electrode 55 is formed of an Al layer by using a thin film deposition technique, the Al layer may include a void. The second insulating layer 58 can prevent the liquid crystal material from entering the void of the Al layer. Note that in a case where the slot electrode 55 is fabricated by bonding an aluminum foil to the dielectric substrate 51 with an adhesive to form the Al layer and patterning the formed Al layer, the problem of voids can be avoided.

As illustrated in FIG. 3, FIG. 4B, and FIG. 4C, the terminal portions IT are provided in the non-transmission and/or reception region R2 of the slot substrate 201. In the example illustrated in FIG. 3, the terminal portion IT includes a first terminal portion IT1 located in the seal region Rs and a second terminal portion IT2 provided outside the seal region Rs (on a region where the liquid crystal layer is not present). In the illustrated example, the first terminal portion IT1 extends along the seal region Rs to surround the transmission and/or reception region R1.

As illustrated in FIG. 3 and FIG. 4B, the first terminal portion IT1 includes the first insulating layer 52, the slot electrode 55, an opening 58a formed in the second insulating layer 58, and an upper connecting portion 60a formed on the second insulating layer 58 and within the opening 58a. The opening 58a of the second insulating layer 58 reaches the slot electrode 55, and the upper connecting portion 60a is connected to the slot electrode 55 within the opening 58a. The slot electrode 55 constitutes the liquid crystal capacitance of the antenna unit as described above, and thus is naturally formed in the transmission and/or reception region R1, but extends to the non-transmission and/or reception region R2 as illustrated in FIG. 3. The portion extending to the non-transmission and/or reception region R2 may also be referred to as the slot electrode 55. The portion of the slot electrode 55 positioned at the first terminal portion IT1 of the non-transmission and/or reception region R2 may be referred to as a lower connecting portion 55a.

As illustrated in FIG. 3 and FIG. 4C, the second terminal portion IT2 has a cross-sectional structure similar to that of the first terminal portion IT1. The second terminal portion IT2 includes the first insulating layer 52, the slot electrode 55 (lower connecting portion 55b), an opening 58b formed in the second insulating layer 58, and an upper connecting portion 60b formed on the second insulating layer 58 and within the opening 58b. The opening 58b of the second insulating layer 58 reaches She slot electrode 55, and the upper connecting portion 60h is connected to the slot electrode 55 within the opening 58b.

In the transfer portion of the scanning antenna 1000, the upper connecting portion 60a of the first terminal portion IT1 is electrically connected to an upper connecting portion of a transfer terminal portion of the TFT substrate 101 by interposing a resin including conductive beads, for example. In the second terminal portion IT2 as well, the upper connecting portion 60b may be connected to an upper connecting portion of a transfer terminal portion of the TFT substrate 101 with a sealing member containing conductive particles, for example.

The upper connecting portions 60a and 60b are included in the upper conductive layer 60. The upper conductive layer 60 includes a transparent conductive layer. For example, an indium tin oxide (ITO) layer, or an indium zinc oxide (IZO) layer or a zinc oxide (ZnO) layer can be used as the upper conductive layer 60. A thickness of the upper conductive layer 60 is set so that a sheet resistance is less than 500 Ω/sq, for example. The thickness of the upper conductive layer 60 is, for example, greater than or equal to 20 nm and less than or equal to 250 nm. In the example illustrated, the upper conductive layer 60 has a layered structure including a first conductive layer 61 (Ti layer, for example) and a second conductive layer 62 (ITO layer, for example) formed on the first conductive layer 61 and including a transparent conductive layer. The first conductive layer 61 includes a high melting-point metal containing layer, for example.

As illustrated in FIG. 3, when viewed from the normal direction of the dielectric substrate 51, an end of the dielectric substrate 51 is aligned with an end of the first insulating layer 52 and an end of the second insulating layer 58. The first insulating layer 52 is formed covering substantially the entire surface of the dielectric substrate 51, and the second insulating layer 58 is formed covering substantially the entire surface of the dielectric substrate 51 except for the openings 58a and 58b. As a method for manufacturing the slot substrate 201 is described later with reference to FIG. 6, the slot substrate 201 is fabricated by forming constituent elements such as the slot electrode 55 on a mother substrate (glass substrate, for example) and subsequently cutting (dividing) the mother substrate at a predetermined position. The cutting is performed, for example, when a plurality of slot substrates are fabricated from one mother substrate. Even when one slot substrate is fabricated from one mother substrate, the cutting is performed when fabricating a slot substrate having a planar shape different from the planar shape (typically a rectangular shape) of the mother substrate according to the application or structure of the scanning antenna, for example. When the insulating films for forming the first insulating layer 52 and the second insulating layer 58 are formed on a cutting-plane line of the mother substrate, the mother substrate is cut with each insulating film. At this time, the end of the dielectric substrate 51, the end of the first insulating layer 52, and the end of the second insulating layer 58 are determined by a cutting-plane line CP (refer to FIG. 4D and FIG. 6). That is, in the obtained slot substrate 201, the end of the dielectric substrate 51 is aligned with the end of the first insulating layer 52 and the end of the second insulating layer 58.

As illustrated in FIG. 4D, in the slot substrate 201 obtained as described above, the end of the first insulating layer 52 may peel from the dielectric substrate 51. As described above, the first insulating layer 52 has a compressive stress and thus can alleviate the tensile stress of the slot electrode 55. Nevertheless, the slot electrode 55 is not formed on the entire surface of the dielectric substrate 51 (that is, the slot substrate includes portions not including the slot electrode 55). For example, the slot electrode 55 is not formed at or near the end of the dielectric substrate 51. When the slot electrode 55 is not present on the first insulating layer 52, the compressive stress of the first insulating layer 52 is not offset by the tensile stress of the slot electrode 55. Therefore, peeling may occur from an edge of the first insulating layer 52 (interface between the first insulating layer 52 and the dielectric substrate 51) due to the compressive stress of the first insulating layer 52. When the first insulating layer 52 peels from the dielectric substrate 51, disconnection or connection failure of the slot electrode 55 may arise, and the reliability of the scanning antenna may not be sufficient.

Method for Manufacturing Slot Substrate 201

A method for manufacturing the slot substrate 201 will be described with reference to FIGS. 5A to 5G.

FIGS. 5A to 5G are schematic cross-sectional views for illustrating a method for manufacturing the slot substrate 201. Each of these drawings illustrates the antenna unit region U (a cross section along a line A-A' in FIG. 3), the first terminal portion IT1 (a cross section along a line B-B' in FIG. 3), and a vicinity of the end of the dielectric substrate 51 (a cross section along a line D-D' in FIG. 3) of the slot substrate 201. Note that the second terminal portion IT2 is formed in the same manner as the first terminal portion IT1, although the drawings and descriptions are omitted.

Figure 5A:
FIGS. 5A to 5G are schematic cross-sectional views for describing a method for manufacturing the slot substrate 201.

First, as illustrated in FIG. 5A, a first insulating film 52' is deposited on a first main surface of a mother substrate 51' including the first main surface and a second main surface by physical vapor deposition (PVD) such as sputtering or vacuum deposition. The first insulating layer 52 is formed to cover substantially the entire surface of the mother substrate 51', for example.

The mother substrate 51' has a larger size (planar shape) than the dielectric substrate 51 of the slot substrate 201 finally fabricated. A substrate such as a glass substrate or a resin substrate having a high transmittance with respect to electromagnetic waves (the dielectric constant $\varepsilon_M$ and the dielectric loss tan $\delta_M$ are small) can be used as the mother substrate 51'. The mother substrate 51' is preferably thin in order to suppress the attenuation of the electromagnetic waves. For example, after forming the constituent elements such as the slot electrode 55 on the first main surface (front face) of the glass substrate 51' by a process described later, the glass substrate 51' may be thinned from the second main surface (rear face). This allows a thickness of the glass substrate 51' to be reduced to 500 μm or less, for example.

As the first insulating film 52' having a compressive stress, for example, a silicon nitride film and/or a silicon oxide film can be formed by the following method.

Figure 5B:

Example of formation conditions of silicon nitride film: $SiH_4/NH_3/N_2$: 100 to 500/100 to 1000/1000 to 6000 sccm, pressure: 100 to 300 Pa, RF power: 400 to 4000 W Example of formation conditions of silicon oxide film: $SiH_4/N_2O$: 50 to 300/1000 to 7000 sccm, pressure: 100 to 300 Pa, RF power: 400 to 3000 W Next, as illustrated in FIG. 5B, a metal film 55' is deposited on the first insulating film 52' by, for example, sputtering or vacuum deposition. Herein, a Cu film (thickness: 3 μm, for example) is used as the metal film 55'.

Figure 5C:
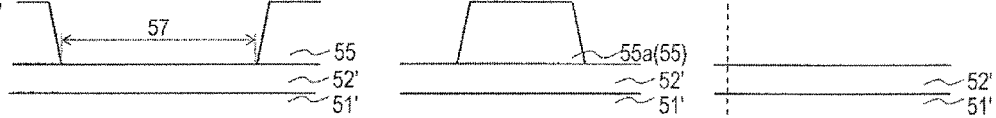

Next, the metal film 55' is patterned to form the slot electrode 55 including the plurality of slots 57, as illustrated in FIG. 5C. As described above, the slot electrode 55 may also include the lower connecting portion 55a of the first terminal portion formation region.

Figure 5D:
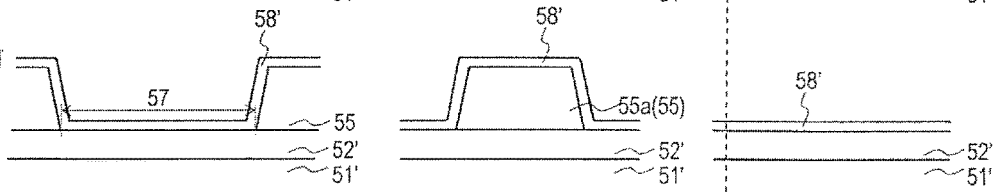

Subsequently, as illustrated in FIG. 5D, a second insulating film 58' (thickness: 100 nm or 200 nm, for example) is formed on the slot electrode 55 and within the slots 57. The second insulating film 58' is formed to cover substantially the entire surface of the mother substrate 51', for example.

For the second insulating film 58', for example, a silicon oxide ($SiO_x$) film, a silicon nitride ($SiN_x$) film, a silicon oxynitride ($SiO_xN_y$; x>y) film, a silicon nitride oxide ($SiN_xO_y$; x>y) film, or the like can be used as appropriate. Here, as the second insulating film 58', a silicon nitride ($Si_xN_y$) film having a thickness of 100 nm, for example, is formed.

Figure 5E:
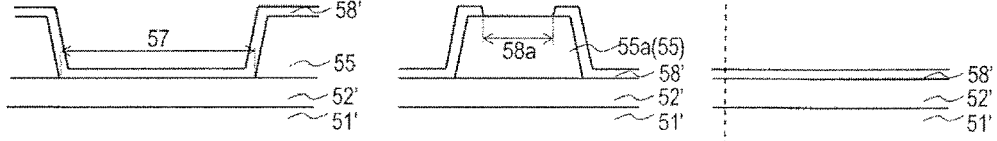

Subsequently, the second insulating film 58' is patterned to form the opening 58a in the second insulating film 58', as illustrated in FIG. 5E. The opening 58a is formed to reach the slot electrode 55 in a first terminal portion formation region.

Figure 5F:
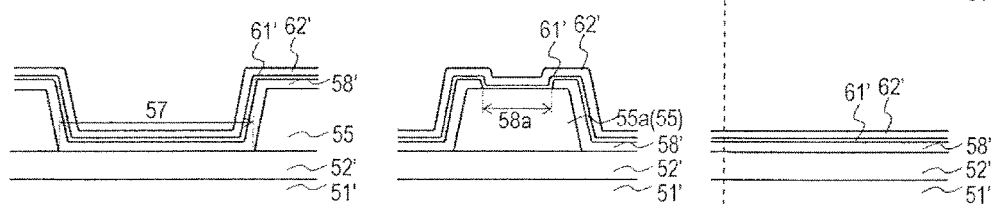

Next, as illustrated in FIG. 5F, a first upper conductive film 61' and a second upper conductive film 62' are formed in this order on the second insulating film 58' and within the opening 58a. Here, a Ti film having a thickness of 50 nm, for example, is formed as the first upper conductive film 61', and an ITO film having a thickness of 70 nm, for example, is formed as the second upper conductive film 62'.

Figure 5G:
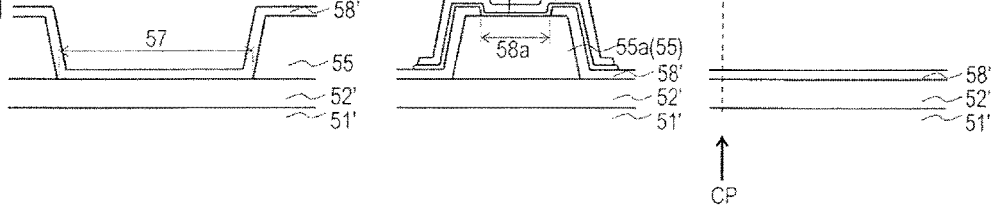

Subsequently, the first upper conductive film 61' and the second upper conductive film 62' are patterned to form the upper conductive layer 60 including the upper connecting portion 60a in contact with the slot electrode 55 within the opening 58a, as illustrated in FIG. 5G. The upper conductive layer 60 has a layered structure including the first conductive layer 61 and the second conductive layer 62.

Subsequently, the mother substrate 51' is cut at the cutting-plane line CP, thereby obtaining the dielectric substrate 51. The first insulating film 52' and the second insulating film 58' are present on the cutting-plane line CP and thus the first insulating film 52' and the second insulating film 58' are also cut at the cutting-plane line CP. As a result, the first insulating layer 52 and the second insulating layer 58 are obtained. The end of the dielectric substrate 51, the end of the first insulating layer 52, and the end the second insulating layer 58 are aligned.

In this manner, the slot substrate 201 is manufactured.

As described above, in the slot substrate 201, a problem may arise in which the reliability of the scanning antenna is insufficient due to the first insulating layer being peeled away from the dielectric substrate. According to the embodiment of the disclosure, the occurrence of such problems is suppressed.

Embodiment 1-1

The structure of a slot substrate 201Aa according to Embodiment 1-1 of the disclosure will be described with reference to FIG. 6 and FIGS. 7A to 7D. The configurations common to the slot substrate 201 are denoted by common reference signs and the descriptions thereof may be omitted. The same applies to subsequent embodiments.

Figure 6:
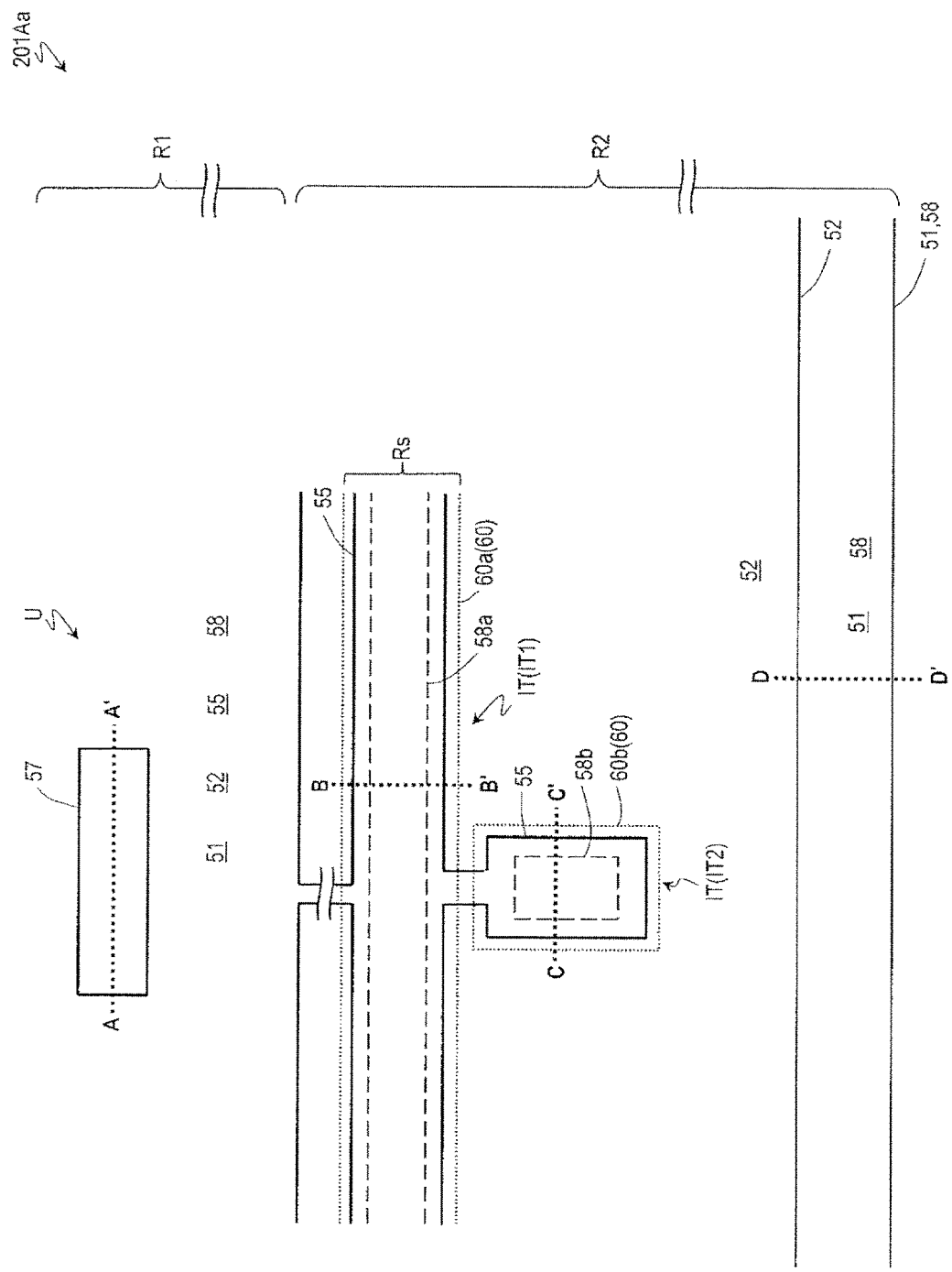
FIG. 6 is a schematic plan view of a slot substrate 201Aa according to Embodiment 1-1 of the disclosure.
Figure 7A:
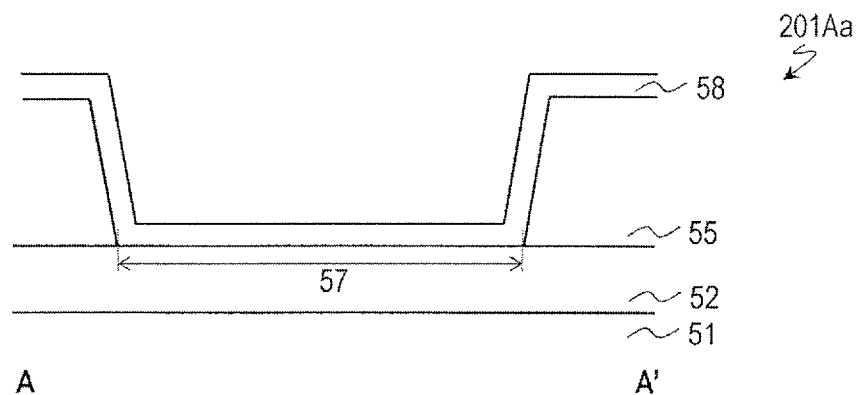
FIGS. 7A to 7D are schematic cross-sectional views of the slot substrate 201Aa.
Figure 7B:
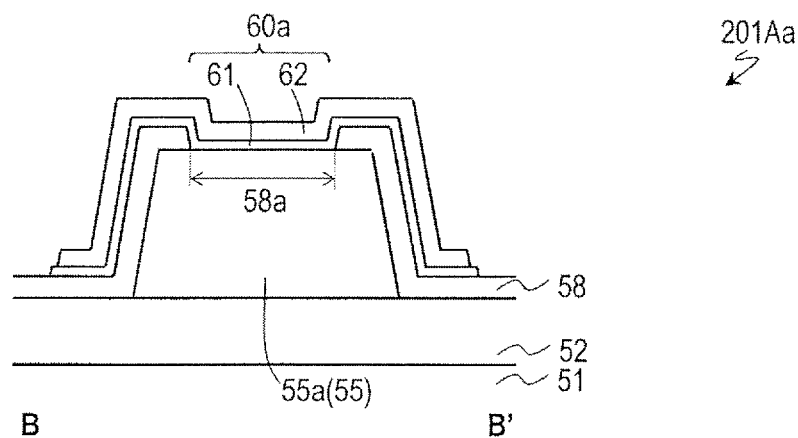
Figure 7C:
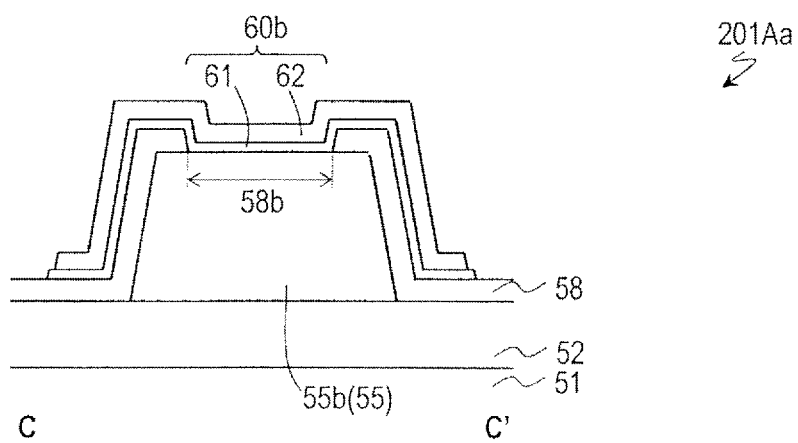

FIG. 6 is a schematic plan view of the slot substrate 201Aa, illustrating a schematic plan view of the antenna unit region U of the transmission and/or reception region R1 of the slot substrate 201Aa, the non-transmission and/or reception region R2 of the slot substrate 201Aa, and the region in the vicinity of an end of the slot substrate 201Aa. FIG. 7A is a schematic cross-sectional view along line A-A' in FIG. 6, FIG. 7B is a schematic cross-sectional view along line B-B' in FIG. 6, FIG. 7C is a schematic cross-sectional view along line C-C' in FIG. 6, and FIG. 7D is a schematic cross-sectional view along line D-D' in FIG. 6.

In the slot substrate 201 illustrated in FIG. 3, the first insulating layer 52 is formed covering the entire surface of the second dielectric substrate 51. When the slot electrode 55 is not present on the first insulating layer 52, the compressive stress of the first insulating layer 52 is not offset by the tensile stress of the slot electrode 55. Therefore, peeling can occur from an edge of the first insulating layer 52 (interface between the first insulating layer 52 and the dielectric substrate 51) due to the compressive stress of the first insulating layer 52. The peeling of the first insulating layer 52 is likely to occur at a location where the mother substrate 51' is cut (on the cutting-plane line CP).

Figure 7D:
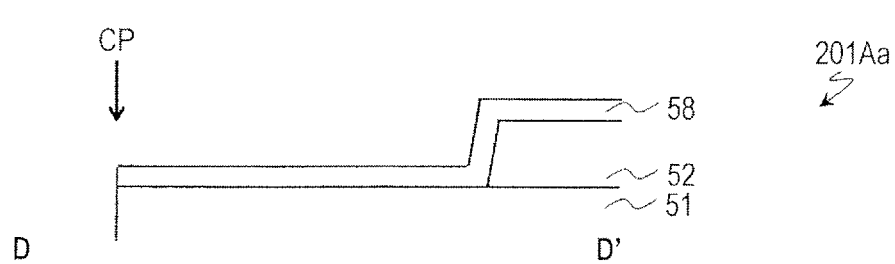

In contrast, as illustrated in FIG. 6 and FIG. 7D, a portion of the slot substrate 201Aa not including the slot electrode 55 includes a region (may be referred to as a "first region") in which the second dielectric substrate 51 is exposed from the first insulating layer 52 and, when viewed from the normal direction of the second dielectric substrate 51, the first region includes the end of the second dielectric substrate 51. An area of the first insulating layer 52 of the slot substrate 201Aa is small compared to that of the slot substrate 201. Reducing the area of the first insulating layer 52 reduces the stress at the edge of the first insulating layer 52 and, as a result, suppresses the peeling of the first insulating layer 52. Further, removing the first insulating layer 52 on the end of the second dielectric substrate 51 corresponding to the cutting-plane line CP of the mother substrate 51' alleviates the compressive stress of the first insulating layer 52 at the interface with the second dielectric substrate 51 at a cutting location of the mother substrate serving as a start point where the peeling of the first insulating layer 52 occurs. Accordingly, by using the slot substrate 201Aa, it is possible to improve the reliability of the scanning antenna.

In this example, the first region is provided along the end of the dielectric substrate 51. When viewed from the normal direction of the dielectric substrate 51, the area of the first region is preferably no less than 0.2%, for example, of an area of a portion of the slot substrate 201Aa not including the slot electrode 55. When viewed from the normal direction of the dielectric substrate 51, the end of the first insulating layer 52 is preferably inward by 0.1 mm or greater, for example, from the end of the dielectric substrate 51.

The method for manufacturing the slot substrate 201Aa will be described with reference to FIGS. 8A to 8H. In the following, descriptions may be omitted for steps common to those of the slot substrate 201. The same applies to subsequent embodiments as well.

FIGS. 8A to 8H are schematic cross-sectional views for illustrating the method for manufacturing the slot substrate 201Aa. Each of these drawings illustrates the antenna unit region U (a cross section along a line A-A' in FIG. 6) the first terminal portion IT1 (a cross section along a line B-B' in FIG. 6), and a vicinity of the end of the dielectric substrate 51 (a cross section along a line D-D' in FIG. 6) of the slot substrate 201Aa.

First, as illustrated in FIG. 8A, the first insulating film 52' is deposited on the first main surface of the mother substrate 51'.

Next, as illustrated in FIG. 8B, the metal film 55' is deposited on the first insulating film 52' by, for example, sputtering or vacuum deposition.

Next, the metal film 55' is patterned to form the slot electrode 55 including the plurality of slots 57, as illustrated in FIG. 8C.

Next, the first insulating film 52' is patterned to form the first insulating layer 52, as illustrated in FIG. 8D. At this time, the first insulating layer 52 is formed so that the first insulating layer 52 is not present above the location (cutting-plane line CP) where the mother substrate 51' is cut.

Subsequently, as illustrated in FIG. 8E, the second insulating film 58' is formed on the slot electrode 55 and within the slots 57.

Subsequently, the second insulating film 58' is patterned to form the opening 58a of the second insulating film 58', as illustrated in FIG. 8F.

Next, as illustrated in FIG. 8G, the first upper conductive film 61' and the second upper conductive film 62' are formed in this order on the second insulating film 58' and within the opening 58a.

Subsequently, the first upper conductive film 61' and the second upper conductive film 62' are patterned to form the upper conductive layer 60 that has a layered structure including the first conductive layer 61 and the second conductive layer 62 and includes the upper connecting portion 60a, as illustrated in FIG. 8H.

Subsequently, the mother substrate 51' is cut at the cutting-plane line CP, thereby obtaining the dielectric substrate 51. The second insulating film 58' is present on the cutting-plane line CP and thus the second insulating film 58' is also cut at the cutting-plane line CP, thereby obtaining the second insulating layer 58. The end of the second insulating layer 58 and the end of the dielectric substrate 51 are aligned. On the other hand, because the first insulating layer 52 is not present on the cutting-plane line CP, the first insulating layer 52 is not cut in this step. The end of the first insulating layer 52 and the end of the dielectric substrate 51 are not aligned.

In this manner, the slot substrate 201Aa is manufactured.

Embodiment 1-2

In the previous embodiment, an example has been illustrated in which peeling from the dielectric substrate can be suppressed by reducing the area of the first insulating layer. As illustrated in the present embodiment, peeling from the dielectric substrate can also be suppressed by reducing the thickness of the first insulating layer.

Figure 9:
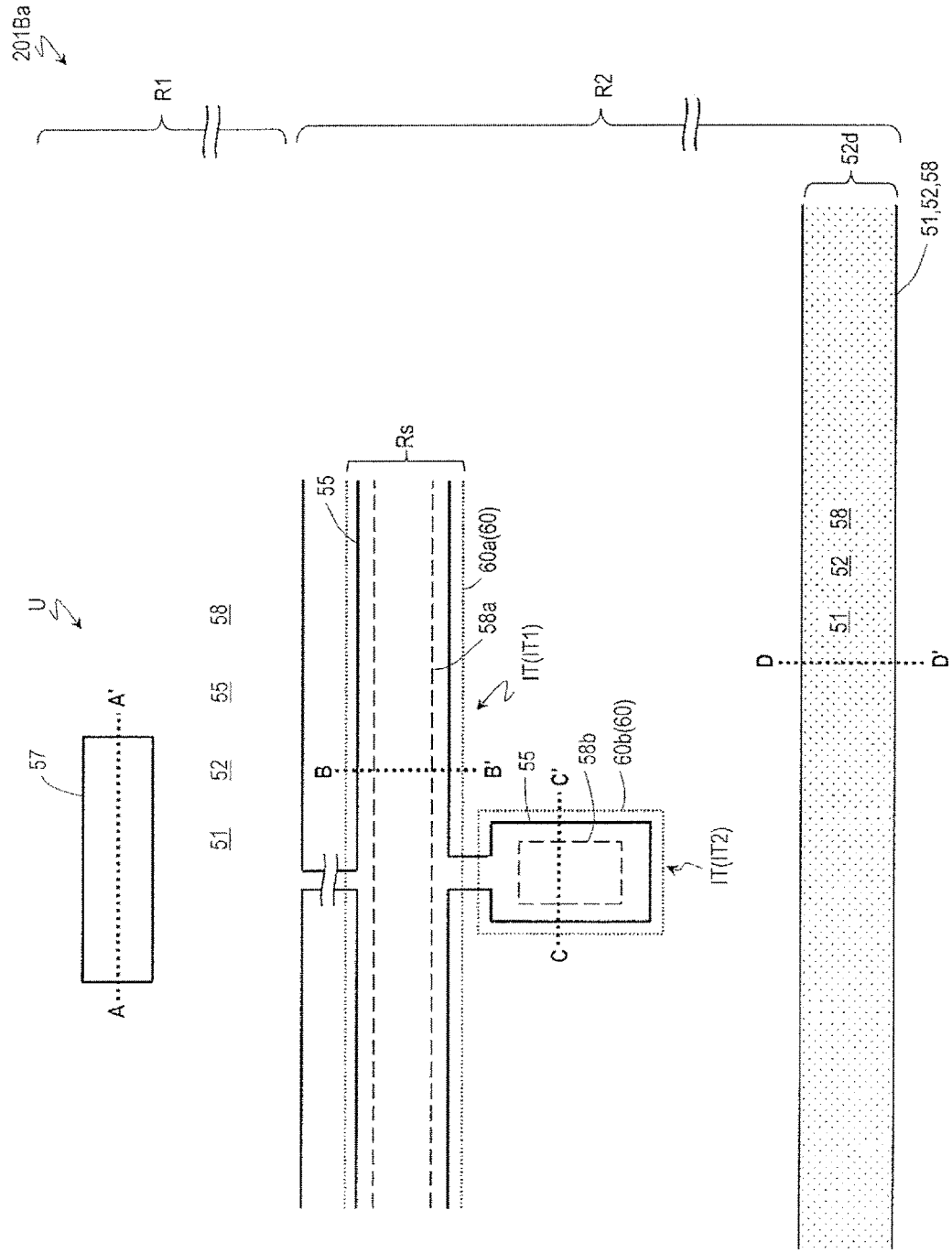
FIG. 9 is a schematic plan view of a slot substrate 201Ba according to Embodiment 1-2 of the disclosure.
Figure 10A:
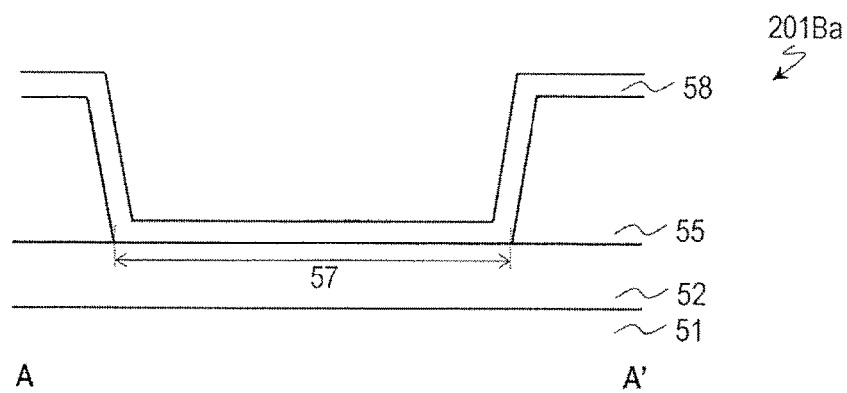
FIGS. 10A to 10D are schematic cross-sectional views of the slot substrate 201Ba.
Figure 10B:
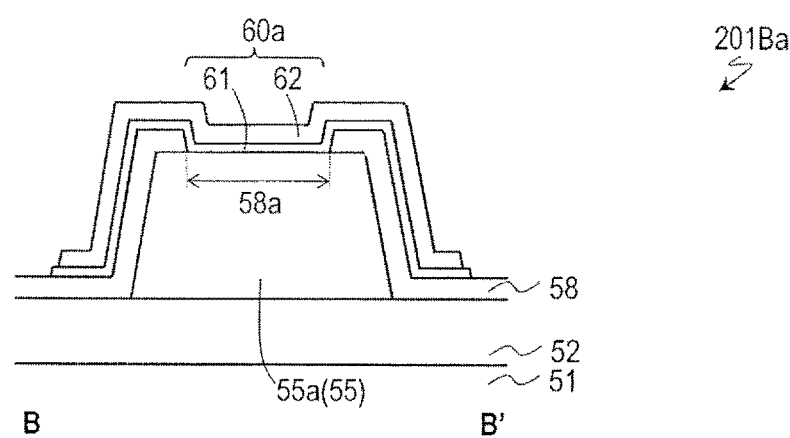
Figure 10C:
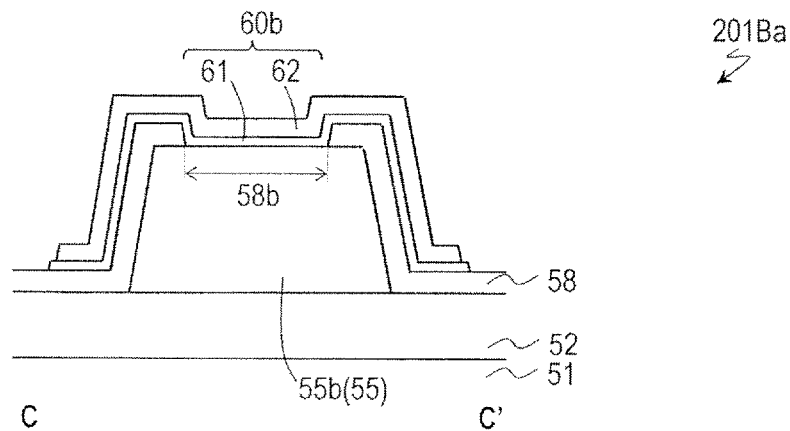
Figure 10D:
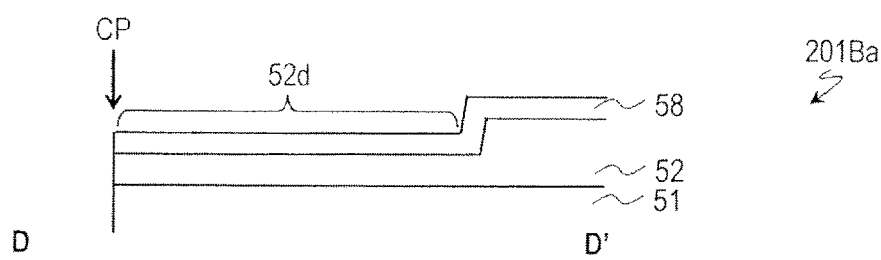

The structure of a slot substrate 201Ba according to Embodiment 1-2 of the disclosure will be described with reference to FIG. 9 and FIGS. 10A to 10D. FIG. 9 is a schematic plan view of the slot substrate 201Ba, illustrating a schematic plan view of the antenna unit region U of the transmission and/or reception region R1 of the slot substrate 201Ba, the non-transmission and/or reception region R2 of the slot substrate 201Ba, and the region in the vicinity of an end of the slot substrate 201Ba. FIG. 10A is a schematic cross-sectional view along a line A-A' in FIG. 9, FIG. 10B is a schematic cross-sectional view along a line B-B' in FIG. 9, and FIG. 10C is a schematic cross-sectional view along a line C-C' in FIG. 9, and FIG. 10D is a schematic cross-sectional view along a line D-D' in FIG. 9.

In the slot substrate 201 illustrated in FIG. 3, the first insulating layer 52 is formed covering the entire surface of the second dielectric substrate 51. As illustrated in FIG. 9 and FIG. 10D, in the slot substrate 201Ba as well, the first insulating layer 52 is formed covering the entire surface of the second dielectric substrate 51. However, the portion of the slot substrate 201Ba not including the slot electrode 55 differs from the slot substrate 201 in including a region (may be referred to as "second region") where the thickness of the first insulating layer 52 is less than the thickness of the portion of the first insulating layer 52 overlapping the slot substrate 55. When viewed from the normal direction of the second dielectric substrate 51, the second region includes the end of the second dielectric substrate 51. Reducing the thickness of the first insulating layer 52 reduces the stress at the edge of the first insulating layer 52 and, as a result, suppresses the peeling of the first insulating layer 52. Further, thinning the first insulating layer 52 on the end of the second dielectric substrate 51 corresponding to the cutting-plane line CP of the mother substrate 51' alleviates the compressive stress of the first insulating layer 52 at the interface with the second dielectric substrate 51 at a cutting location of the mother substrate serving as the start point where the peeling of the first insulating layer 52 occurs. Accordingly, by using the slot substrate 201Ba, it is possible to improve the reliability of the scanning antenna.

In this example, the second region is provided along the end of the dielectric substrate 51. In the second region, the first insulating layer 52 includes a thin portion 52d having a thickness less than a thickness of the portion of the first insulating layer 52 overlapping the slot electrode 55. In the plan view (FIG. 9), the thin portion 52d is hatched for ease of viewing. Herein, the second region and the thin portion 52d are aligned.

The thickness of the first insulating layer 52 at the thin portion 52d is, for example, greater than or equal to 50 nm and less than or equal to 450 nm. The thickness of the first insulating layer 52 at the thin portion 52d is preferably, for example, greater than or equal to 5% and less than or equal to 85% of the thickness of the portion of the first insulating layer 52 overlapping the slot electrode 55. When viewed from the normal direction of the dielectric substrate 51, the thin portion 52d is preferably formed with a width of 0.1 mm or greater from the end of the dielectric substrate 51 (that is, the end of the first insulating layer 52).

The method for manufacturing the slot substrate 201Ba will be described with reference to FIGS. 11A to 11H. FIGS. 11A to 11H are schematic cross-sectional views for describing the method for manufacturing the slot substrate 201Ba. Each of these drawings illustrates the antenna unit region U (a cross section along a line A-A' in FIG. 9), the first terminal portion IT1 (a cross section along a line B-B' in FIG. 9), and a vicinity of the end of the dielectric substrate 51 (a cross section along a line D-D' in FIG. 9) of the slot substrate 201Ba.

First, as illustrated in FIG. 11A, the first insulating film 52' is deposited on the first main surface of the mother substrate 51'.

Next, as illustrated in FIG. 11B, the metal film 55' is deposited on the first insulating film 52' by, for example, sputtering or vacuum deposition.

Next, the metal film 55' is patterned to form the slot electrode 55 including the plurality of slots 57, as illustrated in FIG. 11C.

Next, as illustrated in FIG. 11D, the thin portion 52d is formed by partially thinning the first insulating film 52'. The thin portion 52d is formed so as to be present on the cutting-plane line CP of the mother substrate 51'.

Subsequently, as illustrated in FIG. 11E, the second insulating film 58' is formed on the slot electrode 55 and within the slots 57.

Subsequently, the second insulating film 58' is patterned to form the opening 58a of the second insulating film 58', as illustrated in FIG. 11F.

Next, as illustrated in FIG. 11G, the first upper conductive film 61' and the second upper conductive film 62' are formed in this order on the second insulating film 58' and within the opening 58a.

Subsequently, the first upper conductive film 61' and the second upper conductive film 62' are patterned to form the upper conductive layer 60 that has a layered structure including the first conductive layer 61 and the second conductive layer 62 and includes the upper connecting portion 60a, as illustrated in FIG. 11H.

Subsequently, the mother substrate 51' is cut at the cutting-plane line CP, thereby obtaining the slot substrate 201Ba. The first insulating film 52' and the second insulating film 58' are present on the cutting-plane line CP and thus the first insulating film 52' and the second insulating film 58' are also cut at the cutting-plane line CP. As a result, the first insulating layer 52 and the second insulating layer 58 are obtained. The end of the dielectric substrate 51, the end of the first insulating layer 52, and the end the second insulating layer 58 are aligned. The thin portion 52d of the first insulating film 52' is present on the cutting-plane line CP, and thus the obtained first insulating layer 52 includes the thin portion 52d having a small thickness at an edge portion including the end.

In this manner, the slot substrate 201Ba is manufactured.

As described, in the slot substrate 201 of the scanning antenna described in WO 2017/208996, the problem may arise in which the reliability of the scanning antenna is insufficient due to the first insulating layer 52 peeling from the dielectric substrate 51. This problem arises when the compressive stress of the first insulating layer 52 is not offset by the tensile stress of the slot electrode 55 at a location where the slot electrode 55 is not present on the first insulating layer 52. That is, peeling can occur from an edge of the first insulating layer 52 (interface between the first insulating layer 52 and the dielectric substrate 51) due to the compressive stress of the first insulating layer 52. In order to suppress the peeling, it is sufficient to reduce the stress at the edge of the first insulating layer 52, and it is conceivable to reduce the area of the first insulating layer 52 and/or reduce the thickness of the first insulating layer 52, as described in Embodiment 1-1 and Embodiment 1-2. Removing and/or thinning at least a portion of the first insulating layer 52 above the end of the second dielectric substrate 51 corresponding to the cutting-plane line of the mother substrate alleviates the compressive stress of the first insulating layer 52 at the interface with the second dielectric substrate 51 at a cutting location of the mother substrate serving as start point where the peeling of the first insulating layer 52 occurs. Note that, when the first insulating layer 52 is divided into a plurality of regions (islands), reducing the area of the first insulating layer 52 means reducing the areas of the individual islands. While other embodiments of the disclosure are further illustrated below, embodiments of the disclosure are not limited to those exemplified herein, and may be modified as appropriate to the extent that the effects described above are obtained.

Embodiment 1-3

Figure 12:
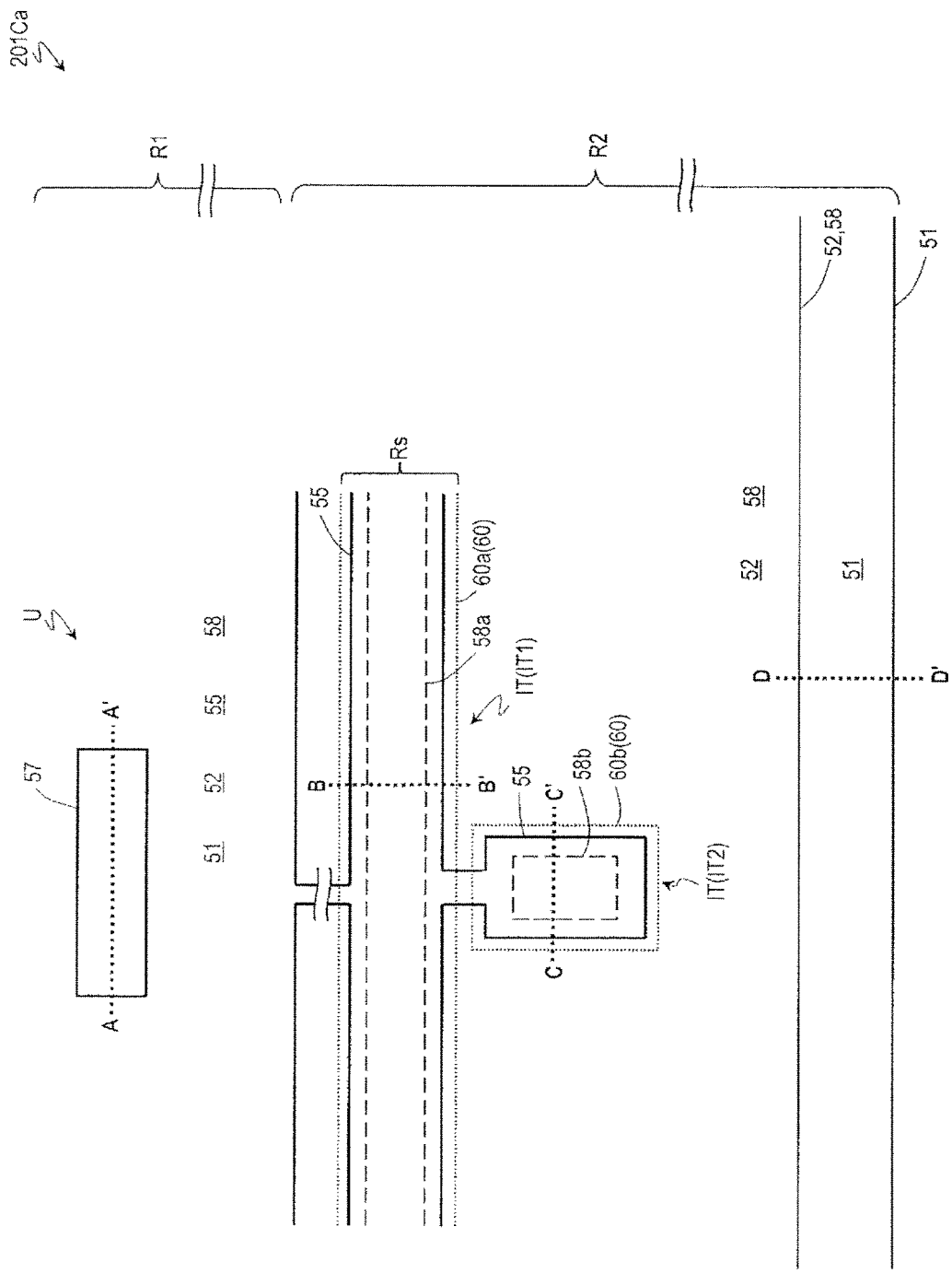
FIG. 12 is a schematic plan view of a slot substrate 201Ca according to Embodiment 1-3 of the disclosure.
Figure 13A:
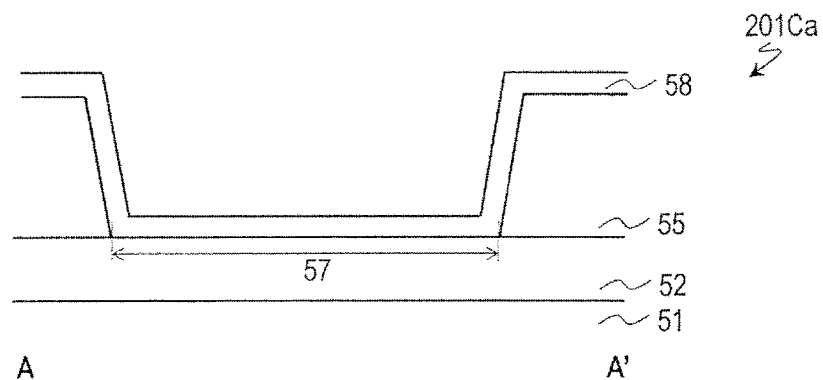
FIGS. 13A to 13D are schematic cross-sectional views of a slot substrate 201Ca.
Figure 13B:
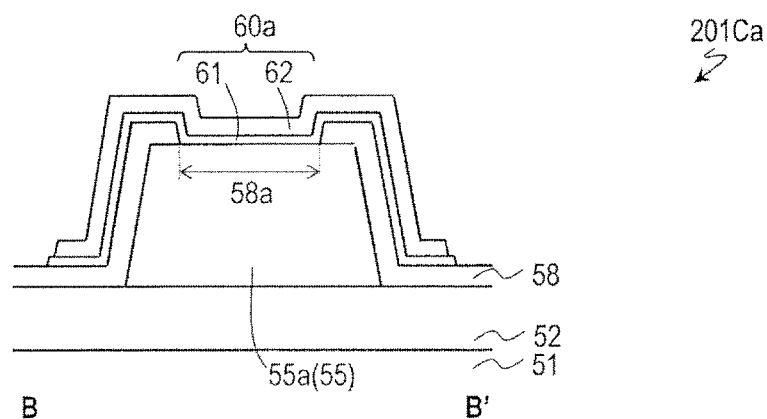
Figure 13C:
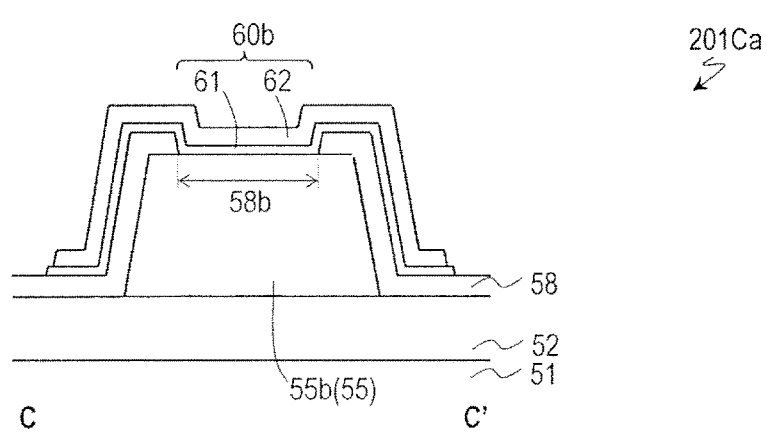

The structure of a slot substrate 201Ca according to Embodiment 1-3 of the disclosure will be described with reference to FIG. 12 and FIGS. 13A to 13D. FIG. 12 is a schematic plan view of the slot substrate 201Ca, illustrating schematic plan views of the antenna unit region U of the transmission and/or reception region R1 of the slot substrate 201Ca, the non-transmission and/or reception region R2 of the slot substrate 201Ca, and the region in the vicinity of an end of the slot substrate 201Ca. FIG. 13A is a schematic cross-sectional view along a line A-A' in FIG. 12, FIG. 13B is a schematic cross-sectional view along a line B-B' in FIG. 12, and FIG. 13C is a schematic cross-sectional view along a line C-C' in FIG. 12, and FIG. 13D is a schematic cross-sectional view along a line D-D' in FIG. 12.

Figure 13D:
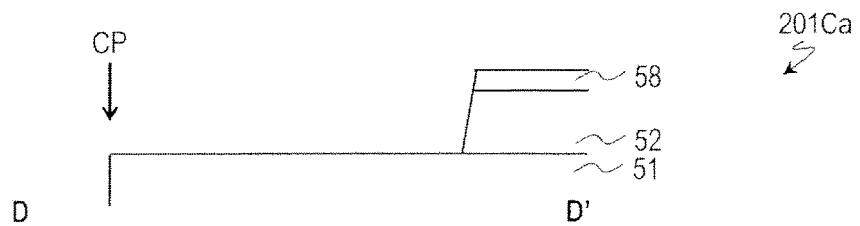

As illustrated in FIG. 12 and FIG. 13D, in the slot substrate 201Ca, similar to the slot substrate 201Aa, a portion of the slot substrate 201Ca not including the slot electrode 55 includes a region (first region) in which the second dielectric substrate 51 is exposed from the first insulating layer 52 and, when viewed from the normal direction of the second dielectric substrate 51, the first region includes the end of the second dielectric substrate 51. The area of the first insulating layer 52 is small, thereby reducing the stress at the edge of the first insulating layer 52 and, as a result, suppressing the peeling of the first insulating layer 52. Further, removing the first insulating layer 52 on the end of the second dielectric substrate 51 corresponding to the cutting-plane line CP of the mother substrate 51' alleviates the compressive stress of the first insulating layer 52 at the interface with the second dielectric substrate 51 at a cutting location of the mother substrate serving as a start point where the peeling of the first insulating layer 52 occurs. Accordingly, by using the slot substrate 201Ca, it is possible to improve the reliability of the scanning antenna.

Furthermore, the slot substrate 201Ca differs from the slot substrate 201Aa in that, in the first region, the second dielectric substrate 51 is also exposed from the second insulating layer 58.

The end of the second insulating layer 58 is preferably aligned with the end of the first insulating layer 52. In this case, as described below, the advantage is also achieved that the slot substrate 201Ca can be manufactured with fewer manufacturing steps (number of photomasks, for example) compared to the slot substrate 201Aa.

The method for manufacturing the slot substrate 201Ca will be described with reference to FIGS. 14A to 14G. FIGS. 14A to 14G are schematic cross-sectional views for describing the method for manufacturing the slot substrate 201Ca. Each of these drawings illustrates the antenna unit region U (a cross section along a line A-A' in FIG. 12), the first terminal portion IT1 (a cross section along a line B-B' in FIG. 12), and a vicinity of the end of the dielectric substrate 51 (a cross section along a line D-D' in FIG. 12) of the slot substrate 201Ca.

First, as illustrated in FIG. 14A, the first insulating film 52' is deposited on the first main surface of the mother substrate 51'.

Next, as illustrated in FIG. 14B, the metal film 55' is deposited on the first insulating film 52' by, for example, sputtering or vacuum deposition.

Next, the metal film 55' is patterned to form the slot electrode 55 including the plurality of slots 57, as illustrated in FIG. 14C.

Subsequently, as illustrated in FIG. 14D, the second insulating film 58' is formed on the slot electrode 55 and within the slots 57.

Subsequently, the first insulating film 52' and the second insulating film 58' are patterned to form the first insulating layer 52 and the second insulating layer 58, as illustrated in FIG. 14E. The second insulating layer 58 includes the opening 58a. At this time, the first insulating layer 52 and the second insulating layer 58 are formed so that the first insulating layer 52 and the second insulating layer 58 are not present above the location (cutting-plane line CP) where the mother substrate 51' is cut.

In this way, the first insulating layer 52 and the second insulating layer 58 are formed using the same photomask, and thus the slot substrate 201Ca can be fabricated with fewer manufacturing steps (for example, the number of photomasks) compared to the slot substrate 201. The first insulating film 52' and the second insulating film 58' are collectively etched, and thus a side surface of the obtained first insulating layer 52 and a side surface of the second insulating layer 58 are aligned in a D-D' cross section. A configuration in which the side surfaces of two or more different layers are aligned can be obtained by, for example, etching these layers using the same mask, or by using one of these layers as a mask to etch the other layer.

Next, as illustrated in FIG. 14F, the first upper conductive film 61' and the second upper conductive film 62' are formed in this order on the second insulating layer 58 and within the opening 58a.

Subsequently, the first upper conductive film 61' and the second upper conductive film 62' are patterned to form the upper conductive layer 60 that has a layered structure including the first conductive layer 61 and the second conductive layer 62 and includes the upper connecting portion 60a, as illustrated in FIG. 14G.

Subsequently, the mother substrate 51' is cut at the cutting-plane line CP, thereby obtaining the dielectric substrate 51. The first insulating layer 52 and the second insulating layer 58 are not present on the cutting-plane line CP, and thus the first insulating layer 52 and the second insulating layer 58 are not cut in this step. The end of the first insulating layer 52 and the end of the dielectric substrate 51 are not aligned, and the end of the second insulating layer 58 and the end of the dielectric substrate 51 are not aligned.

In this manner, the slot substrate 201Ca is manufactured.

Modification Example

Figure 15:
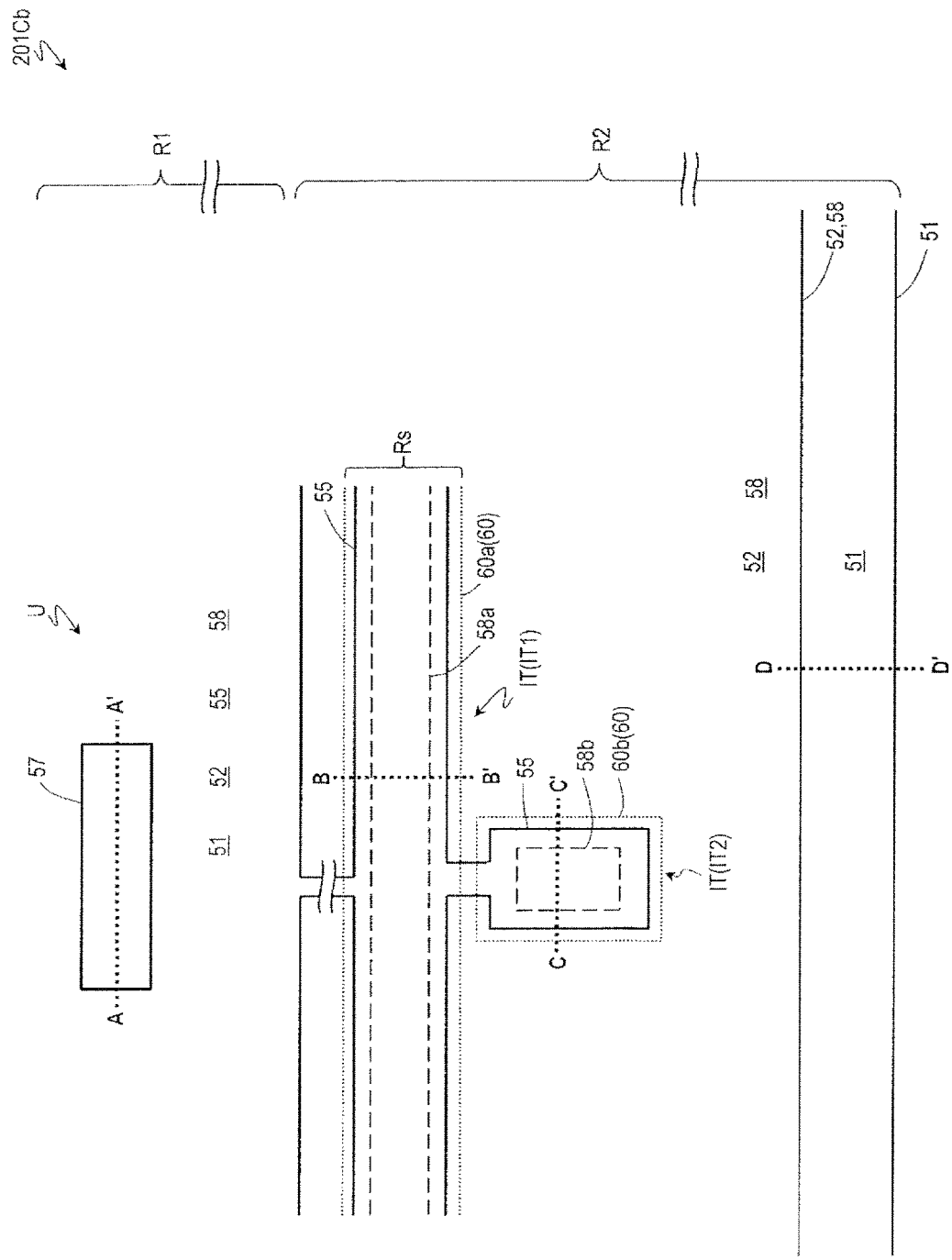
FIG. 15 is a schematic plan view of a slot substrate 201Cb according to a modification example of Embodiment 1-3 of the disclosure.
Figure 16A:
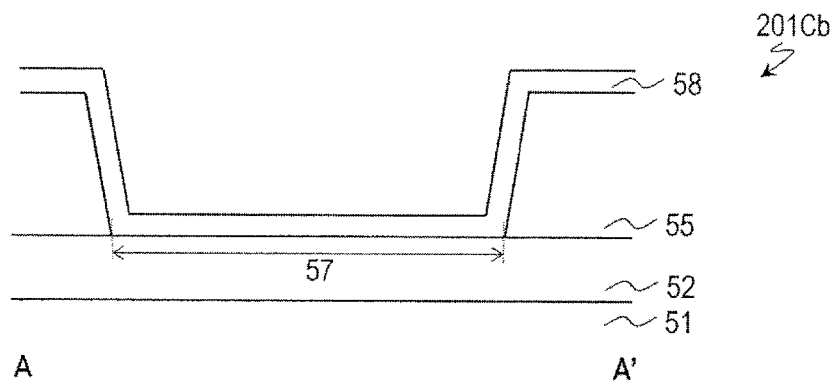
FIGS. 16A to 16D are schematic cross-sectional views of the slot substrate 201Cb.

The structure of a slot substrate 201Cb according to a modification example of Embodiment 1-3 of the disclosure will be described with reference to FIG. 15 and FIGS. 16A to 16D. FIG. 15 is a schematic plan view of the slot substrate 201Cb, illustrating a schematic plan view of the antenna unit region U of the transmission and/or reception region R1 of the slot substrate 201Cb, the non-transmission and/or reception region R2 of the slot substrate 201Cb, and the region in the vicinity of an end of the slot substrate 201Cb. FIG. 16A is a schematic cross-sectional view along a line A-A' in FIG. 15, FIG. 16B is a schematic cross-sectional view along a line B-B' in FIG. 15, FIG. 16C is a schematic cross-sectional view along a line C-C' in FIG. 15, and FIG. 16D is a schematic cross-sectional view along a line D-D' in FIG. 15.

In the slot substrate 201Ca illustrated in FIG. 12 and FIGS. 13A to 13D, the upper conductive layer 60 including the upper connecting portions 60a and 60b is disposed above the second insulating layer 58. In contrast, in the slot substrate 201Cb illustrated in FIG. 16B and FIG. 16C, the upper conductive layer 60 including the upper connecting portions 60a and 60b is disposed between the second insulating layer 58 and the slot electrode 55.

Figure 16B:
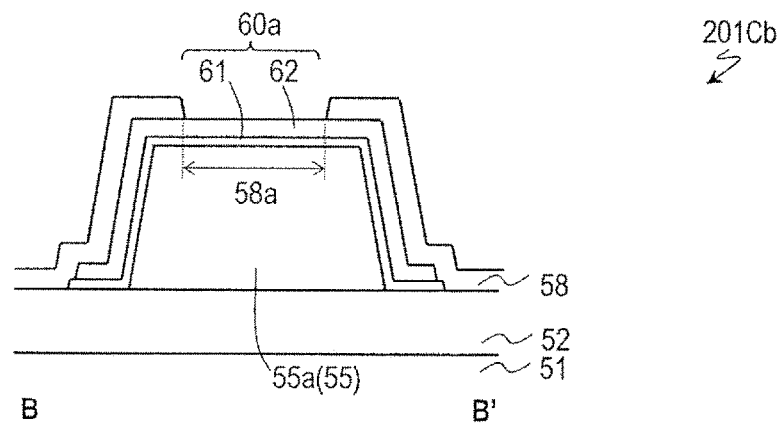
Figure 16C:
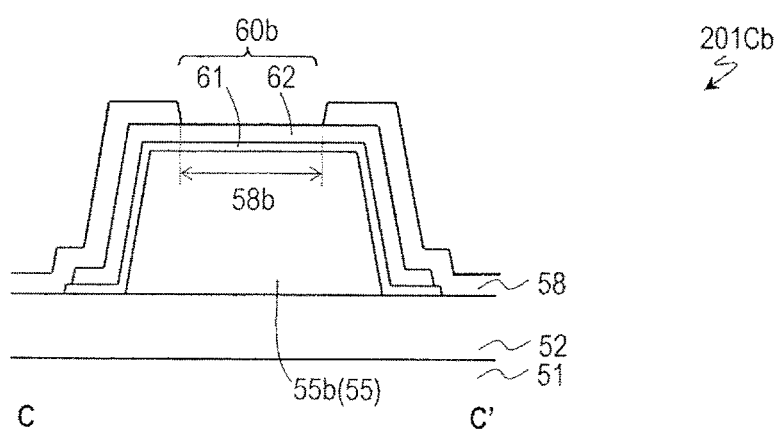
Figure 16D:
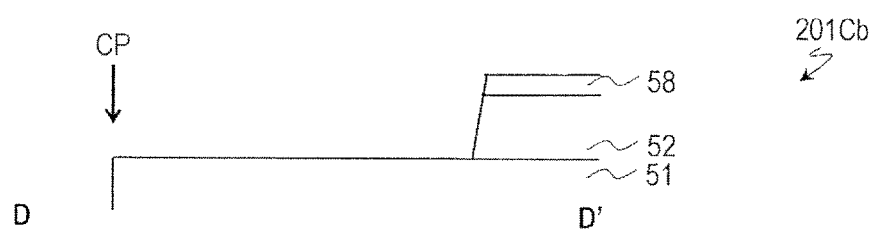

As illustrated in FIG. 15 and FIG. 16B, the first terminal portion IT1 includes the first insulating layer 52, the slot electrode 55, the upper connecting portion 60a connected to the slot electrode 55, the second insulating layer 58 formed on the upper connecting portion 60a, and the opening 58a that reaches the upper connecting portion 60a formed in the second insulating layer 58. As illustrated in FIG. 15 and FIG. 16C, the second terminal portion IT2 has a cross-sectional structure similar to that of the first terminal portion IT1.

In the slot substrate 201Cb having such a structure as well, the same effects as those of the slot substrate 201Ca can be obtained.

Note that such a modification example can be applied to any of the embodiments described above.

The method for manufacturing the slot substrate 201Cb will be described with reference to FIGS. 17A to 17G. FIGS. 17A to 17G are schematic cross-sectional views for describing the method for manufacturing the slot substrate 201Cb. Each of these drawings illustrates the antenna unit region U (a cross section along a line A-A' in FIG. 15), the first terminal portion IT1 (a cross section along a line B-B' in FIG. 15), and a vicinity of the end of the dielectric substrate 51 (a cross section along a line D-D' in FIG. 15) of the slot substrate 201Cb.

First, as illustrated in FIG. 17A, the first insulating film 52' is deposited on the first main surface of the mother substrate 51'.

Next, as illustrated in FIG. 17B, the metal film 55' is deposited on the first insulating film 52' by, for example, sputtering or vacuum deposition.

Next, the metal film 55' is patterned to form the slot electrode 55 including the plurality of slots 57, as illustrated in FIG. 17C.

Subsequently, as illustrated in FIG. 17D, the first upper conductive film 61' and the second upper conductive film 62' are formed in this order on the slot electrode 55 and within the slots 57.

Subsequently, the first upper conductive film 61' and the second upper conductive film 62' are patterned to form the upper conductive layer 60 that has a layered structure including the first conductive layer 61 and the second conductive layer 62 and includes the upper connecting portion 60a, as illustrated in FIG. 17E.

Subsequently, as illustrated in FIG. 17F, the second insulating film 58' is formed on the slot electrode 55, within the slots 57, and on the upper conductive layer 60.

Subsequently, the first insulating film 52' and the second insulating film 58' are patterned to form the first insulating layer 52 and the second insulating layer 58, as illustrated in FIG. 17G. The second insulating layer 58 includes the opening 58a. At this time, the first insulating layer 52 and the second insulating layer 58 are formed so that the first insulating layer 52 and the second insulating layer 58 are not present above the location (cutting-plane line CP) where the mother substrate 51' is cut.

As the upper conductive layer 60 (herein, the second conductive layer 62), a material having a high etch selectivity with respect to the second insulating layer 58 is preferably selected. For example, the upper conductive layer (here, the second conductive layer 62) is preferably an ITO layer.

Subsequently, the mother substrate 51' is cut at the cutting-plane line CP, thereby obtaining the dielectric substrate 51.

In this manner, the slot substrate 201Cb is manufactured.

Embodiment 1-4

Figure 18:
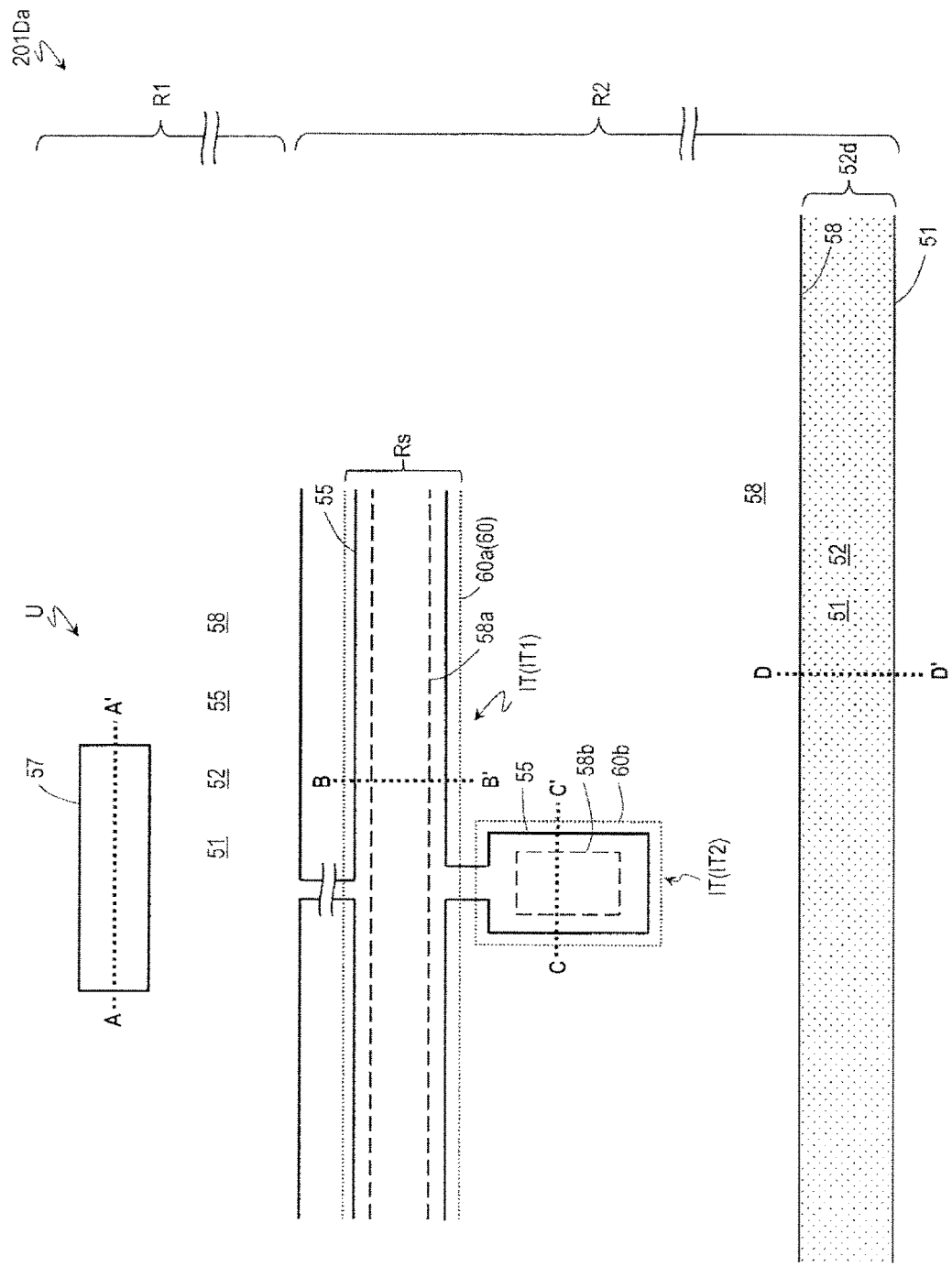
FIG. 18 is a schematic plan view of a slot substrate 201Da according to Embodiment 1-4 of the disclosure.
Figure 19A:
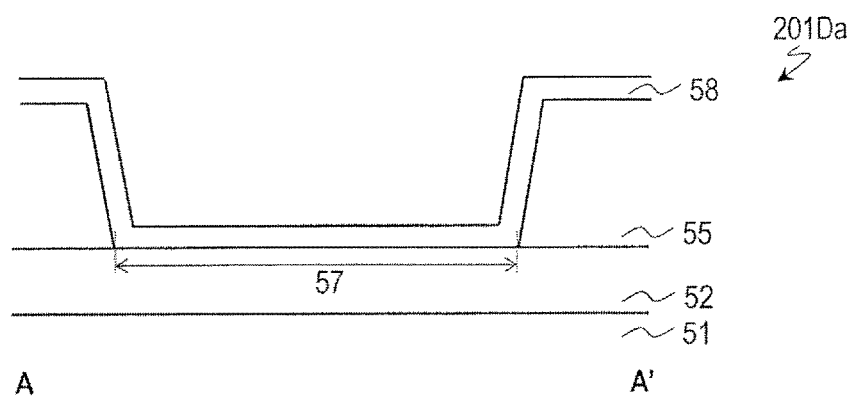
FIGS. 19A to 19D are schematic cross-sectional views of the slot substrate 201Da.
Figure 19B:
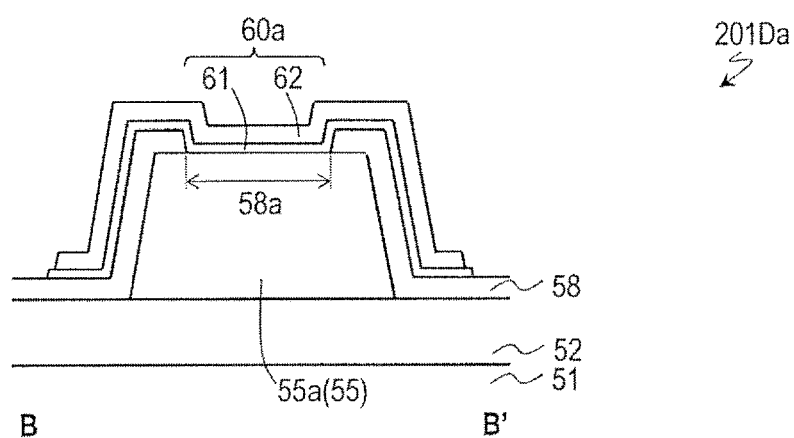
Figure 19C:
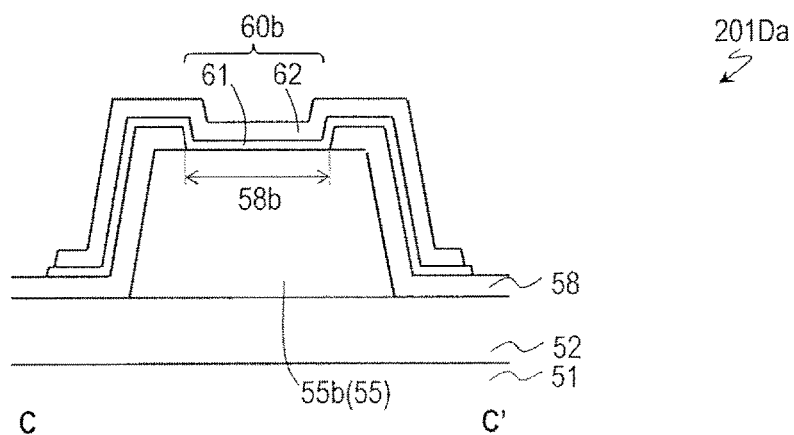

The structure of a slot substrate 201Da according to Embodiment 1-4 of the disclosure will be described with reference to FIG. 18 and FIGS. 19A to 19D. FIG. 18 is a schematic plan view of the slot substrate 201Da, illustrating a schematic plan view of the antenna unit region U of the transmission and/or reception region R1 of the slot substrate 201Da, the non-transmission and/or reception region R2 of the slot substrate 201Da, and the region in the vicinity of an end of the slot substrate 201Da. FIG. 19A is a schematic cross-sectional view along a line A-A' in FIG. 18, FIG. 19B is a schematic cross-sectional view along a line B-B' in FIG. 18, and FIG. 19C is a schematic cross-sectional view along a line C-C' in FIG. 18, and FIG. 19D is a schematic cross-sectional view along a line D-D' in FIG. 18.

Figure 19D:
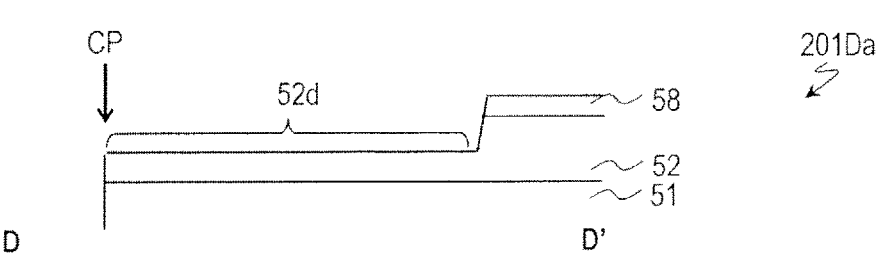

As illustrated in FIG. 18 and FIG. 19D, when viewed from the normal direction of the dielectric substrate 51, the end of the first insulating layer 52 of the slot substrate 201Da is aligned with the end of the dielectric substrate 51. However, similar to the slot substrate 201Ba, a portion of the slot substrate 201Da not including the slot electrode 55 includes a region (second region) in which a thickness of the first insulating layer 52 is less than a thickness of a portion of the first insulating layer 52 overlapping the slot electrode 55 and, when viewed from the normal direction of the second dielectric substrate 51, the second region includes the end of the second dielectric substrate 51. Reducing the thickness of the first insulating layer 52 reduces the stress at the edge of the first insulating layer 52 and, as a result, suppresses the peeling of the first insulating layer 52. Further, thinning the first insulating layer 52 on the end of the second dielectric substrate 51 corresponding to the cutting-plane line CP of the mother substrate 51' alleviates the compressive stress of the first insulating layer 52 at the interface with the second dielectric substrate 51 at a cutting location of the mother substrate serving as the start point where the peeling of the first insulating layer 52 occurs. Accordingly, by using the slot substrate 201Da, it is possible to improve the reliability of the scanning antenna.

Furthermore, the slot substrate 201Da differs from the slot substrate 201Ba in that, in the second region, the second dielectric substrate 51 is also exposed from the second insulating layer 58.

The end of the second insulating layer 58 is preferably aligned with the end of the thin portion 52d of the first insulating layer 52. In this case, as described below, the advantage is also achieved that the slot substrate 201Da can be manufactured with fewer manufacturing steps (number of photomasks, for example) compared to the slot substrate 201Ba.

The method for manufacturing the slot substrate 201Da will be described with reference to FIGS. 20A to 20G. FIGS. 20A to 20G are schematic cross-sectional views for describing the method for manufacturing the slot substrate 201Da. Each of these drawings illustrates the antenna unit region U (a cross section along a line A-A' in FIG. 18), the first terminal portion IT1 (a cross section along a line B-B' in FIG. 18), and a vicinity of the end of the dielectric substrate 51 (a cross section along a line D-D' in FIG. 18) of the slot substrate 201Da.

Figure 20A:
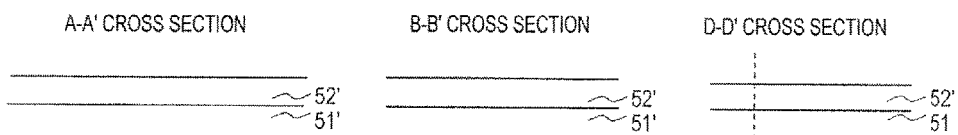

First, as illustrated in FIG. 20A, the first insulating film 52' is deposited on the first main surface of the mother substrate 51'.

Next, as illustrated in FIG. 20B, the metal film 55' is deposited on the first insulating film 52' by, for example, sputtering or vacuum deposition.

Figure 20C:

Next, the metal film 55' is patterned to form the slot electrode 55 including the plurality of slots 57, as illustrated in FIG. 20C.

Figure 20D:
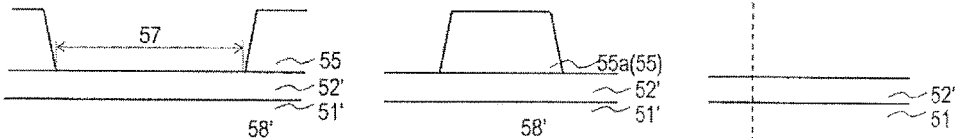

Subsequently, as illustrated in FIG. 20D, the second insulating film 58' is formed on the slot electrode 55 and within the slots 57.

Figure 20E:
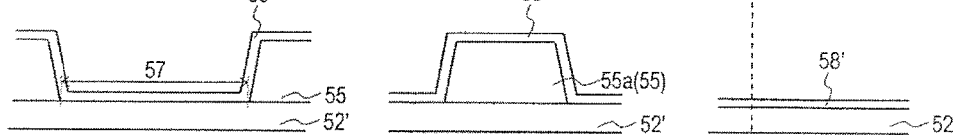

Subsequently, the first insulating film 52' and the second insulating film 58' are patterned to form the second insulating layer 58 including the opening 58a, as illustrated in FIG. 20E. At this time, the second insulating layer 58 is formed so that the second insulating layer 58 is not present above the location (cutting-plane line CP) where the mother substrate 51' is cut. Furthermore, the thin portion 52d is formed in the first insulating film 52' by etching and thus partially thinning the first insulating film 52'. The thin portion 52d is formed so as to be present on the cutting-plane line CP of the mother substrate 51'. A region in which the first insulating film 52' is thinned to form the thin portion 52d and a region (excluding the opening 58a) in which the second insulating film 58' is removed can be etched using the same photomask.

Figure 20F:
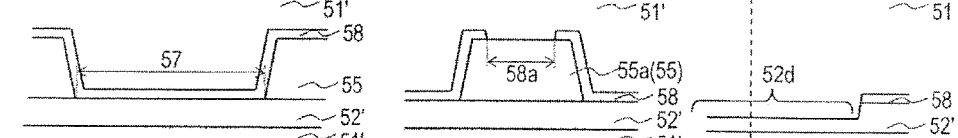

Next, as illustrated in FIG. 20F, the first upper conductive film 61' and the second upper conductive film 62' are formed in this order on the first insulating film 52', on the second insulating layer 58, and within the opening 58a.

Figure 20G:
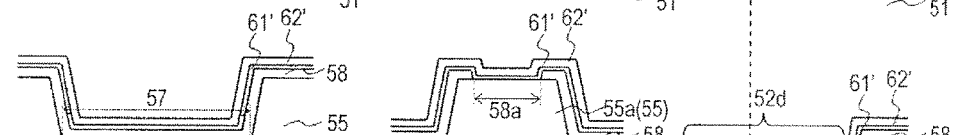

Subsequently, the first upper conductive film 61' and the second upper conductive film 62' are patterned to form the upper conductive layer 60 that has a layered structure including the first conductive layer 61 and the second conductive layer 62 and includes the upper connecting portion 60a, as illustrated in FIG. 20G.

Subsequently, the mother substrate 51' is cut at the cutting-plane line CP, thereby obtaining the slot substrate 201Ba. The first insulating film 52' is present on the cutting-plane line CP and thus the first insulating film 52' is also cut at the cutting-plane line CP. Accordingly, the first insulating layer 52 is obtained. The end of the dielectric substrate 51 and the end of the first insulating layer 52 are aligned. The thin portion 52d of the first insulating film 52' is present on the cutting-plane line CP, and thus the obtained first insulating layer 52 includes the thin portion 52d having a small thickness at an edge portion including the end. On the other hand, the second insulating layer 58 is not present on the cutting-plane line CP, and thus the second insulating layer 58 is not cut in this step. The end of the second insulating layer 58 and the end of the dielectric substrate 51 are not aligned.

In this manner, the slot substrate 201Da is manufactured.

Modification Example

Figure 21:
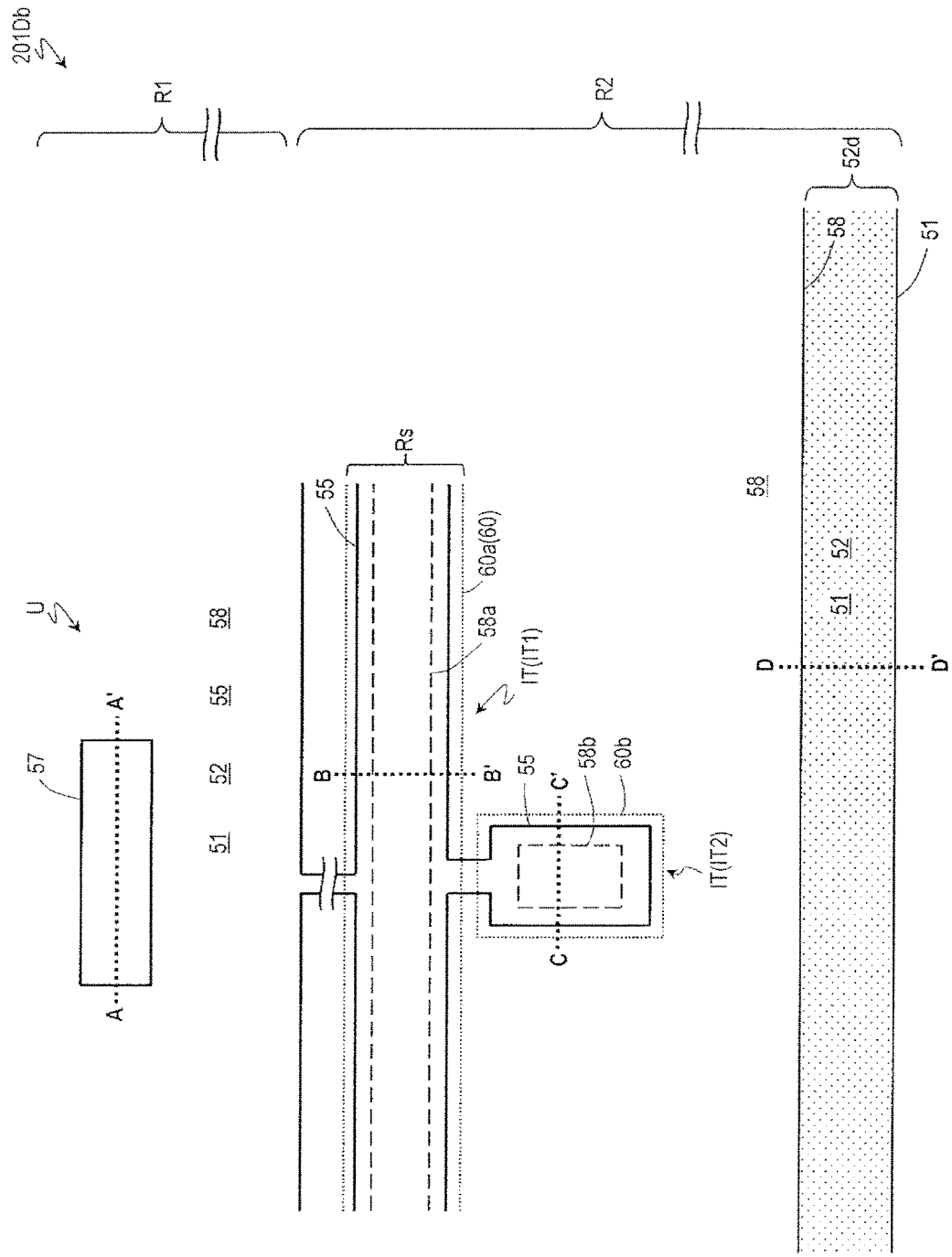
FIG. 21 is a schematic plan view of a slot substrate 201Db according to a modification example of Embodiment 1-4 of the disclosure.
Figure 22A:
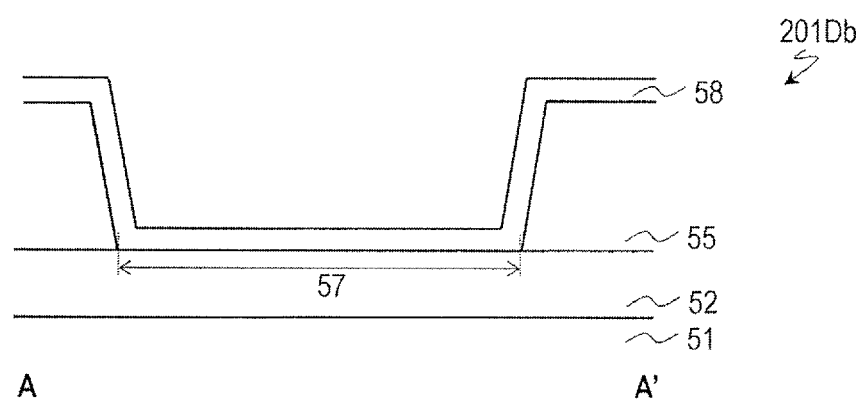
FIGS. 22A to 22D are schematic cross-sectional views of the slot substrate 201Db.
Figure 22B:
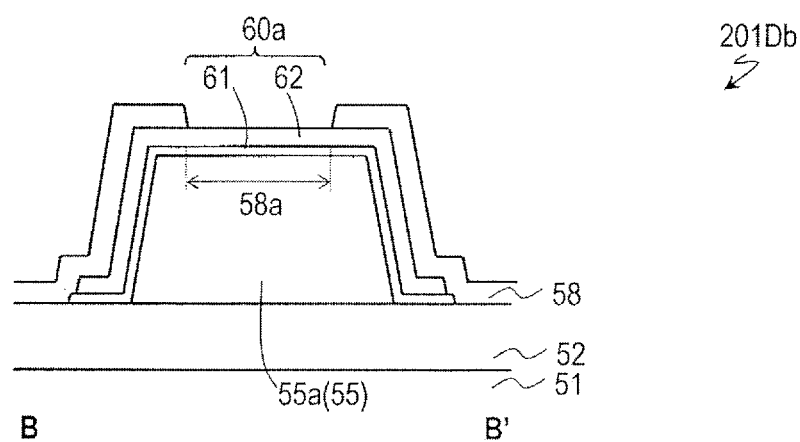
Figure 22C:
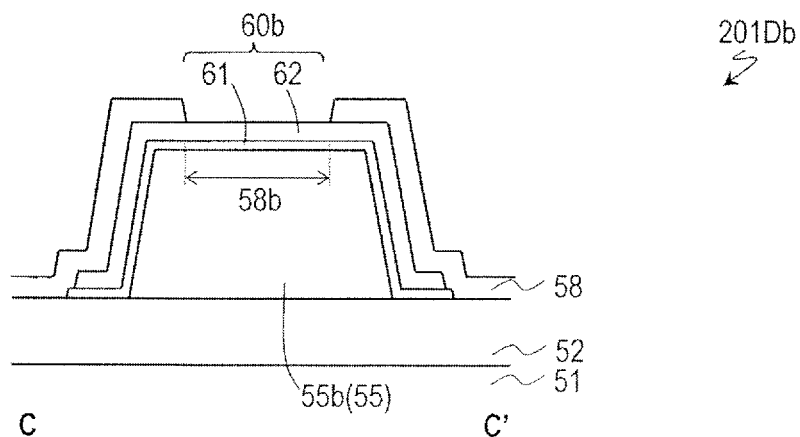
Figure 22D:
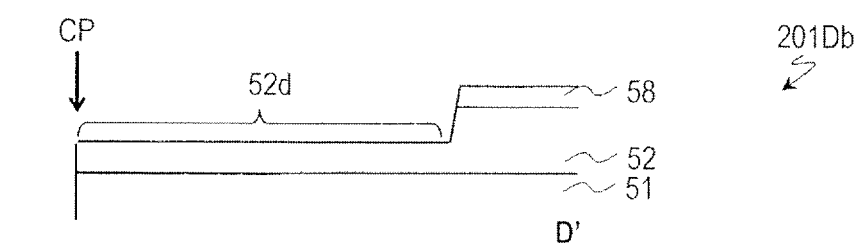

The structure of a slot substrate 201Db according to a modification example of Embodiment 1-4 of the disclosure will be described with reference to FIG. 21 and FIGS. 22A to 22D. FIG. 21 is a schematic plan view of the slot substrate 201Db, illustrating a schematic plan view of the antenna unit region U of the transmission and/or reception region R1 of the slot substrate 201Db, the non-transmission and/or reception region R2 of the slot substrate 201Db, and the region in the vicinity of an end of the slot substrate 201Db. FIG. 22A is a schematic cross-sectional view along a line A-A' in FIG. 21, FIG. 22B is a schematic cross-sectional view along a line B-B' in FIG. 21, and FIG. 22C is a schematic cross-sectional view along a line C-C' in FIG. 21, and FIG. 229 is a schematic cross-sectional view along a line D-D' in FIG. 21.

In the slot substrate 201Da illustrated in FIG. 18 and FIGS. 19A to 19D, the upper conductive layer 60 including the upper connecting portions 60a and 60b is disposed above the second insulating layer 58. In contrast, in the slot substrate 201Db illustrated in FIG. 22B and FIG. 22C, the upper conductive layer 60 including the upper connecting portions 60a and 60b is disposed between the second insulating layer 58 and the slot electrode 55. The first terminal portion IT1 of the slot substrate 201Db has the same structure as that of the slot substrate 201Cb illustrated in FIG. 15 and FIG. 16B.

Even in the slot substrate 201Db having such a structure, the same effects as those of the slot substrate 201Da can be obtained.

The method for manufacturing the slot substrate 201Db will be described with reference to FIGS. 23A to 23G. FIGS. 23A to 23G are schematic cross-sectional views for describing the method for manufacturing the slot substrate 201Db.

Each of these drawings illustrates the antenna unit region U (a cross section along a line A-A' in FIG. 21), the first terminal portion IT1 (a cross section along a line B-B' in FIG. 21), and a vicinity of the end of the dielectric substrate 51 (a cross section along a line D-D' in FIG. 21) of the slot substrate 201Db.

Figure 23A:
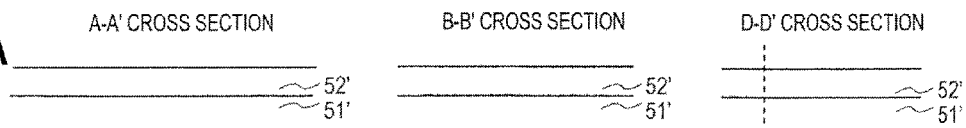
FIGS. 23A to 23G are schematic cross-sectional views for describing a method for manufacturing the slot substrate 201Db.

First, as illustrated in FIG. 23A, the first insulating film 52' is deposited on the first main surface of the mother substrate 51'.

Figure 23B:
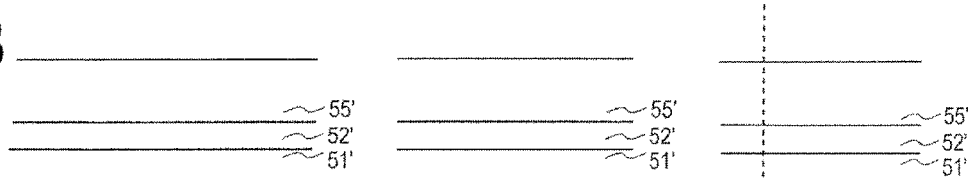

Next, as illustrated in FIG. 23B, the metal film 55' is deposited on the first insulating film 52' by, for example, sputtering or vacuum deposition.

Figure 23C:
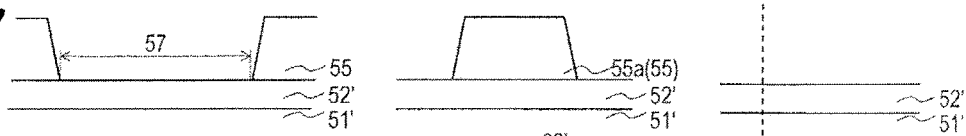

Next, the metal film 55' is patterned to form the slot electrode 55 including the plurality of slots 57, as illustrated in FIG. 23C.

Figure 23D:
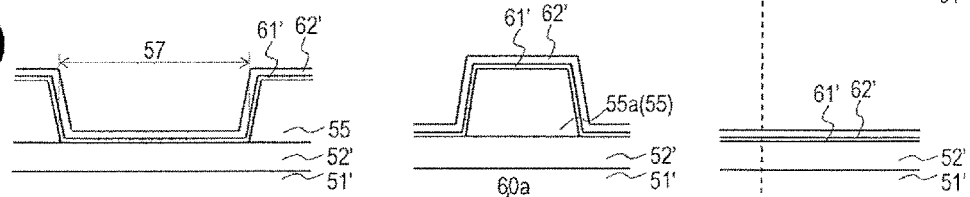

Subsequently, as illustrated in FIG. 23D, the first upper conductive film 61' and the second upper conductive film 62' are formed in this order on the slot electrode 55 and within the slots 57.

Figure 23E:
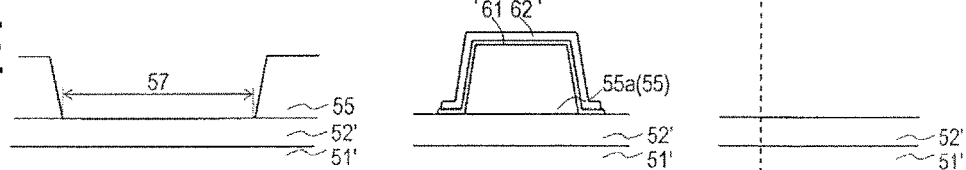

Subsequently, the first upper conductive film 61' and the second upper conductive film 62' are patterned to form the upper conductive layer 60 that has a layered structure including the first conductive layer 61 and the second conductive layer 62 and includes the upper connecting portion 60a, as illustrated in FIG. 23E.

Figure 23F:
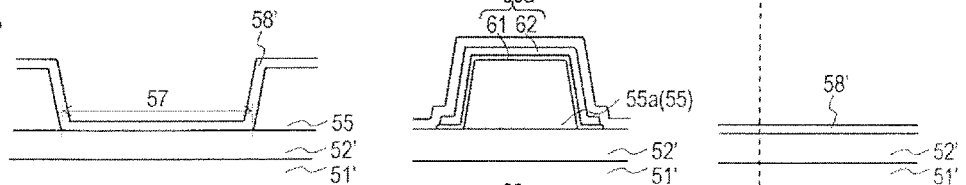

Subsequently, as illustrated in FIG. 23F, the second insulating film 58' is formed on the slot electrode 55, within the slots 57, and on the upper conductive layer 60.

Figure 23G:
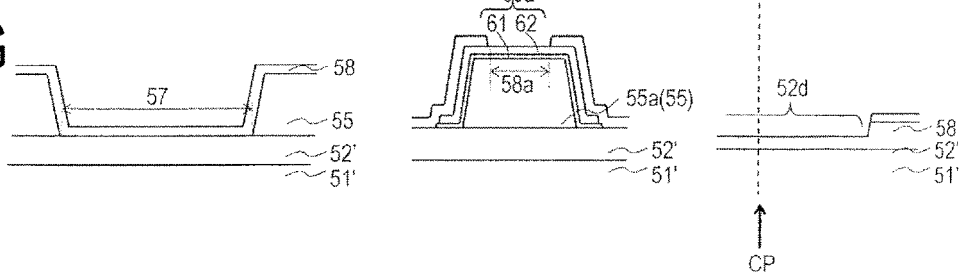

Subsequently, the first insulating film 52' and the second insulating film 58' are patterned to form the thin portion 52d in the first insulating film 52' and form the second insulating layer 58, as illustrated in FIG. 23G. The second insulating layer 58 includes the opening 58a. At this time, the first insulating film 52' and the second insulating layer 58 are formed so that the thin portion 52d of the first insulating film 52' is present and the second insulating layer 58 is not present above the location (cutting-plane line CP) where the mother substrate 51' is cut.

Subsequently, the mother substrate 51' is cut at the cutting-plane line CP, thereby obtaining the dielectric substrate 51. The first insulating film 52' is present on the cutting-plane line CP, and thus the first insulating film 52' is also cut at the cutting-plane line CP, thereby obtaining the first insulating layer 52.

In this manner, the slot substrate 201Db is manufactured.

Embodiment 2-1

Embodiments 2-1 to 2-4 illustrated below correspond to embodiments in which the planar shape of the first insulating layer 52 (the shape when viewed from the normal direction of the dielectric substrate 51) or the planar shape of the thin portion 52d of the first insulating layer 52 (the shape when viewed from the normal direction of the dielectric substrate 51) is change from that of previous Embodiments 1-1 to 1-4. In the examples illustrated below as well, when viewed from the normal direction of the dielectric substrate 51, the portion of the slot substrate not including the slot electrode 55 includes the first region and/or the second region, and the first region or the second region includes at least a portion of the end of the dielectric substrate 51. Accordingly, effects similar to those of the previous embodiments can be obtained. That is, the peeling of the first insulating layer 52 is suppressed, thereby improving the reliability of the scanning antenna.

Figure 24:
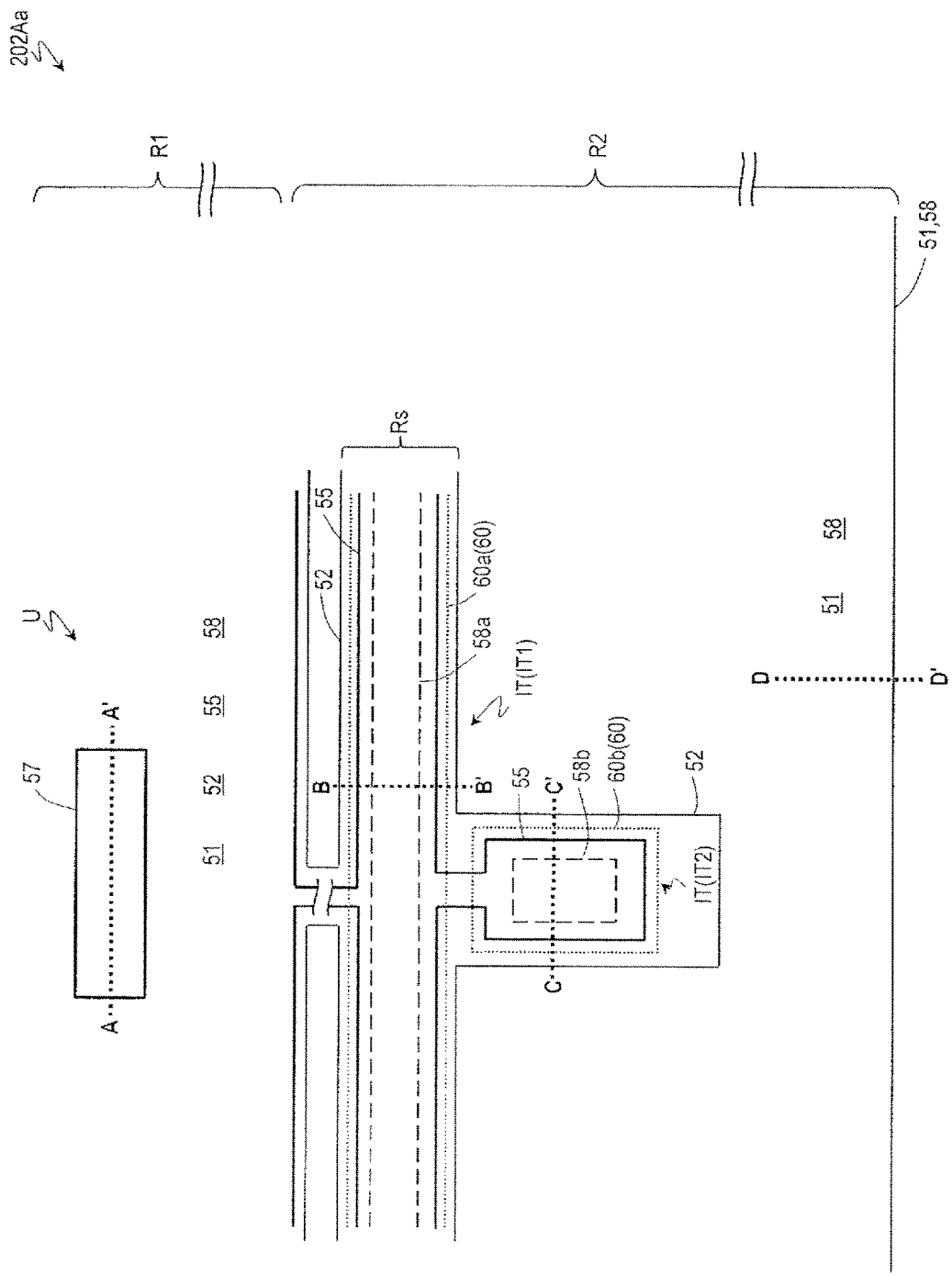
FIG. 24 is a schematic plan view of a slot substrate 202Aa according to Embodiment 2-1 of the disclosure.
Figure 25A:
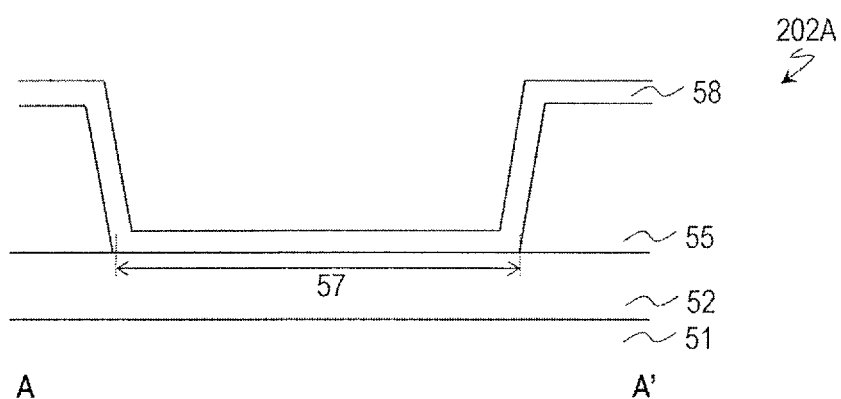
FIGS. 25A to 25D are schematic cross-sectional views of the slot substrate 202Aa.
Figure 25B:
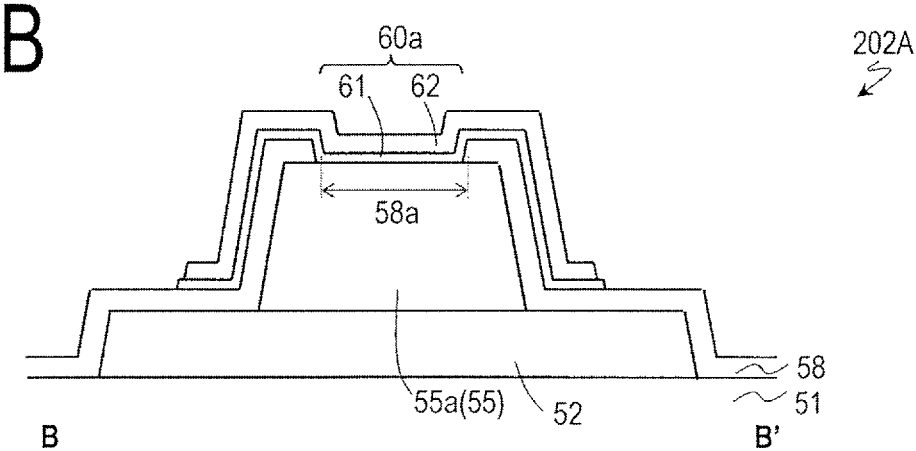
Figure 25C:
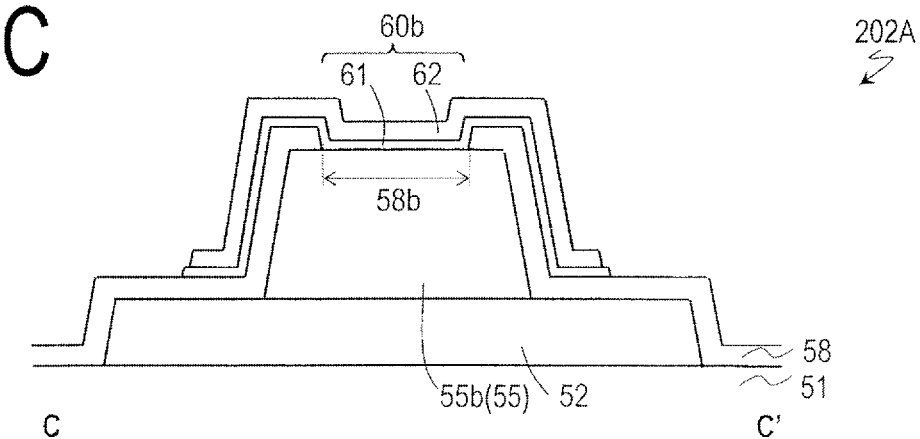
Figure 25D:
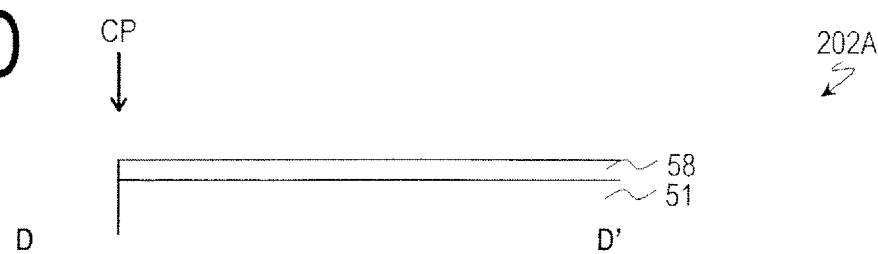

The structure of a slot substrate 202Aa according to Embodiment 2-1 of the disclosure will be described with reference to FIG. 24 and FIGS. 25A to 25D. FIG. 24 is a schematic plan view of the slot substrate 202Aa, illustrating a schematic plan view of the antenna unit region U of the transmission and/or reception region R1 of the slot substrate 202Aa, the non-transmission and/or reception region R2 of the slot substrate 202Aa, and the region in the vicinity of an end of the slot substrate 202Aa. FIG. 25A is a schematic cross-sectional view along a line A-A' in FIG. 24, FIG. 25B is a schematic cross-sectional view along a line B-B' in FIG. 24, and FIG. 25C is a schematic cross-sectional view along a line C-C' in FIG. 24, and FIG. 25D is a schematic cross-sectional view along a line D-D' in FIG. 24.

As illustrated in FIG. 24, the slot substrate 202Aa differs from the slot substrate 201Aa according to Embodiment 1-1 in the planar shape of the first insulating layer 52. An area of a region (first region) of a portion of the slot substrate 202Aa not including the slot electrode 55 where the second dielectric substrate 51 is exposed from the first insulating layer 52 is larger than that of the slot substrate 201Aa. Of the non-transmission and/or reception region R2 of the slot substrate 202Aa, the portion of the first insulating layer 52 not including the slot electrode 55 or the upper conductive layer 60 is removed to the extent possible. That is, the first region of the slot substrate 202Aa is formed in the portion of the non-transmission and/or reception region R2 of the slot substrate 202Aa not including the slot electrode 55 or the upper conductive layer 60, as wide as possible. In the slot substrate 202Aa, the area of the region of the first insulating layer 52 where the slot electrode 55 is not present on the first insulating layer 52 is small compared to that of the slot substrate 201Aa, and thus the effect of suppressing the of the first insulating layer 52 from the dielectric substrate 51 is significant. By using the slot substrate 202Aa, it is possible to improve the reliability of the scanning antenna.

Embodiment 2-2

Figure 26:
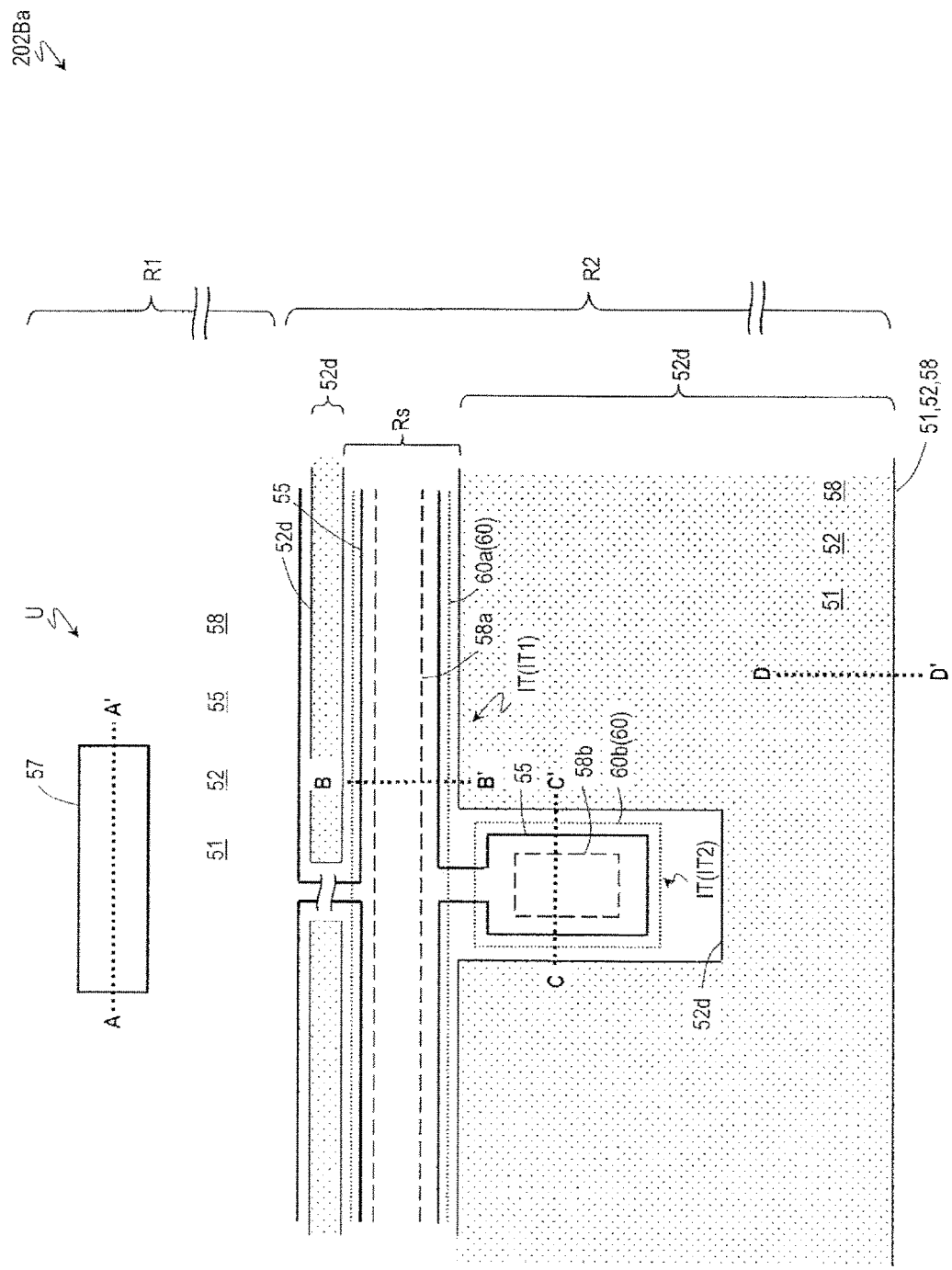
FIG. 26 is a schematic plan view of a slot substrate 202Ba according to Embodiment 2-2 of the disclosure.
Figure 27A:
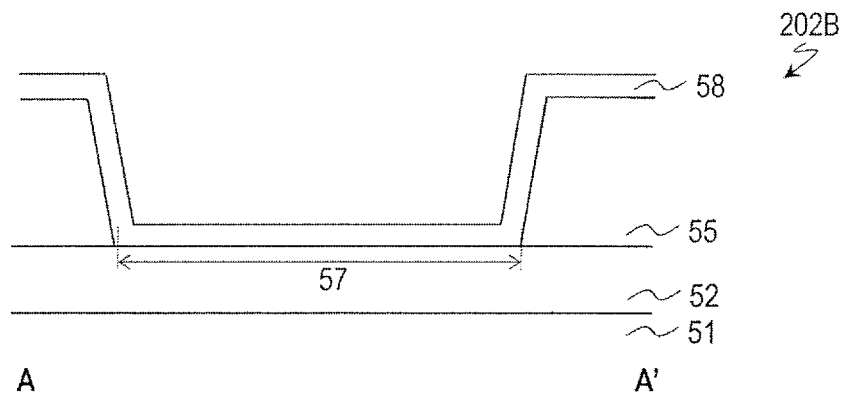
FIGS. 27A to 27D are schematic cross-sectional views of the slot substrate 202Ba.
Figure 27B:
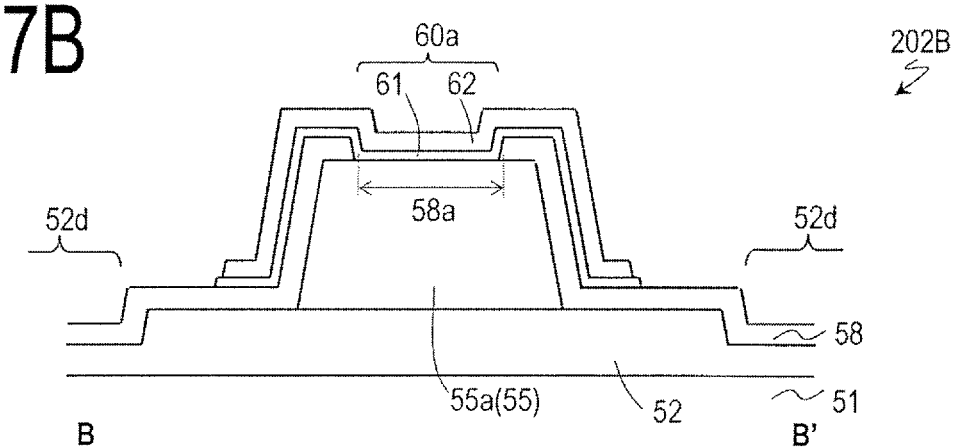
Figure 27C:
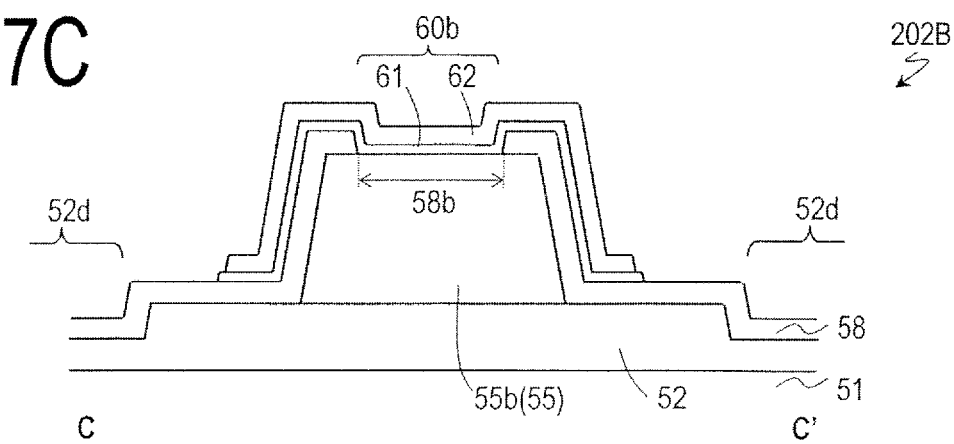
Figure 27D:
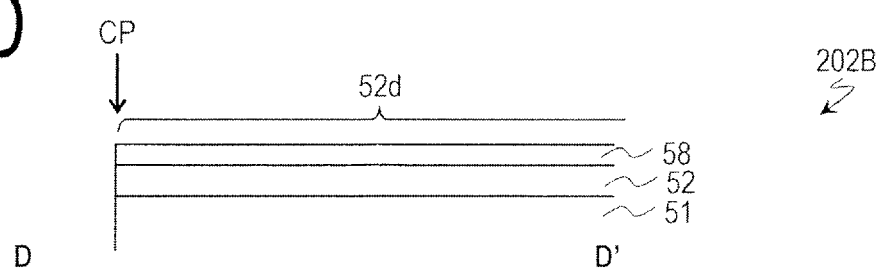

The structure of the slot substrate 202Ba according to Embodiment 2-2 of the disclosure will be described with reference to FIG. 26 and FIGS. 27A to 27D. FIG. 26 is a schematic plan view of the slot substrate 202Ba, illustrating schematic plan views of the antenna unit region U of the transmission and/or reception region R1 of the slot substrate 202Ba, the non-transmission and/or reception region R2 of the slot substrate 202Ba, and the region in the vicinity of an end of the slot substrate 202Ba. FIG. 27A is a schematic cross-sectional view along line A-A' in FIG. 26, FIG. 27B is a schematic cross-sectional view along line B-B' in FIG. 26, FIG. 27C is a schematic cross-sectional view along line C-C' in FIG. 26, and FIG. 27D is a schematic cross-sectional view along line D-D in FIG. 26.

As illustrated in FIG. 26, the slot substrate 202Ba differs from the slot substrate 201Ba according to Embodiment 1-2 in the planar shape of the thin portion 52d of the first insulating layer 52. An area of a region (second region) of a portion of the slot substrate 202Ba not including the slot electrode 55, where the thickness of the first insulating layer 52 is smaller than the thickness of the first insulating layer 52 overlapping the slot substrate 55, is greater than that of the slot substrate 201Ba. The planar shape of the second region of the slot substrate 202Ba is the same as the planar shape of the first region of the slot substrate 202Aa according to Embodiment 2-1. In the slot substrate 202Ba, the area of the second region is large compared to that of the slot substrate 201Ba, and thus the effect of suppressing the peeling of the first insulating layer 52 from the dielectric substrate 51 is significant.

Embodiment 2-3

Figure 28:
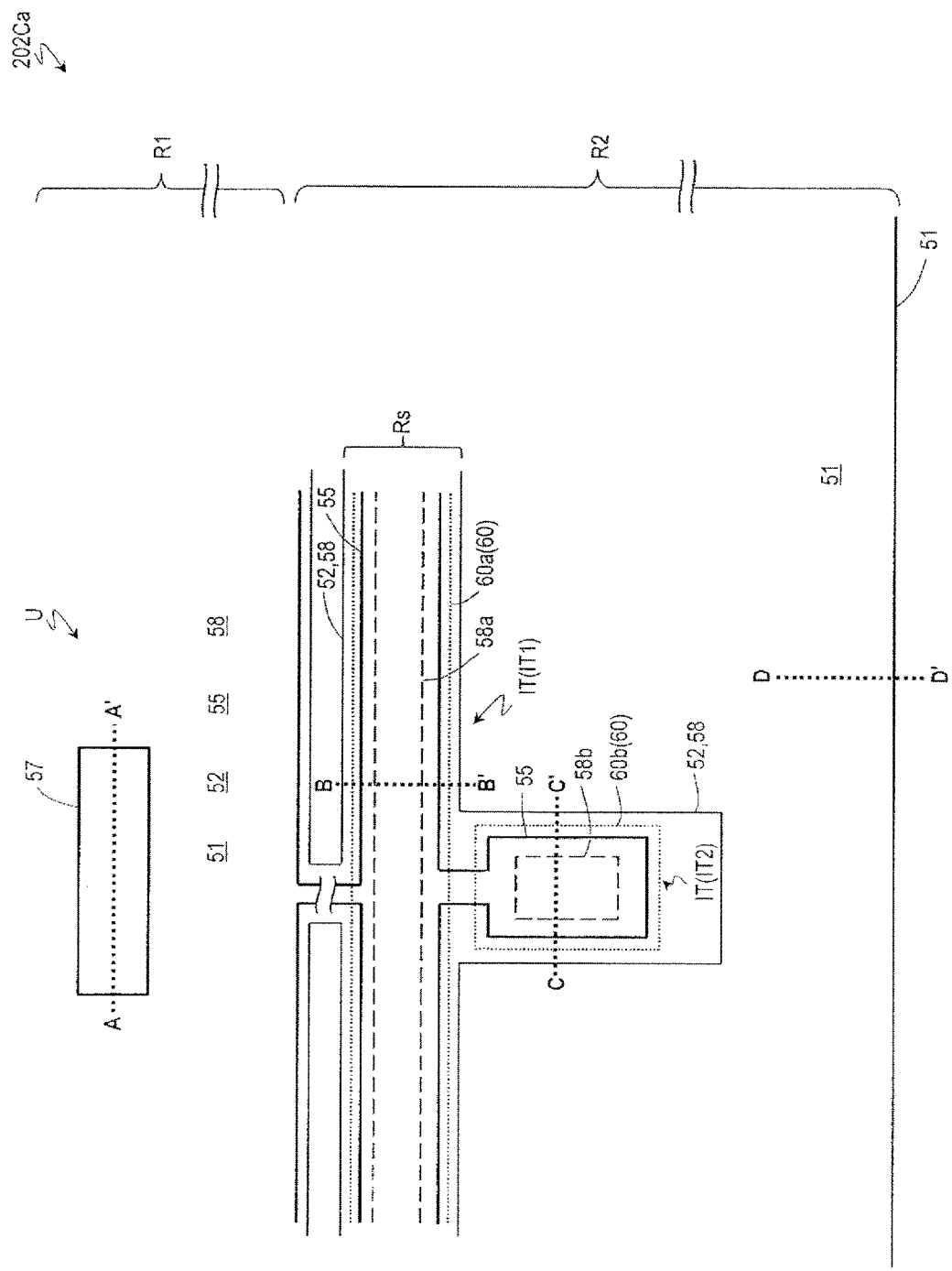
FIG. 28 is a schematic plan view of a slot substrate 202Ca according to Embodiment 2-3 of the disclosure.
Figure 29A:
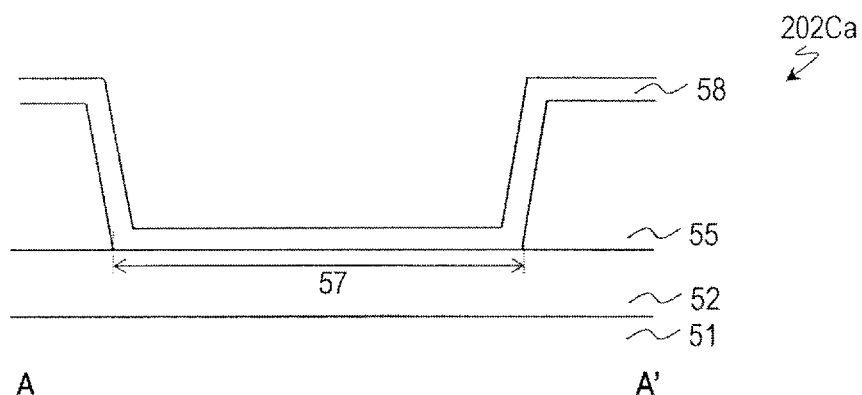
FIGS. 29A to 29D are schematic cross-sectional views of the slot substrate 202Ca.
Figure 29B:
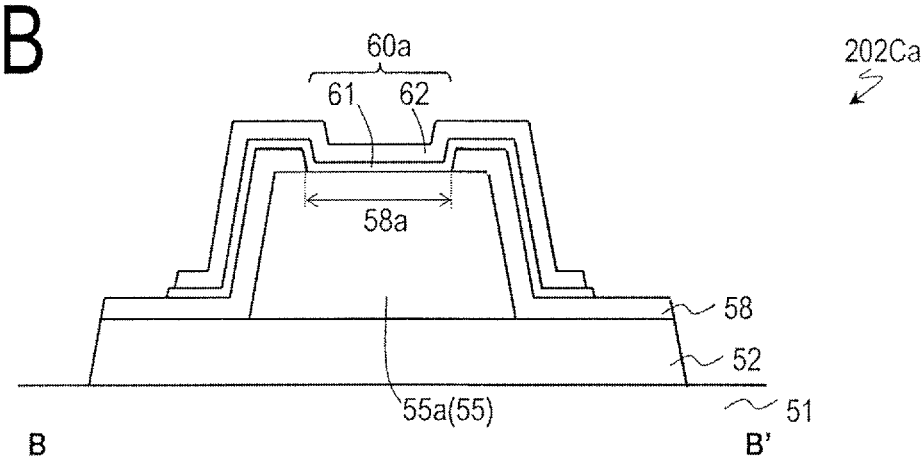
Figure 29C:
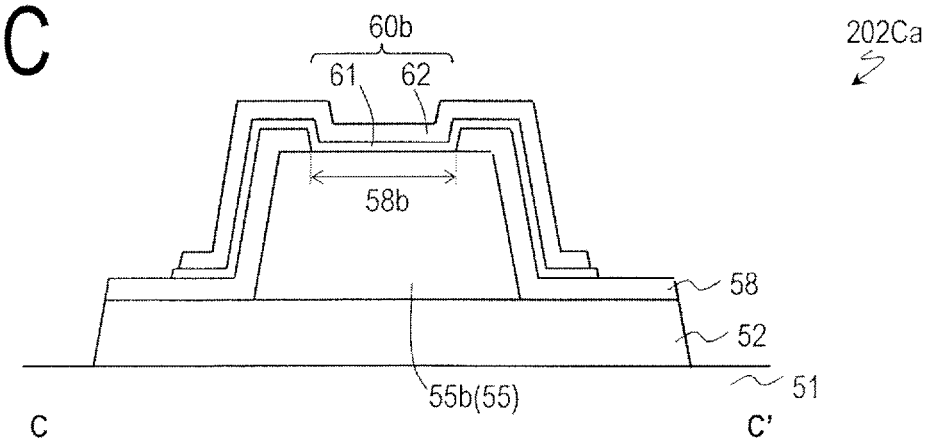
Figure 29D:
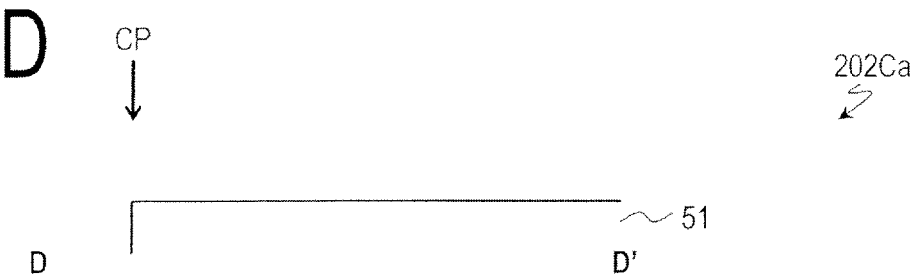

The structure of a slot substrate 202Ca according to Embodiment 2-3 of the disclosure will be described with reference to FIG. 28 and FIGS. 29A to 29D. FIG. 28 is a schematic plan view of the slot substrate 202Ca, illustrating a schematic plan view of the antenna unit region U of the transmission and/or reception region R1 of the slot substrate 202Ca, the non-transmission and/or reception region R2 of the slot substrate 202Ca, and the region in the vicinity of an end of the slot substrate 202Ca. FIG. 29A is a schematic cross-sectional view along a line A-A' in FIG. 28, FIG. 29B is a schematic cross-sectional view along a line B-B' in FIG. 28, and FIG. 29C is a schematic cross-sectional view along a line C-C' in FIG. 28, and FIG. 29D is a schematic cross-sectional view along a line D-D' in FIG. 28.

As illustrated in FIG. 28, the slot substrate 202Ca differs from the slot substrate 201Ca according to Embodiment 1-3 in the planar shape of the first insulating layer 52 and the planar shape of the second insulating layer 58. The planar shape of the first region of the slot substrate 202Ca is the same as the planar shape of the first region of the slot substrate 202Aa according to Embodiment 2-1. The slot substrate 202Ca differs from the slot substrate 202Aa in that, in the first region, the second dielectric substrate 51 is also exposed from the second insulating layer 58. In this example, the end of the second insulating layer 58 is aligned with the end of the first insulating layer 52.

Modification Example

Figure 30A:
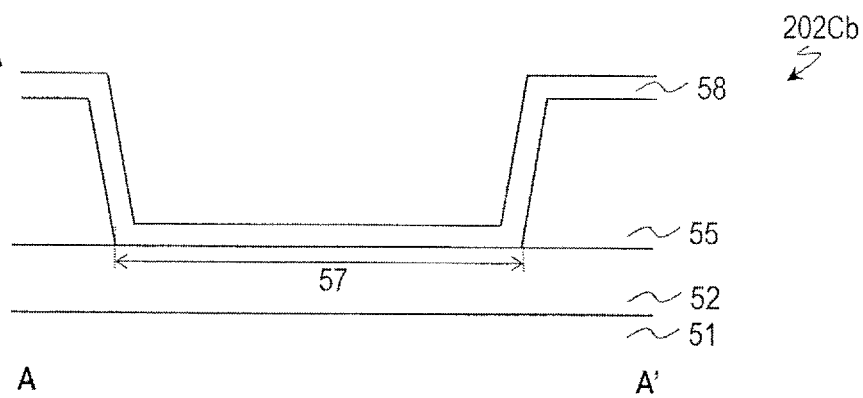
FIGS. 30A to 30D are schematic cross-sectional views of a slot substrate 202Cb according to a modification example of Embodiment 2-3 of the disclosure.

The structure of a slot substrate 202Cb according to a modification example of Embodiment 2-3 of the disclosure will be described with reference to FIGS. 30A to 30D. The plan view of the slot substrate 202Cb is the same as the plan view of the slot substrate 202Ca illustrated in FIG. 28, and thus the illustration thereof is omitted. FIG. 30A is a schematic cross-sectional view along a line A-A' in FIG. 28, FIG. 30B is a schematic cross-sectional view along a line B-B' in FIG. 28, and FIG. 30C is a schematic cross-sectional view along a line C-C' in FIG. 28, and FIG. 30D is a schematic cross-sectional view along a line D-D' in FIG. 28.

Figure 30B:
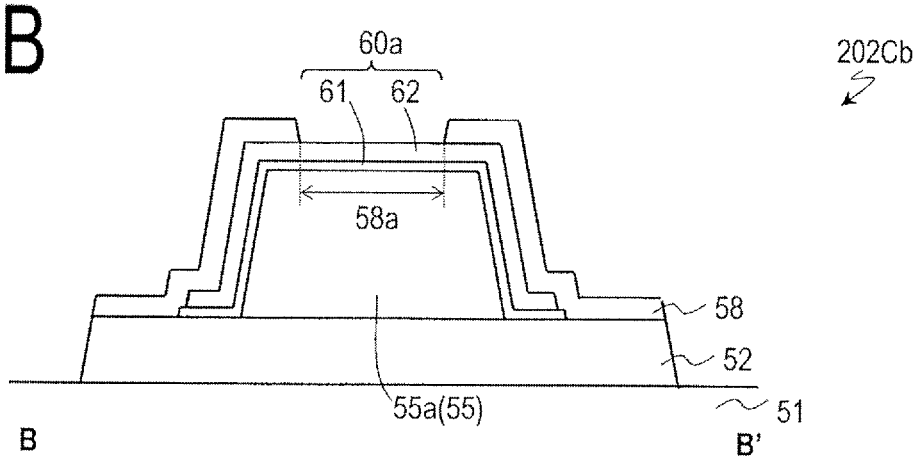
Figure 30C:
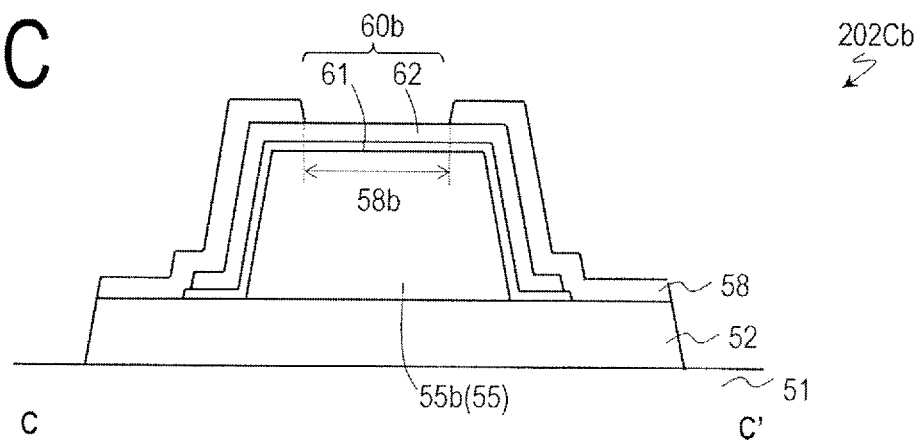
Figure 30D:
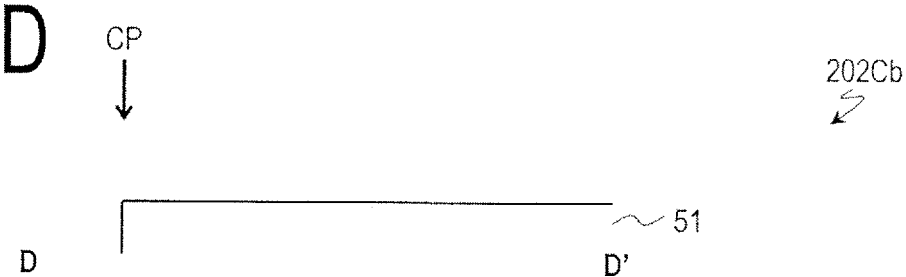

In the slot substrate 202Cb, as illustrated in FIG. 30B and FIG. 30C, the upper conductive layer 60 including the upper connecting portions 60a and 60b is disposed between the second insulating layer 58 and the slot electrode 55.

In the slot substrate 202Cb having such a structure as well, the same effects as those of the slot substrate 202Ca can be obtained.

Embodiment 2-4

Figure 31:
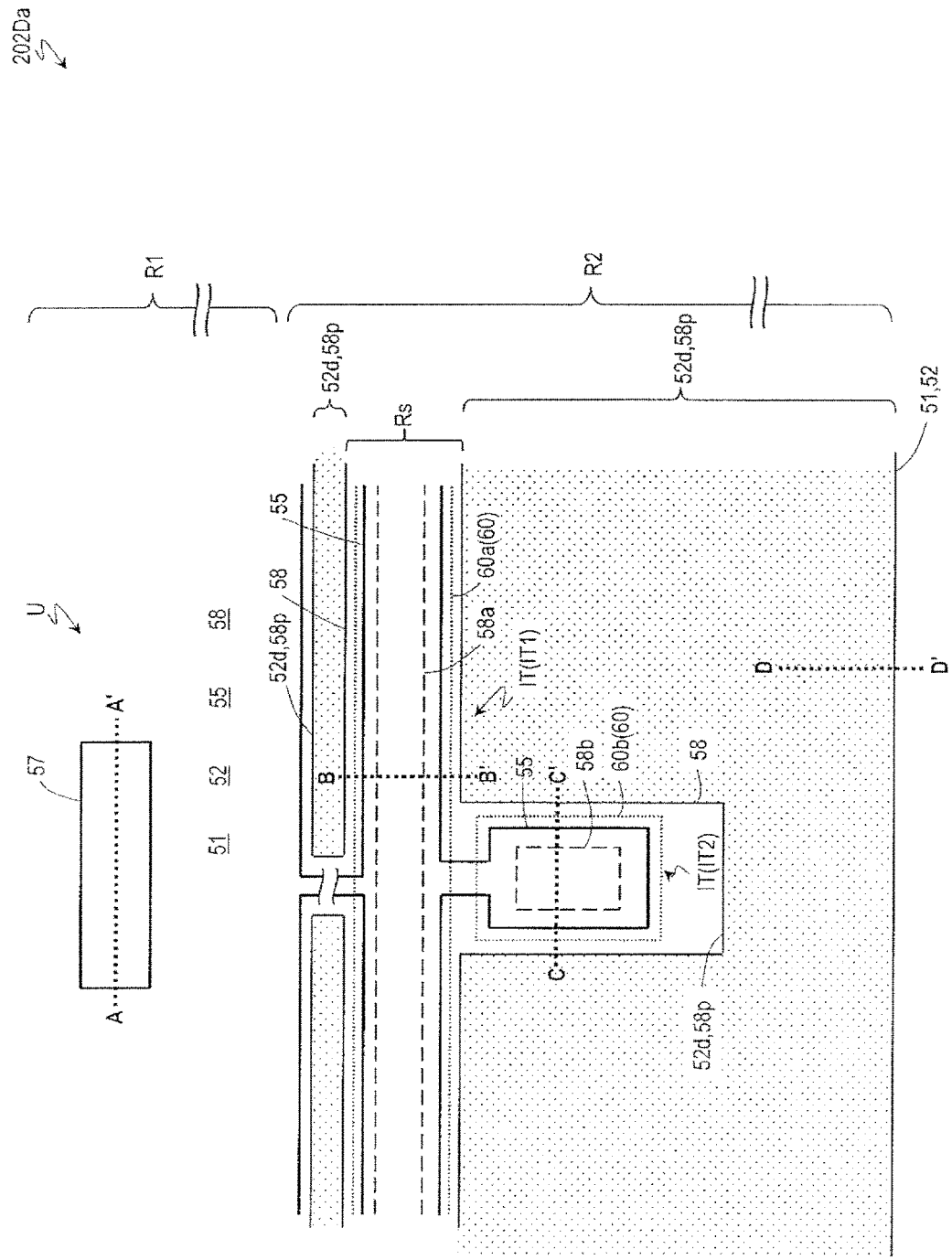
FIG. 31 is a schematic plan view of a slot substrate 202Da according to Embodiment 2-4 of the disclosure.
Figure 32A:
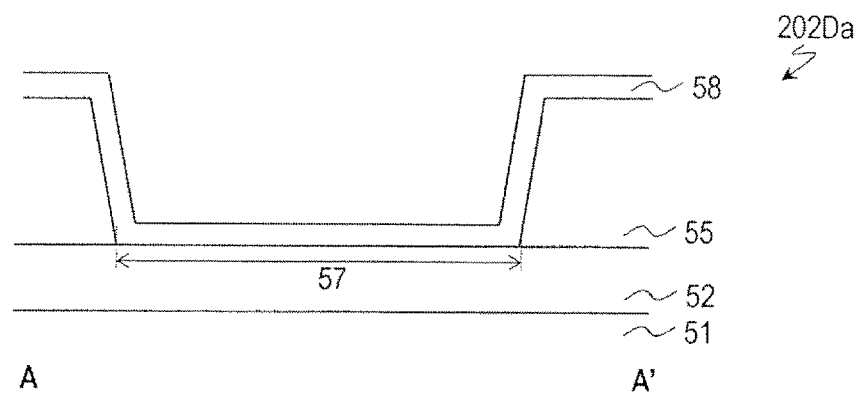
FIGS. 32A to 32D are schematic cross-sectional views of the slot substrate 202Da.
Figure 32B:
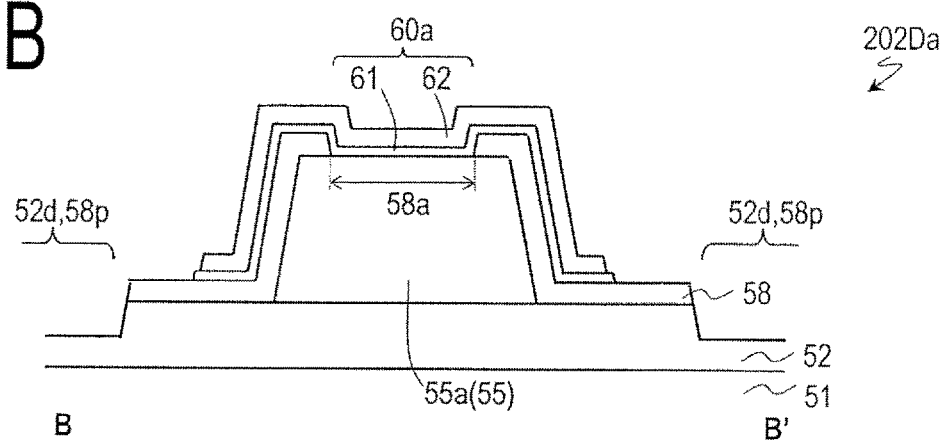
Figure 32C:
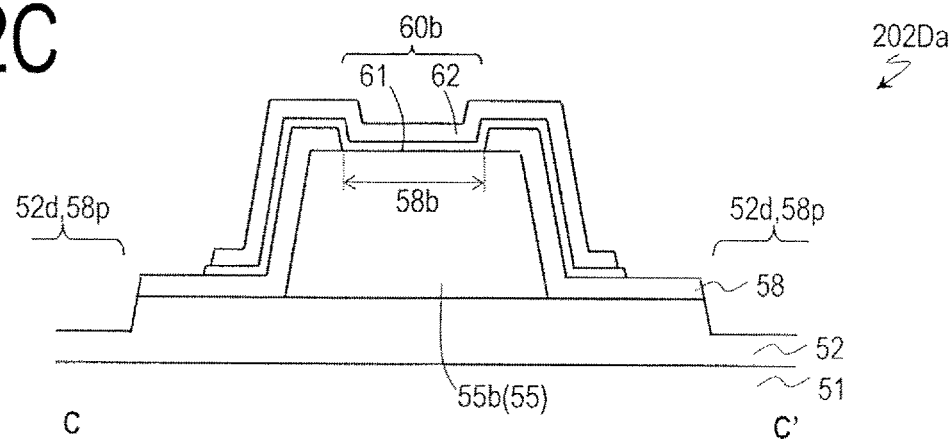
Figure 32D:
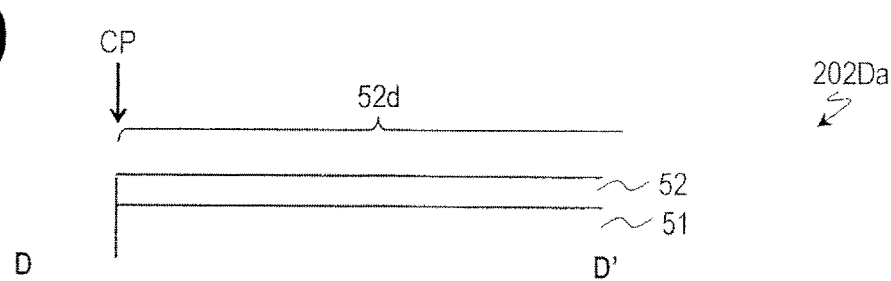

The structure of a slot substrate 202Da according to Embodiment 2-4 of the disclosure will be described with reference to FIG. 31 and FIGS. 32A to 32D. FIG. 31 is a schematic plan view of the slot substrate 202Da, illustrating a schematic plan view of the antenna unit region U of the transmission and/or reception region Si of the slot substrate 202Da, the non-transmission and/of reception region R2 of the slot substrate 202Da, and the region in the vicinity of an end of the slot substrate 202Da. FIG. 32A is a schematic cross-sectional view along a line A-A' in FIG. 31, FIG. 32B is a schematic cross-sectional view along a line B-B' in FIG. 31, and FIG. 32C is a schematic cross-sectional view along a line C-C' in FIG. 31, and FIG. 32D is a schematic cross-sectional view along a line D-D' in FIG. 31.

As illustrated in FIG. 31, the slot substrate 202Da differs from the slot substrate 201Da according to Embodiment 1-4 in the planar shape of the first insulating layer 52 and the planar shape of the second insulating layer 58. The planar shape of the second region of the slot substrate 202Da is the same as the planar shape of the first region of the slot substrate 202Aa according to Embodiment 2-1, and is the same as the planar shape of the second region of the slot substrate 202Ba according to Embodiment 2-2. The slot substrate 202Da differs from the slot substrate 202Ba in that, in the second region, the second dielectric substrate 51 is also exposed from the second insulating layer 58. In this example, the end of the second insulating layer 58 is aligned with the end of the thin portion 52d of the first insulating layer 52. In the drawings, for clarity, a region of the slot substrate 202Da not including the second insulating layer 58 (excluding the openings 58a and 58b) is referred to as a region 58p. In this example, the planar shape of the thin portion 52d of the first insulating layer 52 and the planar shape of the region 58p match.

Embodiment 3-1

Embodiments 3-1 to 3-4 illustrated below correspond to embodiments in which the planar shape of the first insulating layer 52 (the shape when viewed from the normal direction of the dielectric substrate 51) or the planar shape of the thin portion 52d of the first insulating layer 52 (the shape when viewed from the normal direction of the dielectric substrate 51) is changed from that of previous Embodiments 1-1 to 1-4. In the examples illustrated below as well, when viewed from the normal direction of the dielectric substrate 51, the portion of the slot substrate not including the slot electrode 55 includes the first region and/or the second region, and the first region or the second region includes at least a portion of the end of the dielectric substrate 51. Accordingly, effects similar to those of the previous embodiments can be obtained. That is, the peeling of the first insulating layer 52 is suppressed, thereby improving the reliability of the scanning antenna.

Figure 33:
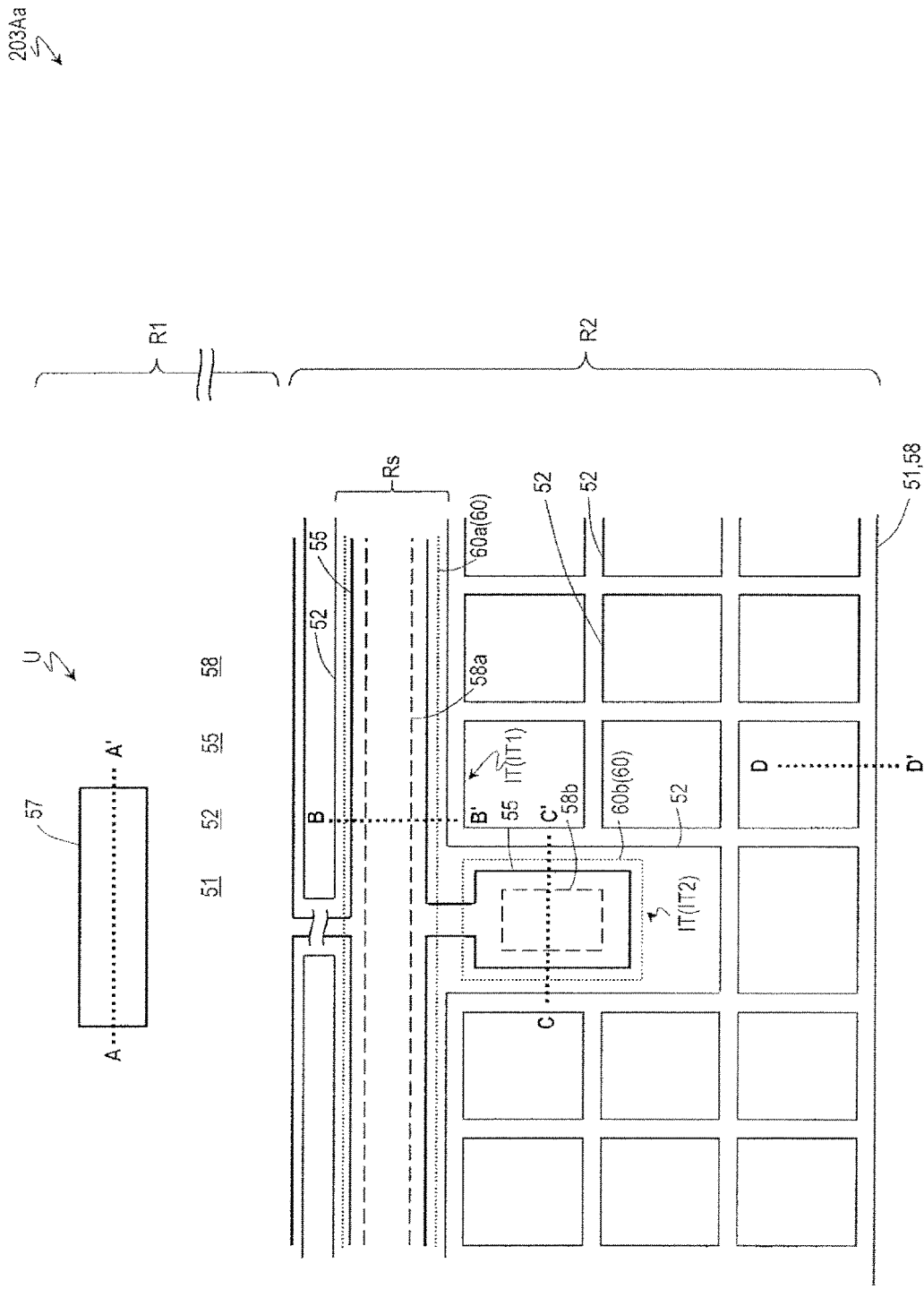
FIG. 33 is a schematic plan view of a slot substrate 203Aa according to Embodiment 3-1 of the disclosure.

The structure of a slot substrate 203Aa according to Embodiment 3-1 of the disclosure will be described with reference to FIG. 33. FIG. 33 is a schematic plan view of the slot substrate 203Aa, illustrating a schematic plan view of the antenna unit region U of the transmission and/or reception region R1 of the slot substrate 203Aa, the non-transmission and/or reception region R2 of the slot substrate 203Aa, and the region in the vicinity of an end of the slot substrate 203Aa.

As illustrated in FIG. 33, the slot substrate 203Aa differs from the slot substrate 201Aa according to Embodiment 1-1 in the planar shape of the first insulating layer 52. A region (first region) of a portion of the slot substrate 203Aa not including the slot electrode 55 where the second dielectric substrate 51 is exposed from the first insulating layer 52 has a lattice pattern. By forming the first region into a lattice pattern, the first insulating layer 52 includes a plurality of regions arranged in island shapes. By reducing the area of each region (island), it is possible to reduce the stress at the edge of the first insulating layer (each region) and thus suppress the peeling from the dielectric substrate 51.

Embodiment 3-2

Figure 34:
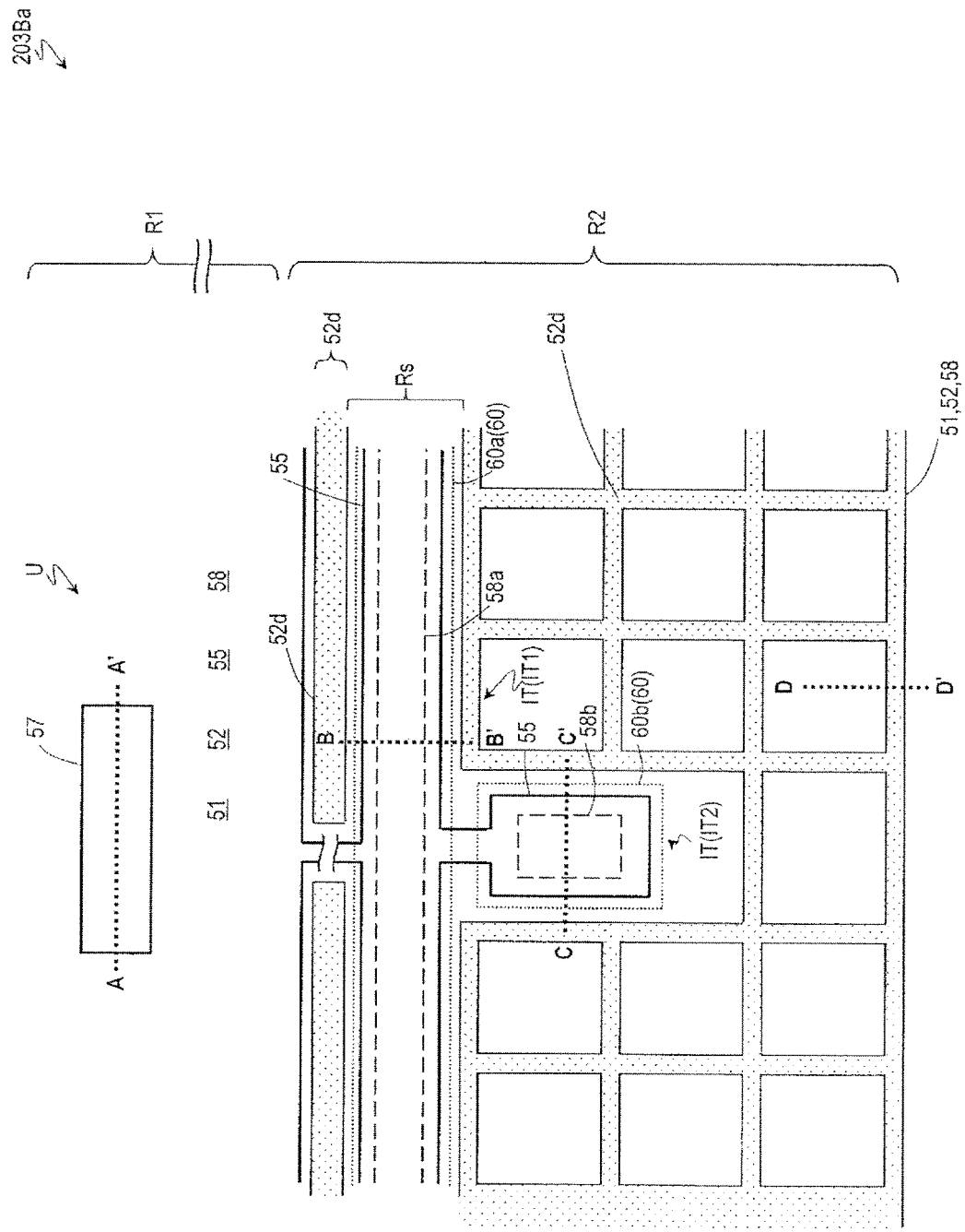
FIG. 34 is a schematic plan view of a slot substrate 203Ba according to Embodiment 3-2 of the disclosure.

The structure of a slot substrate 203Ba according to Embodiment 3-2 of the disclosure will be described with reference to FIG. 34. FIG. 34 is a schematic plan view of the slot substrate 203Ba, illustrating a schematic plan view of the antenna unit region U of the transmission and/or reception region R1 of the slot substrate 203Ba, the non-transmission and/or reception region R2 of the slot substrate 203Ba, and the region in the vicinity of an end of the slot substrate 203Ba.

As illustrated in FIG. 34, the slot substrate 203Ba differs from the slot substrate 201Ba according to Embodiment 1-2 in the planar shape of the thin portion 52d of the first insulating layer 52. The planar shape of the second region of the slot substrate 203Ba is the same as the planar shape of the first region of the slot substrate 203Aa according to Embodiment 3-1.

Embodiment 3-3

Figure 35:
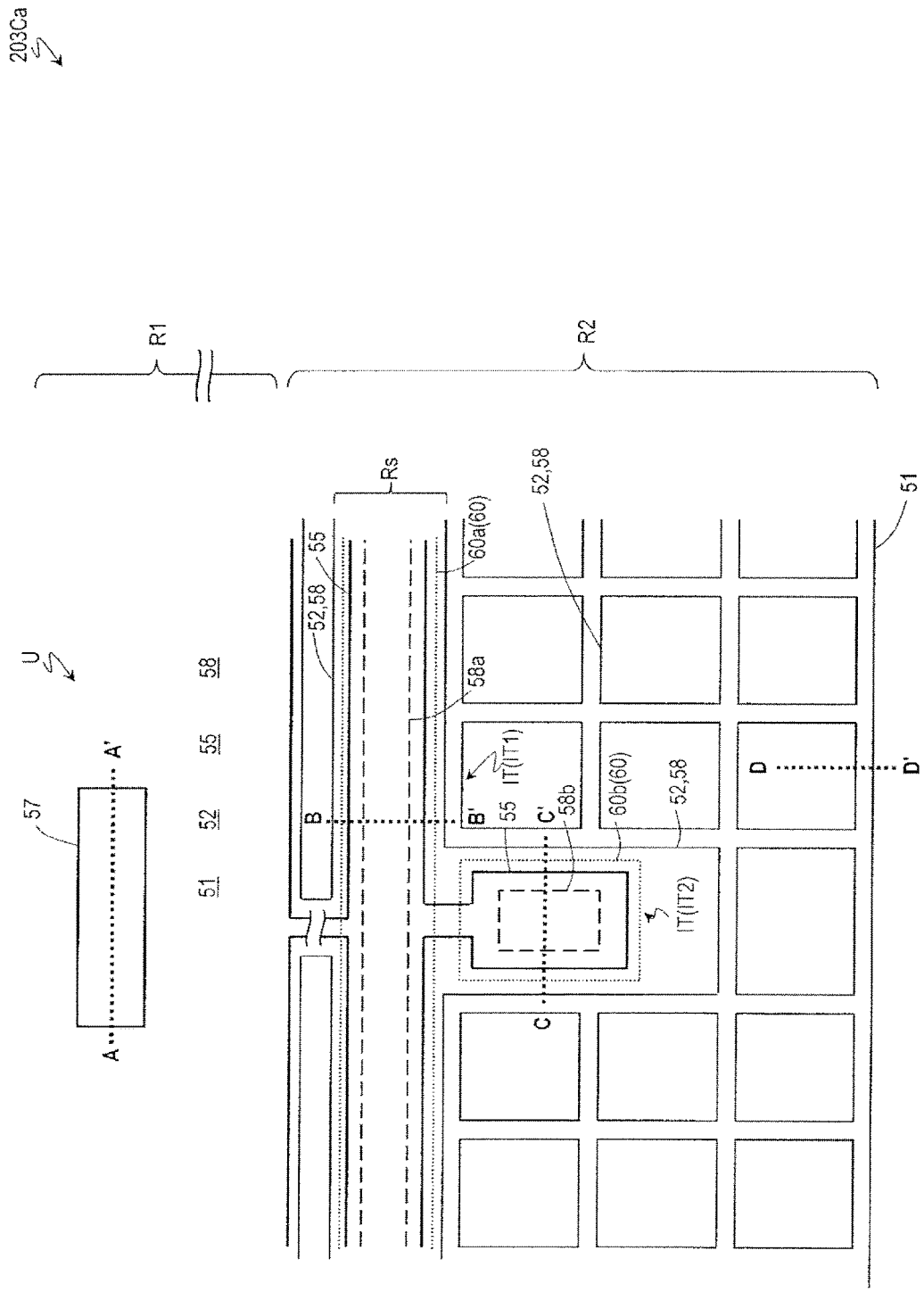
FIG. 35 is a schematic plan view of a slot substrate 203Ca according to Embodiment 3-3 of the disclosure.

The structure of a slot substrate 203Ca according to Embodiment 3-3 of the disclosure will be described with reference to FIG. 35. FIG. 35 is a schematic plan view of the slot substrate 203Ca, illustrating a schematic plan view of the antenna unit region U of the transmission and/or reception region R1 of the slot substrate 203Ca, the non-transmission and/or reception region R2 of the slot substrate 203Ca, and the region in the vicinity of an end of the slot substrate 203Ca.

As illustrated in FIG. 35, the slot substrate 203Ca differs from the slot substrate 201Ca according to Embodiment 1-3 in the planar shape of the first insulating layer 52 and the planar shape of the second insulating layer 58. The planar shape of the first region of the slot substrate 203Ca is the same as the planar shape of the first region of the slot substrate 203Aa according to Embodiment 3-1. The slot substrate 203Ca differs from the slot substrate 203Aa in that, in the first region, the second dielectric substrate 51 is also exposed from the second insulating layer 58. In this example, the end of the second insulating layer 58 is aligned with the end of the first insulating layer 52.

Embodiment 3-4

Figure 36:
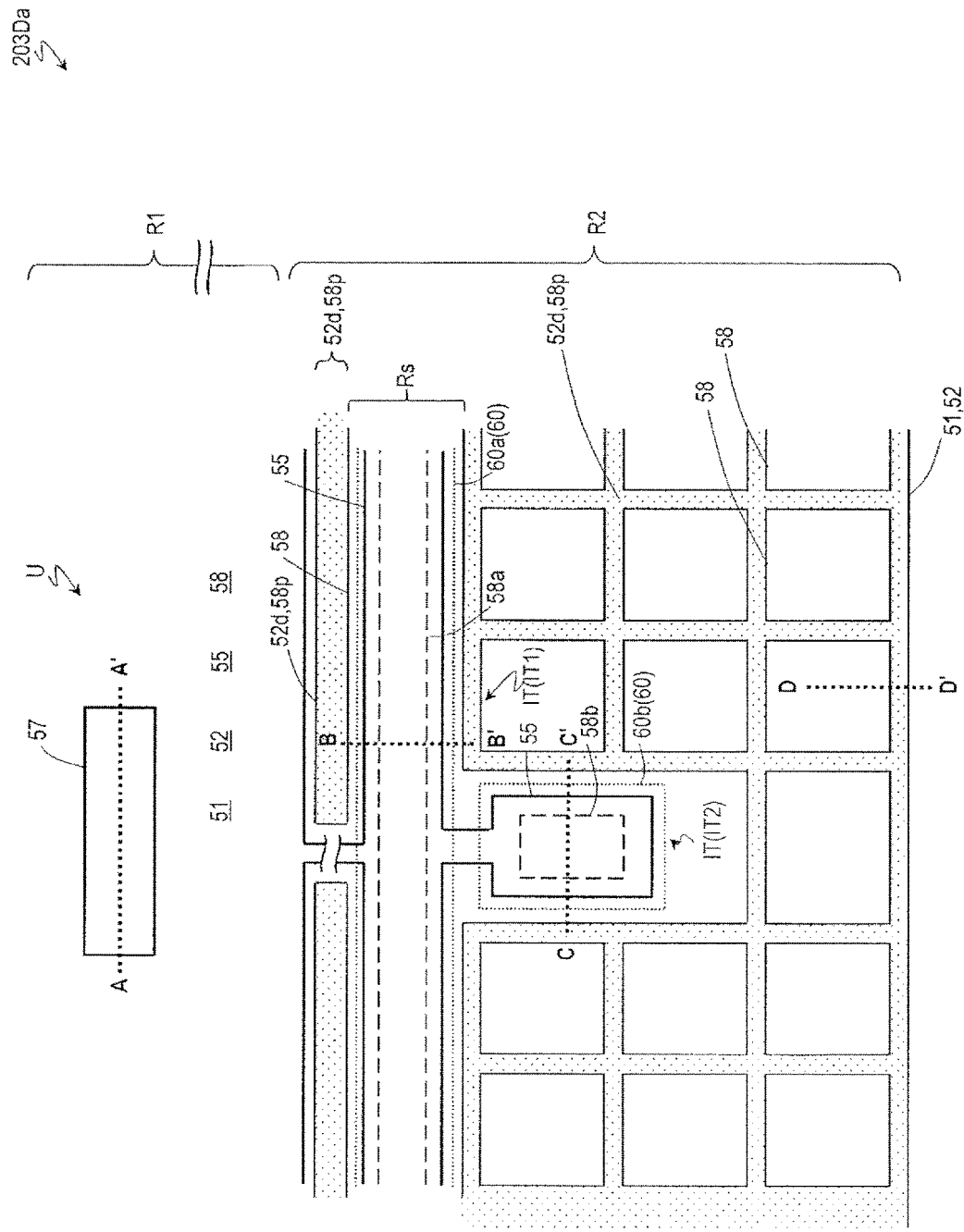
FIG. 36 is a schematic plan view of a slot substrate 203Da according to Embodiment 3-4 of the disclosure.

The structure of a slot substrate 203Da according to Embodiment 3-4 of the disclosure will be described with reference to FIG. 36. FIG. 36 is a schematic plan view of the slot substrate 203Da, illustrating schematic plan view of the antenna unit region U of the transmission and/or reception region R1 of the slot substrate 203Da, the non-transmission and/or reception region R2 of the slot substrate 203Da, and the region in the vicinity of an end of the slot substrate 203Da.

As illustrated in FIG. 36, the slot substrate 203Da differs from the slot substrate 201Da according to Embodiment 1-4 in the planar shape of the first insulating layer 52 and the planar shape of the second insulating layer 58. The planar shape of the second region of the slot substrate 203Da is the same as the planar shape of the first region of the slot substrate 203Aa according to Embodiment 3-1, and is the same as the planar shape of the second region of the slot substrate 203Ba according to Embodiment 3-2. The slot substrate 203Da differs from the slot substrate 203Ba in that, in the second region, the second dielectric substrate 51 is also exposed from the second insulating layer 58. In this example, the end of the second insulating layer 58 is aligned with the end of the thin portion 52d of the first insulating layer 52.

Embodiment 4-1

Embodiments 4-1 to 4-4 illustrated below correspond to embodiments in which the planar shape of the first insulating layer 52 (the shape when viewed from the normal direction of the dielectric substrate 51) or the planar shape of the thin portion 52d of the first insulating layer 52 (the shape when viewed from the normal direction of the dielectric substrate 51) is changed from that of the previous Embodiments 1-1 to 1-4. In the examples illustrated below as well, when viewed from the normal direction of the dielectric substrate 51, the portion of the slot substrate not including the slot electrode 55 includes the first region and/or the second region, and the first region or the second region includes at least a portion of the end of the dielectric substrate 51. Accordingly, effects similar to those of the previous embodiments can be obtained. That is, the peeling of the first insulating layer 52 is suppressed, thereby improving the reliability of the scanning antenna.

Figure 37:
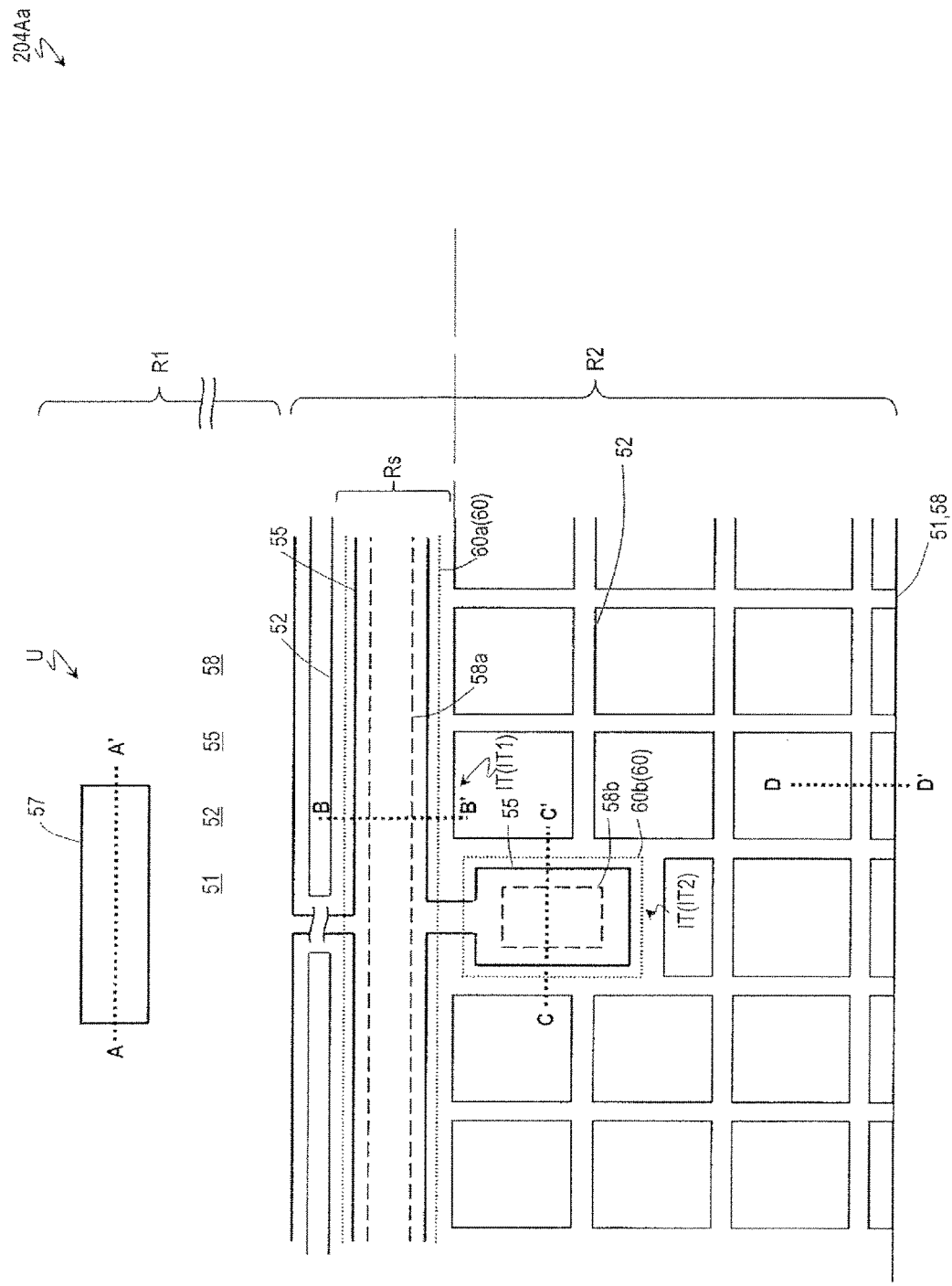
FIG. 37 is a schematic plan view of a slot substrate 204Aa according to Embodiment 4-1 of the disclosure.

The structure of a slot substrate 204Aa according to Embodiment 4-1 of the disclosure will be described with reference to FIG. 37. FIG. 37 is a schematic plan view of the slot substrate 204Aa, illustrating a schematic plan view of the antenna unit region U of the transmission and/or reception region R1 of the slot substrate 204Aa, the non-transmission and/or reception region R2 of the slot substrate 204Aa, and the region in the vicinity of an end of the slot substrate 204Aa.

As illustrated in FIG. 37, the slot substrate 204Aa differs from the slot substrate 201Aa according to Embodiment 1-1 in the planar shape of the first insulating layer 52. A region (first region) of a portion of the slot substrate 204Aa not including the slot electrode 55 where the second dielectric substrate 51 is exposed from the first insulating layer 52 includes a plurality of regions disposed in island shapes.

Embodiment 4-2

Figure 38:
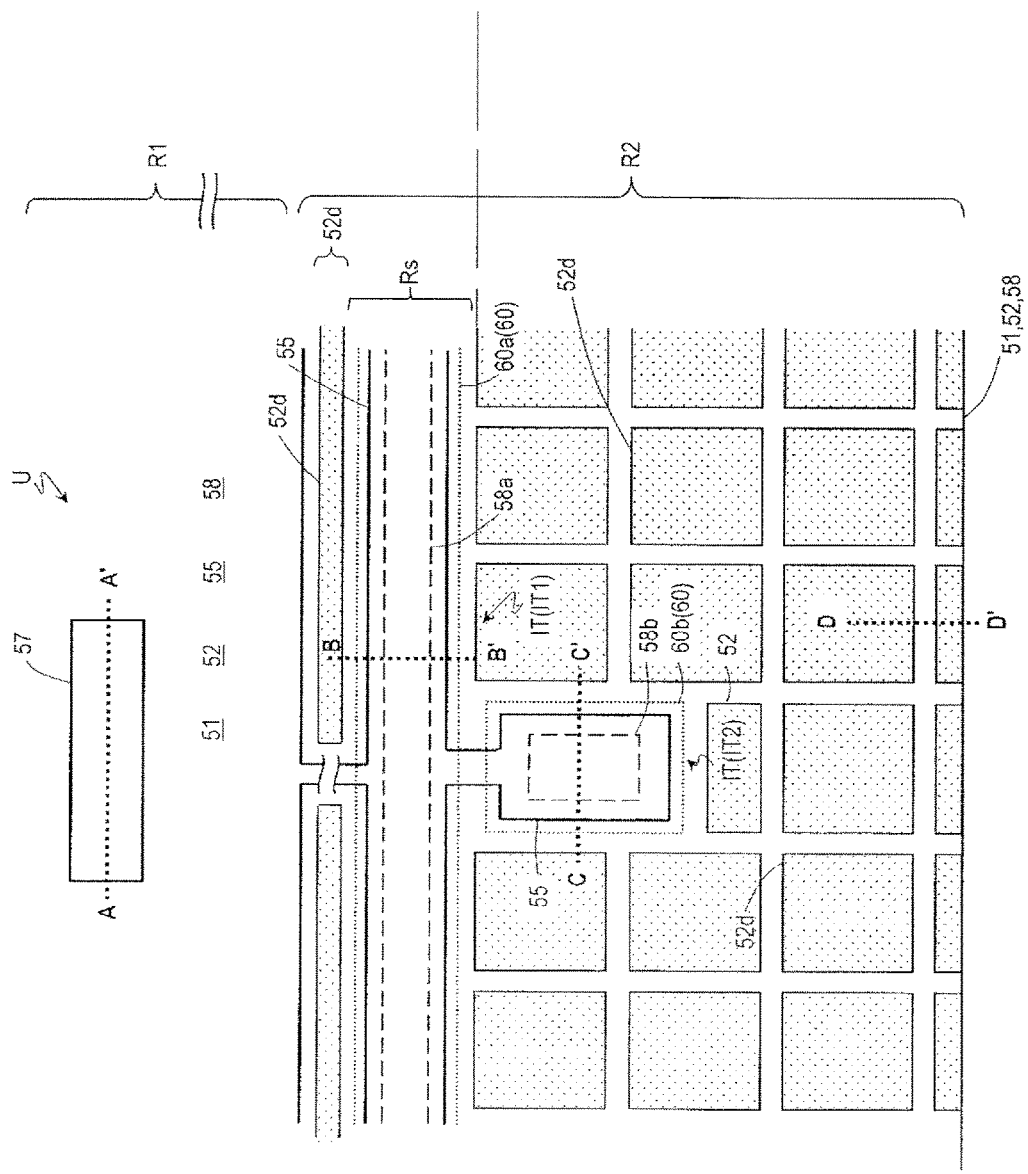
FIG. 38 is a schematic plan view of a slot substrate 204Ba according to Embodiment 4-2 of the disclosure.

The structure of a slot substrate 204Ba according to Embodiment 4-2 of the disclosure will be described with reference to FIG. 38. FIG. 38 is a schematic plan view of the slot substrate 204Ba, illustrating a schematic plan view of the antenna unit region U of the transmission and/or reception region R1 of the slot substrate 204Ba, the non-transmission and/or reception region R2 of the slot substrate 204Ba, and the region in the vicinity of an end of the slot substrate 204Ba.

As illustrated in FIG. 38, the slot substrate 204Ba differs from the slot substrate 201Ba according to Embodiment 1-2 in the planar shape of the thin portion 52d of the first insulating layer 52. The planar shape of the second region of the slot substrate 204Ba is the same as the planar shape of the first region of the slot substrate 204Aa according to Embodiment 4-1.

Embodiment 4-3

Figure 39:
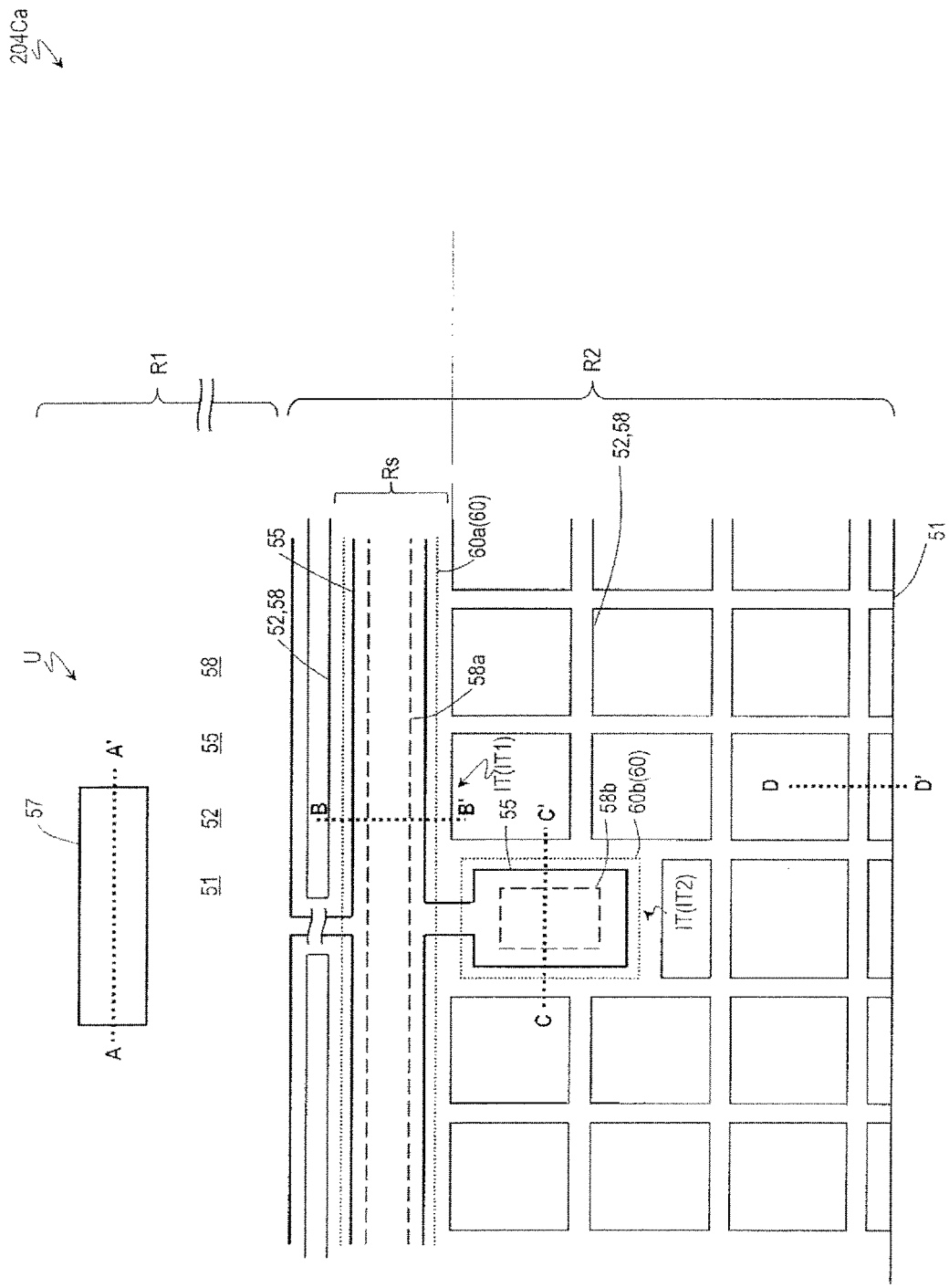
FIG. 39 is a schematic plan view of a slot substrate 204Ca according to Embodiment 4-3 of the disclosure.

The structure of a slot substrate 204Ca according to Embodiment 4-3 of the disclosure will be described with reference to FIG. 39. FIG. 39 is a schematic plan view of the slot substrate 204Ca, illustrating a schematic plan view of the antenna unit region U of the transmission and/or reception region R1 of the slot substrate 204Ca, the non-transmission and/or reception region R2 of the slot substrate 204Ca, and the region in the vicinity of an end of the slot substrate 204Ca.

As illustrated in FIG. 39, the slot substrate 204Ca differs from the slot substrate 201Ca according to Embodiment 1-3 in the planar shape of the first insulating layer 52 and the planar shape of the second insulating layer 58. The planar shape of the first region of the slot substrate 204Ca is the same as the planar shape of the first region of the slot substrate 203Aa according to Embodiment 4-1. The slot substrate 204Ca differs from the slot substrate 204Aa in that, in the first region, the second dielectric substrate 51 is also exposed from the second insulating layer 58. In this example, the end of the second insulating layer 58 is aligned with the end of the first insulating layer 52.

Embodiment 4-4

Figure 40:
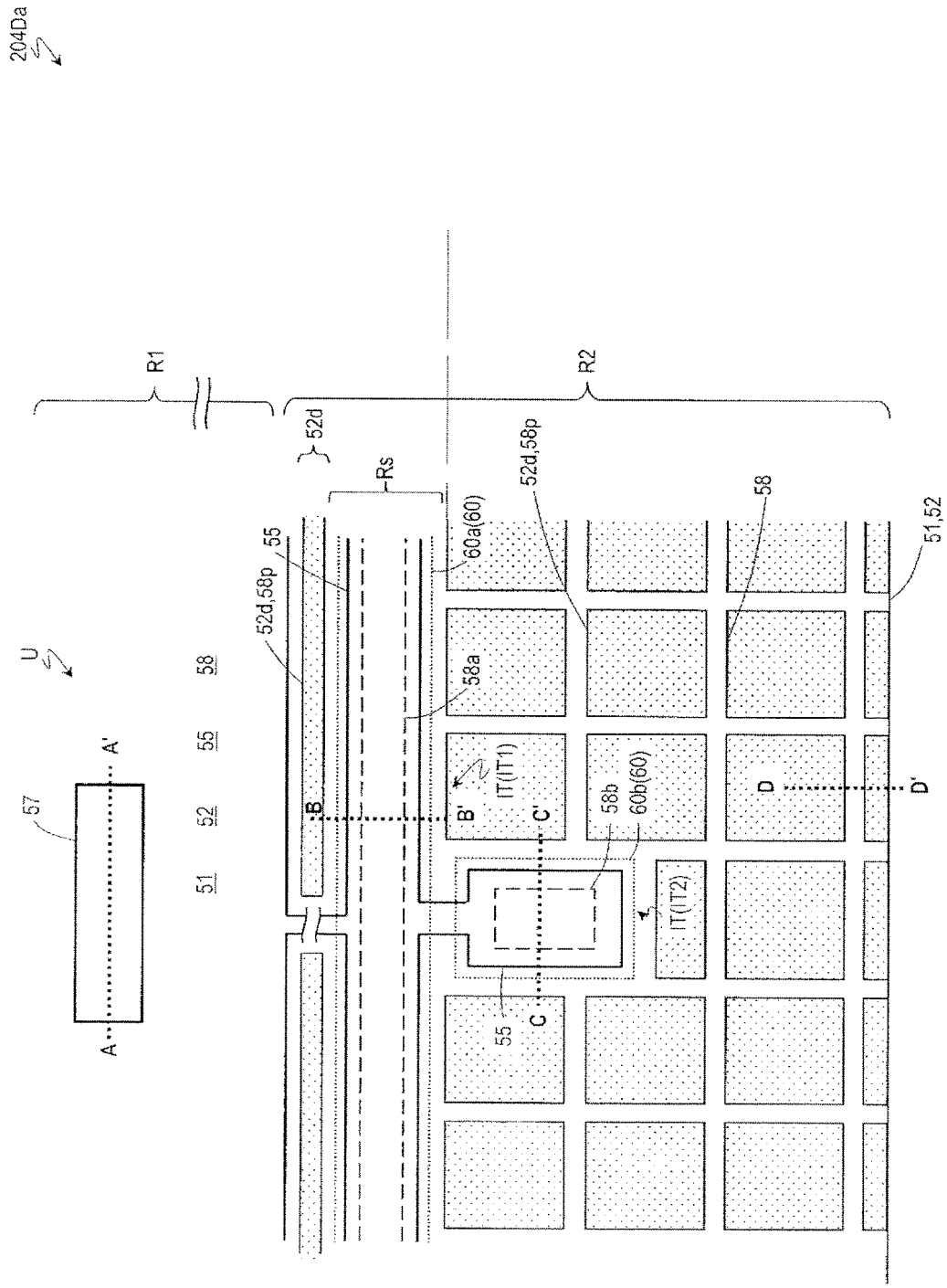
FIG. 40 is a schematic plan view of a slot substrate 204Da according to Embodiment 4-4 of the disclosure.

The structure of a slot substrate 204Da according to Embodiment 4-4 of the disclosure will be described with reference to FIG. 40. FIG. 40 is a schematic plan view of the slot substrate 204Da, illustrating a schematic plan view of the antenna unit region U of the transmission and/or reception region R1 of the slot substrate 204Da, the non-transmission and/or reception region R2 of the slot substrate 204Da, and the region in the vicinity of an end of the slot substrate 204Da.

As illustrated in FIG. 40, the slot substrate 204Da differs from the slot substrate 201Da according to Embodiment 1-4 in the planar shape of the first insulating layer 52 and the planar shape of the second insulating layer 58. The planar shape of the second region of the slot substrate 204Da is the same as the planar shape of the first region of the slot substrate 204Aa according to Embodiment 4-1, and is the same as the planar shape of the second region of the slot substrate 204Ba according to Embodiment 4-2. The slot substrate 204Da differs from the slot substrate 204Ba in that, in the second region, the second dielectric substrate 51 is also exposed from the second insulating layer 58. In this example, the end of the second insulating layer 58 is aligned with the end of the thin portion 52d of the first insulating layer 52.

Embodiments according to the disclosure are used in scanning antennas for satellite communication or satellite broadcasting that are mounted on mobile bodies (ships, aircraft, and automobiles, for example) or the manufacture thereof.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A scanning antenna provided with an array of a plurality of antenna units, the scanning antenna comprising:
    a transmission and/or reception region including the plurality of antenna units;
    a non-transmission and/or reception region other than the transmission and/or reception region;
    a thin film transistor (TFT) substrate including a first dielectric substrate;
    a slot substrate including a second dielectric substrate and a slot electrode supported by a first main surface of the second dielectric substrate;
    a liquid crystal layer provided between the TFT substrate and the slot substrate, and
    a reflective conductive plate disposed facing a second main surface of the second dielectric substrate opposite to the first main surface with a dielectric layer interposed between the reflective conductive plate and the second main surface,
    wherein each of the plurality of antenna units includes a TFT supported by the first dielectric substrate, a patch electrode electrically connected to a drain of the TFT, and
    a slot formed in the slot electrode corresponding to the patch electrode,
    the slot substrate further includes a first insulating layer provided between the second dielectric substrate and the slot electrode,
    the slot electrode has a tensile stress and the first insulating layer has a compressive stress,
    when viewed from a normal direction of the second dielectric substrate, a portion of the slot substrate that does not include the slot electrode includes at least one first region exposing the second dielectric substrate from the first insulating layer and/or at least one second region having a thickness of the first insulating layer that is less than a thickness of a portion of the first insulating layer overlapping the slot electrode, and
    when viewed from the normal direction of the second dielectric substrate, the at least one first region or the at least one second region includes at least a portion of an end of the second dielectric substrate.

2. The scanning antenna according to claim 1,
    wherein the at least one first region or the at least one second region includes a region along an end of the second dielectric substrate.

3. The scanning antenna according to claim 1,
    wherein the at least one first region or the at least one second region includes a plurality of regions disposed in island shapes.

4. The scanning antenna according to claim 1,
    wherein the at least one first region or the at least one second region includes a lattice pattern region.

5. The scanning antenna according to claim 1,
    wherein a thickness of the first insulating layer in the at least one second region is 450 nm or less.

6. The scanning antenna according to claim 1,
    wherein a thickness of the first insulating layer in the at least one second region is no greater than 85% of a thickness of a portion of the first insulating layer overlapping the slot electrode.

7. The scanning antenna according to claim 1,
    wherein, when viewed from the normal direction of the second dielectric substrate, an area of the at least one first region is no less than 0.2% of an area of a portion of the slot substrate not including the slot electrode.

8. The scanning antenna according to claim 1,
    wherein the slot substrate further includes a second insulating layer supported by the first main surface of the second dielectric substrate and formed on the slot electrode, and
    the second dielectric substrate is exposed from the second insulating layer in the at least one first region or the at least one second region.

9. The scanning antenna according to claim 8,
    wherein the slot substrate further includes an upper conductive layer provided on the second insulating layer supported by the first main surface of the second dielectric substrate.

10. The scanning antenna according to claim 9,
    wherein the slot substrate further includes a terminal portion disposed in the non-transmission and/or reception region,
    the terminal portion includes
    the first insulating layer,
    a lower connecting portion formed from a same metal film as a metal layer included by the slot electrode, the second insulating layer formed on the lower connecting portion, and an upper connecting portion included in the upper conductive layer, the second insulating layer includes an opening that reaches to the lower connecting portion, and the upper connecting portion is formed on the second insulating layer and within the opening, and is connected to the lower connecting portion within the opening.

11. The scanning antenna according to claim 8, wherein the slot substrate further includes an upper conductive layer provided between the slot electrode and the second insulating layer.

12. The scanning antenna according to claim 11, wherein the slot substrate further includes a terminal portion disposed in the non-transmission and/or reception region, the terminal portion includes the first insulating layer, a lower connecting portion formed from a same metal film as a metal layer included by the slot electrode, the second insulating layer formed on the lower connecting portion, and an upper connecting portion included in the upper conductive layer, and the second insulating layer includes an opening that reaches to the upper connecting portion.

13. The scanning antenna according to claim 9, wherein the upper conductive layer includes a first conductive layer and a second conductive layer formed on the first conductive layer and including a transparent conductive layer.

14. The scanning antenna according to claim 13, wherein the second conductive layer includes an indium tin oxide (ITO) layer.

15. A method for manufacturing a scanning antenna described in claim 1, wherein a step of manufacturing the slot substrate includes a step A of depositing a first insulating film onto a mother substrate, a step B of forming the slot electrode on the first insulating film after the step A, a step C of partially removing the first insulating film or partially reducing a thickness of the first insulating film after the step A, and a step D of dividing the mother substrate after the step B and the step C, and a division line in the step D, when viewed from the normal direction of the mother substrate, overlaps a portion where the first insulating film is partially removed or thinned in the step C.

16. The method for manufacturing a scanning antenna according to claim 15, wherein the method further includes a step E of depositing a second insulating film on the slot electrode after the step B and before the step D, and a step F of partially removing the second insulating film, and a division line in the step D, when viewed from the normal direction of the mother substrate, overlaps a portion where the second insulating film is partially removed in the step F.

17. The method for manufacturing a scanning antenna according to claim 16, wherein the step E includes a step of removing performed using a same etching mask as that in the step C.

\* \* \* \* \*